US012622129B2

(12) United States Patent
Ukigai et al.

(10) Patent No.: US 12,622,129 B2
(45) **Date of Patent: *May 5, 2026**

(54) ORGANIC ELECTROLUMINESCENT DEVICE

(71) Applicant: NIPPON STEEL Chemical & Material Co., Ltd., Tokyo (JP)

(72) Inventors: Satoshi Ukigai, Tokyo (JP); Masashi Tada, Tokyo (JP); Munetomo Inoue, Tokyo (JP); Ayaka Terada, Tokyo (JP); Sayuri Kitera, Tokyo (JP)

(73) Assignee: NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 919 days.

This patent is subject to a terminal disclaimer.

(21) Appl. No.: 17/908,136

(22) PCT Filed: Mar. 19, 2021

(86) PCT No.: PCT/JP2021/011287

§ 371 (c)(1),
(2) Date: Aug. 30, 2022

(87) PCT Pub. No.: WO2021/200251

PCT Pub. Date: Oct. 7, 2021

(65) Prior Publication Data

US 2023/0145235 A1 May 11, 2023

(30) Foreign Application Priority Data

Mar. 31, 2020 (JP) ................................ 2020-063330

(51) Int. Cl.

*H10K 50/11* (2023.01)
*C09K 11/06* (2006.01)
*H10K 85/60* (2023.01)
*H10K 50/12* (2023.01)
*H10K 101/00* (2023.01)

(52) U.S. Cl.

CPC .............. *H10K 50/11* (2023.02); *C09K 11/06* (2013.01); *H10K 85/654* (2023.02); *H10K 85/6572* (2023.02); *H10K 85/658* (2023.02); *C09K 2211/1007* (2013.01); *H10K 50/12* (2023.02); *H10K 2101/90* (2023.02)

(58) Field of Classification Search

CPC ....... H10K 50/11; H10K 50/12; G02F 1/1333
See application file for complete search history.

(56) References Cited

U.S. PATENT DOCUMENTS 9,260,433 B2 * 2/2016 Kai .................... H10K 85/6572
2010/0295444 A1 11/2010 Kuma et al.
2012/0241732 A1 9/2012 Endo et al.
2017/0263869 A1 9/2017 Tada et al.
2019/0221749 A1 * 7/2019 Yang .................... C07D 405/14
2020/0190115 A1 6/2020 Hatakeyama et al.
2020/0203652 A1 6/2020 Duan et al.

(Continued)

FOREIGN PATENT DOCUMENTS

CN 108424411 A * 8/2018 ............. H10K 50/18
CN 109411634 A 3/2019

(Continued)

OTHER PUBLICATIONS

Machine translation of CN-108424411-A (Year: 2018).*
Machine translation of JP 2011-198899 (Year: 2011).*

*Primary Examiner* — Geraldina Visconti

(74) *Attorney, Agent, or Firm* — Birch, Stewart, Kolasch & Birch, LLP

(57) ABSTRACT

Provided is a blue light emitting organic EL device having high emission efficiency and a long lifetime. This organic EL device includes one or more light emitting layers between an anode and a cathode opposite to each other, wherein at least one of the light emitting layers includes a first host selected from indolocarbazole compounds, a second host selected from the compounds represented by the following general formula (2), and, as a light emitting dopant, a polycyclic aromatic compound represented by the following general formula (3) or a polycyclic aromatic compound represented by the general formula (3) as a substructure, wherein $Y^4$ is B, P, P═O, P═S, Al, Ga, As, Si—$R^4$ or Ge—$R^5$, and $X^4$ is O, N—$Ar^4$, S or Se.

(2)

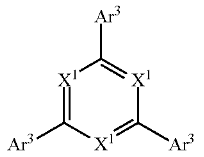

(3)

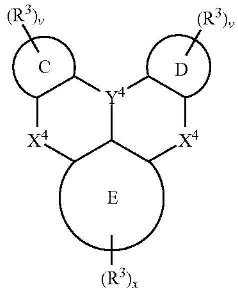

11 Claims, 1 Drawing Sheet

(56) References Cited

U.S. PATENT DOCUMENTS

| | | | | |
|---|---|---|---|---|
| 2021/0050546 | A1 | 2/2021 | Li et al. | |
| 2023/0136708 | A1* | 5/2023 | Inoue ................. | H10K 85/6576 257/40 |
| 2023/0139757 | A1* | 5/2023 | Tada .................... | H10K 85/658 257/40 |
| 2023/0145235 | A1* | 5/2023 | Ukigai ............... | H10K 85/6572 257/40 |

FOREIGN PATENT DOCUMENTS

| | | | | |
|---|---|---|---|---|
| CN | 110492006 | A | 11/2019 | |
| EP | 3 109 253 | A1 | 12/2018 | |
| JP | 2011-198899 | * | 10/2011 | ............. C09K 11/06 |
| JP | WO2020/040298 | A1 | 2/2020 | |
| WO | WO 2010/134350 | A1 | 11/2010 | |
| WO | WO 2011/070963 | A1 | 6/2011 | |
| WO | WO 2015/102118 | A1 | 7/2015 | |
| WO | WO 2016/042997 | A1 | 3/2016 | |
| WO | WO 2018/212169 | A1 | 11/2018 | |

* cited by examiner

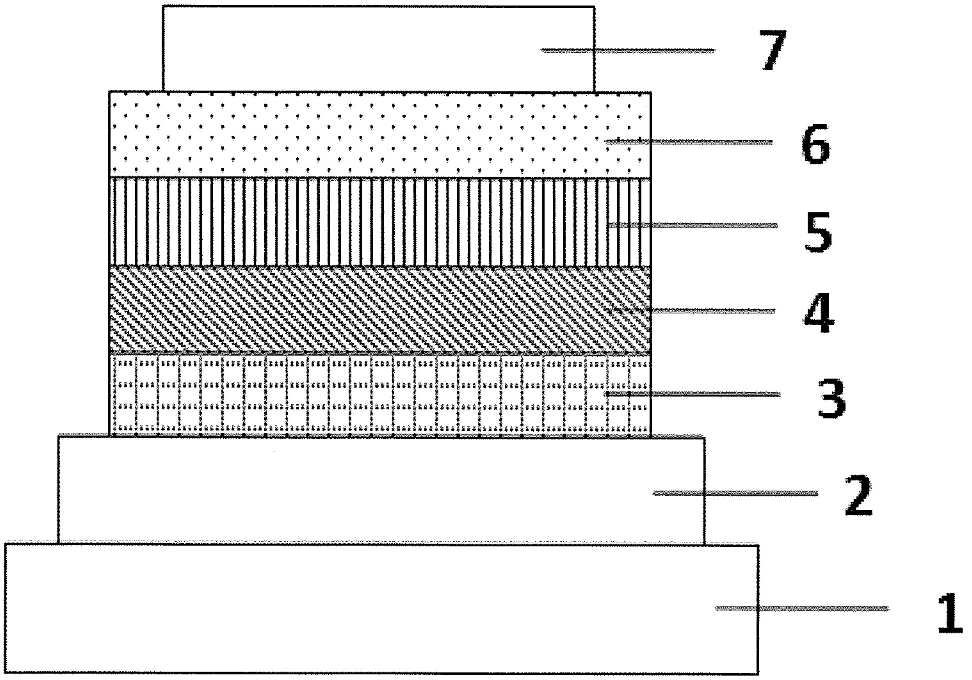
7
6
5
4
3
2
1

ORGANIC ELECTROLUMINESCENT DEVICE

TECHNICAL FIELD

The present invention relates to an organic electroluminescent device or element (also referred to as an organic EL device or element).

When a voltage is applied to an organic EL device, holes and electrons are injected from the anode and the cathode, respectively, into the light emitting layer. Then, the injected holes and electrons are recombined in the light emitting layer to thereby generate excitons. At this time, according to the electron spin statistics theory, singlet excitons and triplet excitons are generated at a ratio of 1:3. In the fluorescent organic EL device that uses emission caused by singlet excitons, the limit of the internal quantum efficiency is said to be 25%. On the other hand, it has been known that, in the phosphorescent organic EL device that uses emission caused by triplet excitons, the internal quantum efficiency can be enhanced up to 100% when intersystem crossing efficiently occurs from singlet excitons.

However, the blue phosphorescent organic EL device has a technical problem of extending the lifetime. Further, a highly efficient organic EL device utilizing delayed fluorescence has been developed, in recent years. For example, Patent Literature 1 discloses an organic EL device utilizing the Triplet-Triplet Fusion (TTF) mechanism, which is one of the mechanisms of delayed fluorescence. The TTF mechanism utilizes a phenomenon in which a singlet exciton is generated by the collision of two triplet excitons, and it is believed that the internal quantum efficiency can be enhanced up to 40%, in theory. However, its efficiency is low as compared with the efficiency of the phosphorescent organic EL device, and thus further improvement in efficiency is desired.

On the other hand, Patent Literature 2 discloses an organic EL device utilizing the Thermally Activated Delayed Fluorescence (TADF) mechanism. The TADF mechanism utilizes a phenomenon in which reverse intersystem crossing occurs from the triplet exciton to the singlet exciton in a material having a small energy difference between the singlet level and the triplet level, and it is believed that the internal quantum efficiency can be enhanced up to 100%, in theory. However, further improvement in lifetime characteristics is desired as in the phosphorescent device.

Patent Literatures 3 and 4 discloses an organic EL device in which a TADF material including a polycyclic aromatic compound exemplified by the following compound is used as a light emitting dopant; however, they do not specifically disclose lifetime characteristics.

[C 1]

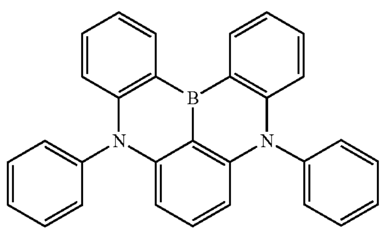

-continued

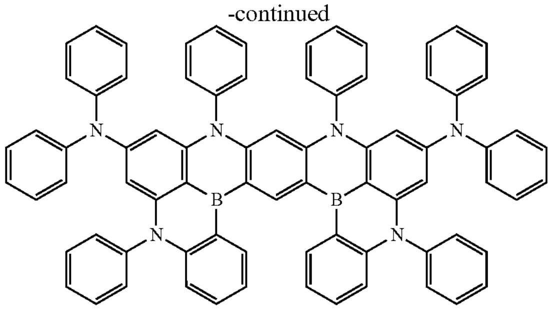

CITATION LIST

Patent Literature

Patent Literature 1: WO2010/134350
Patent Literature 2: WO2011/070963
Patent Literature 3: WO2015/102118
Patent Literature 4: WO2018/212169

SUMMARY OF INVENTION

In order to apply an organic EL device to a display device such as a flat panel display and a light source, it is necessary to improve the emission efficiency of the device and sufficiently ensure the stability of the device at the time of driving, at the same time. An object of the present invention is to provide a practically useful organic EL device having high efficiency and a long lifetime while having a low driving voltage.

The present invention is an organic electroluminescent device comprising one or more light emitting layers between an anode and a cathode opposite to each other, wherein at least one of the emitting layers comprises a first host selected from compounds represented by the following general formula (1), a second host selected from compounds represented by the following general formula (2), and, as a light emitting dopant, a polycyclic aromatic compound represented by the following general formula (3) or a polycyclic aromatic compound having a structure represented by the general formula (3) as a substructure:

[C 2]

$$(Z)_a-L^1-(Ar^1)_b \quad (1)$$

(1a)

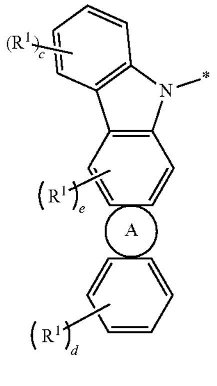

-continued (1b)

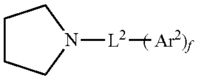

wherein Z is an indolocarbazole ring-containing group represented by the general formula (1a), * is a bonding site to $L^1$, the ring A is a heterocyclic ring represented by formula (1b), and the ring A is condensed with an adjacent ring at an arbitrary position, $L^1$ and $L^2$ are each independently a substituted or unsubstituted aromatic hydrocarbon group having 6 to 30 carbon atoms, or a substituted or unsubstituted aromatic heterocyclic group having 3 to 17 carbon atoms.

$Ar^1$ and $Ar^2$ are each independently a substituted or unsubstituted aromatic hydrocarbon group having 6 to 30 carbon atoms, a substituted or unsubstituted aromatic heterocyclic group having 3 to 17 carbon atoms, or a linked aromatic group formed by linking 2 to 8 of these groups.

$R^1$ is each independently an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms.

a represents an integer of 1 to 3, b represents an integer of 0 to 3, and c and d each independently represent an integer of 0 to 4, e represents an integer of 0 to 2, and f represents an integer of 0 to 3,

[C 3]

(2)

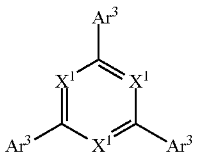

wherein $X^1$ each independently represents N or CH, and at least one $X^1$ represents N, and preferably, three $X^1$ are N, $Ar^3$ each independently represents a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 8 aromatic rings thereof,

[C 4]

(3)

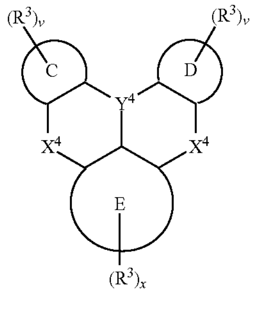

wherein the C ring, the D ring, and the E ring are each independently a substituted or unsubstituted aromatic hydrocarbon ring having 6 to 24 carbon atoms or a substituted or unsubstituted aromatic heterocyclic ring having 3 to 17 carbon atoms, $Y^4$ is B, P, P═O, P═S, Al, Ga, As, Si—$R^4$ or Ge—$R^5$, and $R^4$ and $R^5$ are each independently an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms.

$X^4$ is each independently O, N—$Ar^4$, S or Se, and $Ar^4$ is each independently a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 8 of these groups, N—$Ar^4$ is optionally bonded to any of the C ring, the D ring, or the E ring to form a heterocyclic ring containing N, $R^3$ each independently represents a cyano group, deuterium, a diarylamino group having 12 to 44 carbon atoms, an arylheteroarylamino group having 12 to 44 carbon atoms, a diheteroarylamino group having 12 to 44 carbon atoms, an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, at least one hydrogen atom in the C ring, the D ring, the E ring, $R^3$, $R^4$, $R^5$, and $Ar^4$ is optionally replaced with a halogen or deuterium atom, and v each independently represents an integer of 0 to 4, and x represents an integer of 0 to 3.

The polycyclic aromatic compound having the structure represented by the general formula (3) as a substructure may be a polycyclic aromatic compound represented by the general formula (4) below or a boron-containing polycyclic aromatic compound represented by the following formula (5):

[C 5]

(4)

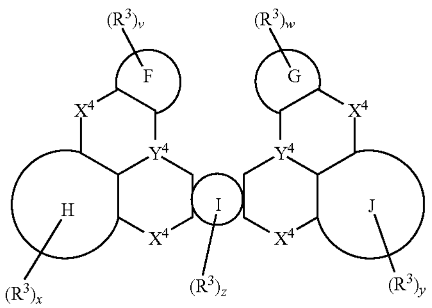

wherein the F ring, the G ring, the H ring, the I ring, and the J ring are each independently a substituted or unsubstituted aromatic hydrocarbon ring having 6 to 24 carbon atoms or a substituted or unsubstituted aromatic heterocyclic ring having 3 to 17 carbon atoms, and $X^4$, $Y^4$, $R^3$, x, and v are as defined in general formula (3), w represents an integer of 0 to 4, y represents an integer of 0 to 3, and z represents an integer of 0 to 2, and at least one hydrogen atom in the F ring, the G ring, the H ring, the I ring, and the J ring is optionally replaced with a halogen or deuterium atom;

[C 6]

(5)

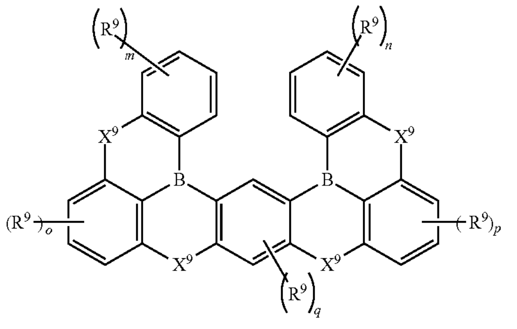

wherein $X^9$ each independently represents N—$Ar^6$, O, or S, and at least one $X^9$ represents N—$Ar^6$, $Ar^6$ each independently represents a substituted or unsubstituted aromatic hydrocarbon group having 6 to 18 carbon atoms, a substituted or unsubstituted aromatic heterocyclic ring group having 3 to 17 carbon atoms, or a linked aromatic ring formed by linking 2 to 8 aromatic rings thereof, N—$Ar^6$ is optionally bonded with the aforementioned aromatic ring to form a heterocyclic ring containing N, $R^9$ each independently represents a cyano group, deuterium, a diarylamino group having 12 to 44 carbon atoms, an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, and m and n each independently represent an integer of 0 to 4, o and p each independently represent an integer of 0 to 3, and q represents an integer of 0 to 2.

A preferred example of the aforementioned general formula (2) is formula (6) or formula (7) below.

[C 7]

(6)

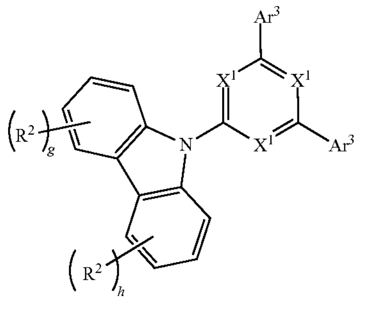

-continued (7)

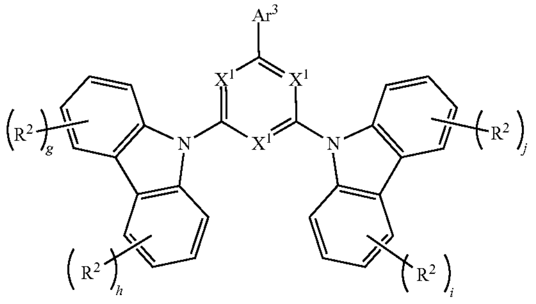

wherein $Ar^3$ and $X^1$ are as defined in the general formula (2), $R^2$ each independently represents deuterium, an aliphatic hydrocarbon group having 1 to 10 carbon atoms, a triarylsilyl group, a substituted or unsubstituted aromatic hydrocarbon group having 6 to 18 carbon atoms, or a substituted or unsubstituted aromatic heterocyclic group having 3 to 17 carbon atoms, and g, h, i, and j each independently represent an integer of 0 to 4.

A preferred example of the aforementioned general formula (1) is formula (8a) or formula (8b) below.

[C 8]

(8a)

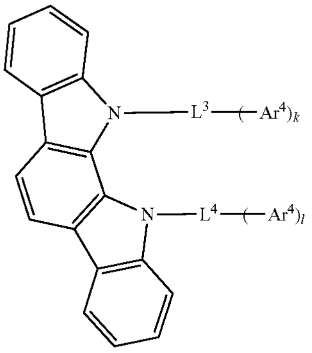

[C 9]

(8b)

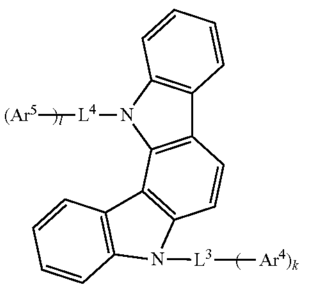

wherein $L^3$, $L^4$, $Ar^4$, $Ar^5$, k and l have the same meaning as $L^1$, $L^2$, $Ar^1$, $Ar^2$, a and b, respectively, in the general formula (1).

The light emitting dopant can have a difference between excited singlet energy (S1) and excited triplet energy (T1) (ΔEST) of 0.20 eV or less, and desirably 0.10 eV or less.

The light emitting layer preferably includes 0.10 to 10% by mass of the light emitting dopant and 99.9 to 90% by mass of a host, and the host preferably includes 10 to 90% by mass of the first host and 90 to 10% by mass of the second host.

Moreover, the present invention is an organic EL device including one or more light emitting layers between an anode and a cathode opposite to each other, wherein at least one of the light emitting layer includes, as a light emitting dopant, an organic light emitting material having a difference between excited singlet energy (S1) and excited triplet energy (T1) (ΔEST) of 0.20 eV or less, and the aforementioned first host and the second host.

The organic EL device of the present invention, which includes the specific light emitting dopant and a plurality of specific host materials in the light emitting layer, can be an organic EL device with a low driving voltage, high emission efficiency as well as a long lifetime.

The reason for the low driving voltage of the organic EL device of the present invention is probably as follows: the indolocarbazole compound as the first host material is characteristic in that holes are easily injected thereinto, and the nitrogen-containing six-membered ring compound as the second host material is characteristic in that electrons are easily injected thereinto, whereby the holes and electrons are injected at a lower voltage to generate excitons. Moreover, the reason for the high emission efficiency of the organic EL device is probably as follows: the indolocarbazole compound is characteristic in that holes are easily injected thereinto and the nitrogen-containing six-membered ring compound is characteristic in that electrons are easily injected thereinto, whereby the balance between holes and electrons are maintained in the light emission layer. The reason for the long lifetime of the organic EL device of the present invention is probably as follows: when a voltage is applied to the organic EL device, holes are preferentially injected into the first host, i.e., the indolocarbazole compound, and electrons are preferentially injected into the second host, i.e., the nitrogen-containing six-membered ring compound, whereby the electrochemical load on the light emitting dopant is reduced.

BRIEF DESCRIPTION OF DRAWING

FIG. 1 shows a cross-sectional view of one example of the organic EL device.

DESCRIPTION OF EMBODIMENTS

The organic EL device of the present invention includes one or more light emitting layers between an anode and a cathode opposite to each other, wherein at least one of the emitting layers includes the first host selected from compounds represented by the aforementioned general formula (1), the second host selected from compounds represented by the aforementioned general formula (2), and, as a light emitting dopant, a polycyclic aromatic compound represented by the following general formula (3) or a polycyclic aromatic compound having a structure represented by the general formula (3) as a substructure.

The compound represented by the aforementioned general formula (1) used as the first host in the present invention will be described below.

In the general formula (1), Z is the indolocarbazole ring-containing group represented by the general formula (1a), and the ring A is a heterocyclic ring represented by formula (1b), which is condensed with the adjacent ring at arbitrary position thereof.

a represents an integer of 1 to 3, b represents an integer of 0 to 3, and c and d are each independently represent an integer of 0 to 4, e represents an integer of 0 to 2, and f represents an integer of 0 to 3. Preferably, a is 1 to 2, b is 0 to 2, c and d are 0 to 1, e is 0 to 2, and f is 0 to 2.

The preferred example of the general formula (1) is formula (8a) or formula (8b) above, and, formula (8b) is more preferred.

In the general formula (1), formula (8a) and formula (8b), common symbols have the same meaning.

k and l represent integers of 0 to 3. More preferably, k and l are 0 to 2.

$L^1$, $L^2$, $L^3$, and $L^4$ each independently are a substituted or unsubstituted aromatic hydrocarbon group having 6 to 30 carbon atoms or a substituted or unsubstituted aromatic heterocyclic group having 3 to 17 carbon atoms, preferably an aromatic hydrocarbon group having 6 to 20 carbon atoms or an aromatic heterocyclic group having 3 to 15 carbon atoms, and more preferably, a phenyl group, a naphthyl group, a pyridine group, a triazine group, a dibenzofuran group, or a carbazole group. $L^1$, $L^2$, $L^3$, and $L^4$ each are an a+b-valent group, a f+1-valent group, a k+1-valent group, and an l+1-valent group, respectively.

Specific examples of the unsubstituted aromatic hydrocarbon group having 6 to 30 carbon atoms or the substituted or unsubstituted aromatic heterocyclic group having 3 to 17 carbon atoms include a group produced from benzene, naphthalene, acenaphthene, acenaphthylene, azulene, anthracene, chrysene, pyrene, phenanthrene, triphenylene, fluorene, benzo[a]anthracene, tetracene, pentacene, hexacene, coronene, heptacene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzoisothiazole, benzothiadiazole, purine, pyranone, coumarin, isocoumarin, chromone, dibenzofuran, dibenzothiophene, dibenzoselenophene, or carbazole.

$Ar^1$, $Ar^2$, $Ar^4$ and $Ar^5$ are each independently a substituted or unsubstituted aromatic hydrocarbon group having 6 to 30 carbon atoms, a substituted or unsubstituted aromatic heterocyclic group having 3 to 17 carbon atoms, or a linked aromatic group formed by linking 2 to 8 of these groups, preferably a substituted or unsubstituted aromatic hydrocarbon group having 6 to 12 carbon atoms, a substituted or unsubstituted aromatic heterocyclic group having 3 to 17 carbon atoms, or a substituted or unsubstituted linked aromatic group formed by linking 2 to 4 aromatic rings thereof, and more preferably a phenyl group, a biphenyl group, or a terphenyl group.

When $Ar^1$, $Ar^2$, $Ar^4$ and $Ar^5$ are each an unsubstituted aromatic hydrocarbon group or unsubstituted aromatic heterocyclic group, specific examples thereof are the same as described for $L^1$ (the valences may be different. The same applies hereinafter.).

They are each preferably a group produced by removing one hydrogen atom from benzene, naphthalene, acenaphthene, acenaphthylene, azulene, pyridine, triazine, dibenzofuran, dibenzothiophene, carbazole, or a compound formed by linking 2 to 4 of these compounds, and more preferably a group produced from benzene or a compound formed by linking 2 to 3 benzene rings.

The linked aromatic group as used herein refers to a group in which aromatic rings of two or more members selected from an aromatic hydrocarbon group and an aromatic heterocyclic group are linked by a single bond. The aromatic rings may be linked in a linear or branched manner, and may be the same or different. When a group falls within the linked aromatic group, the group is considered not to be a substituted aromatic hydrocarbon group or aromatic heterocyclic group.

$R^1$ each independently represents an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms. Preferably, $R^1$ is an aliphatic hydrocarbon group having 1 to 8 carbon atoms, a substituted or unsubstituted aromatic hydrocarbon group having 6 to 12 carbon atoms, or a substituted or unsubstituted aromatic heterocyclic group having 3 to 15 carbon atoms. More preferably, $R^1$ is a substituted or unsubstituted aromatic hydrocarbon group having 6 to 10 carbon atoms, or a substituted or unsubstituted aromatic heterocyclic group having 3 to 12 carbon atoms.

When $R^1$ is an aliphatic hydrocarbon group having 1 to 10 carbon atoms, specific examples of $R^1$ include methyl, ethyl, propyl, butyl, pentyl, hexyl, heptyl, octyl, and nonyl. Preferred examples thereof include methyl, ethyl, propyl, butyl, pentyl, hexyl, heptyl, and octyl.

When $R^1$ is an unsubstituted aromatic hydrocarbon group having 6 to 18 carbon atoms or an unsubstituted aromatic heterocyclic group having 3 to 17 carbon atoms, specific examples of $R^1$ include a group produced by removing one hydrogen atom from benzene, naphthalene, acenaphthene, acenaphthylene, azulene, anthracene, chrysene, pyrene, phenanthrene, triphenylene, fluorene, benzo[a]anthracene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzisothiazole, benzothiadiazole, purine, pyranone, coumarin, isocoumarin, chromone, dibenzofuran, dibenzothiophene, dibenzoselenophene, or carbazole. Preferred examples thereof include a group produced from benzene, naphthalene, acenaphthene, acenaphthylene, azulene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzisothiazole, benzothiadiazole, purine, pyranone, coumarin, isocoumarin, chromone, dibenzofuran, dibenzothiophene, dibenzoselenophene, or carbazole. More preferred examples thereof include a group produced from benzene, naphthalene, azulene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzisothiazole, benzothiadiazole, purine, pyranone, coumarin, isocoumarin, chromone, dibenzofuran, dibenzothiophene, dibenzoselenophene, or carbazole.

These aromatic hydrocarbon groups or aromatic heterocyclic groups or linked aromatic groups herein each may have a substituent. In the case where any of these groups has a substituent, the substituent is preferably deuterium, a cyano group, a triarylsilyl group, an aliphatic hydrocarbon group having 1 to 10 carbon atoms, and a diarylamino group having 12 to 44 carbon atoms. Here, when the substituent is the aliphatic hydrocarbon group having 1 to 10 carbon atoms, it may be linear, branched, or cyclic. The number of substituents is 0 to 5, and preferably 0 to 2. When each of the aromatic hydrocarbon groups and aromatic heterocyclic groups has a substituent, the number of carbon atoms of the substituent is not included in the calculation of the number of carbon atoms. However, it is preferred that the total number of carbon atoms including the number of carbon atoms of the substituent satisfy the above range.

Specific examples of the above substituent include cyano, methyl, ethyl, propyl, i-propyl, butyl, t-butyl, pentyl, cyclopentyl, hexyl, cyclohexyl, heptyl, octyl, nonyl, decyl, diphenylamino, naphthylphenylamino, dinaphthylamino, dianthranylamino, diphenanthrenylamino, and dipyrenylamino groups. Preferred examples thereof include cyano, methyl, ethyl, propyl, butyl, pentyl, hexyl, heptyl, octyl, diphenylamino, naphthylphenylamino, and dinaphthylamino groups.

Herein, the hydrogen may be understood to be deuterium. Namely, in the general formulae (1) to (4), etc., one or more H atoms or all H atoms of a skeleton such as carbazole and substituents such as $R^1$ and $Ar^1$ have may be a deuterium atom.

Specific examples of the compounds represented by the general formula (1) are shown below, but the compounds are not limited to these exemplified compounds.

[C 10]

1-1

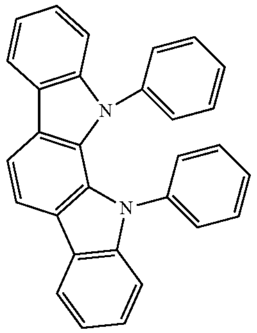

1-2

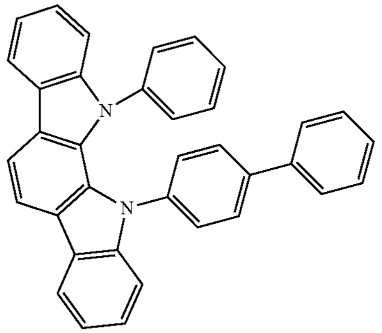

-continued
1-3
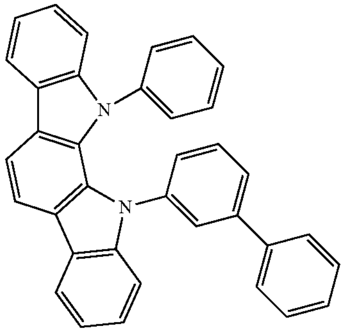
1-4
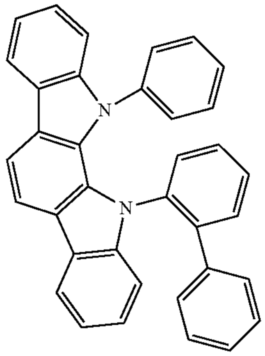
1-5
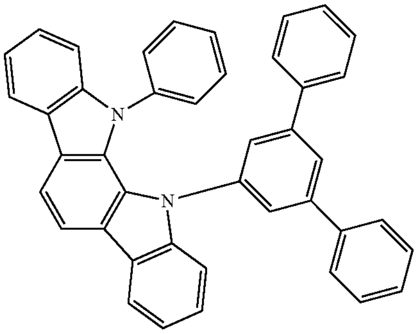
1-6
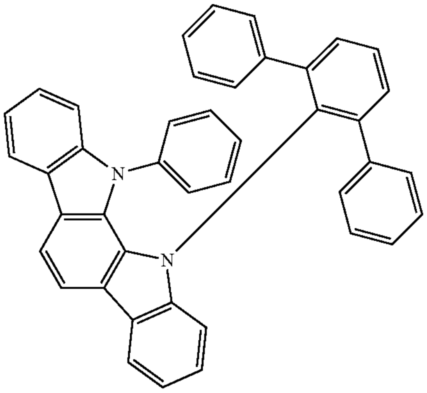
-continued
1-7
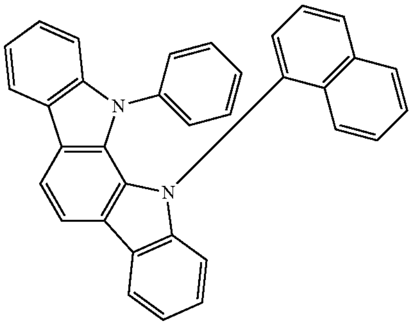
1-8
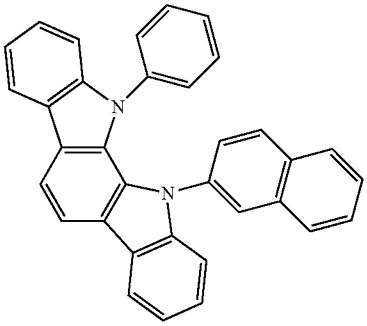
1-9
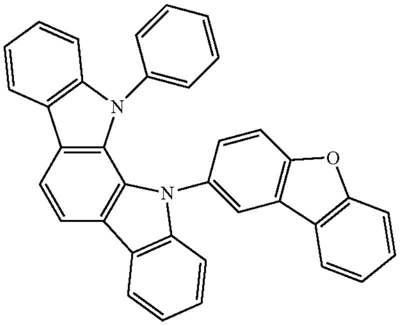
1-10
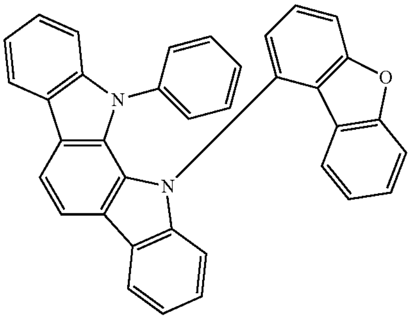

-continued
1-11
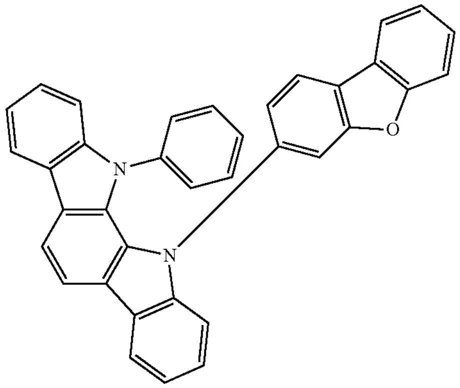
1-12
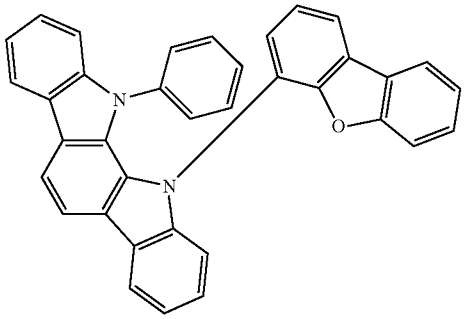
1-13
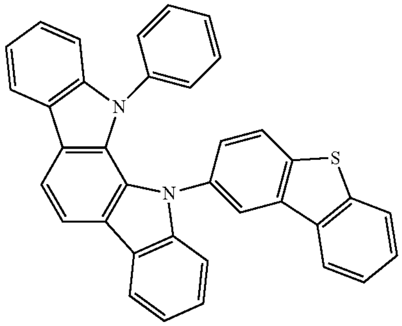
[C 11]
1-14
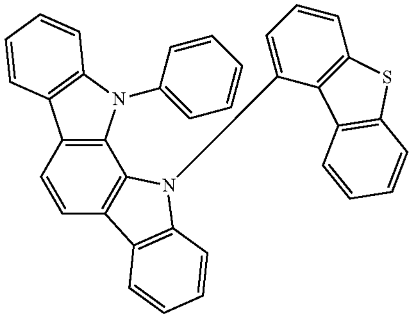
-continued
1-15
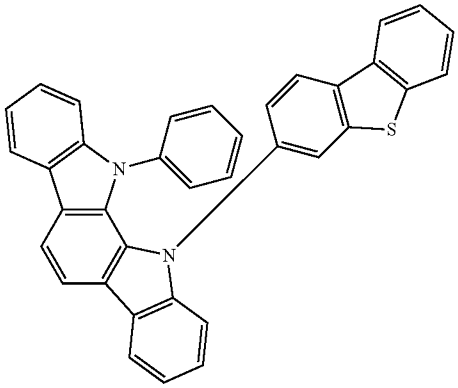
1-16
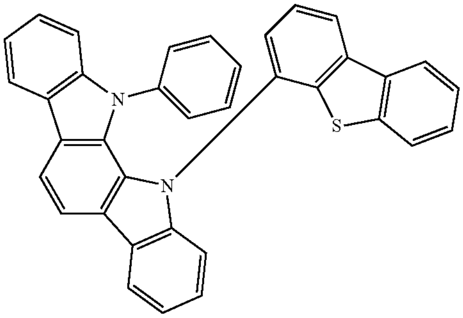
1-17
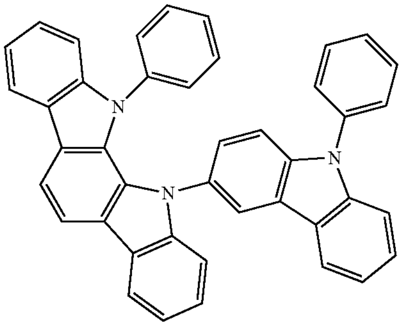
1-18
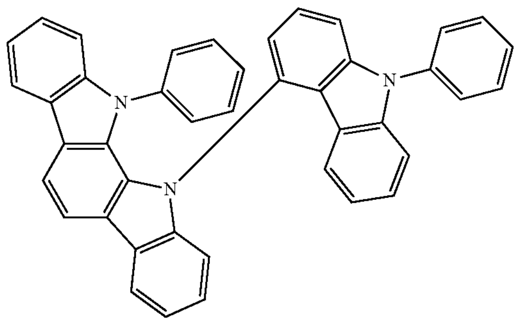

-continued
1-19
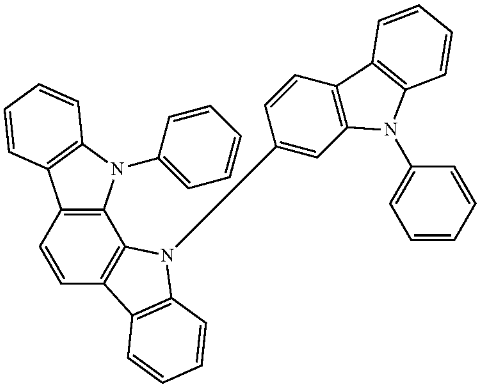
1-20
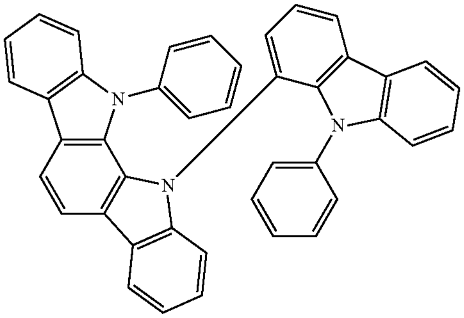
1-21
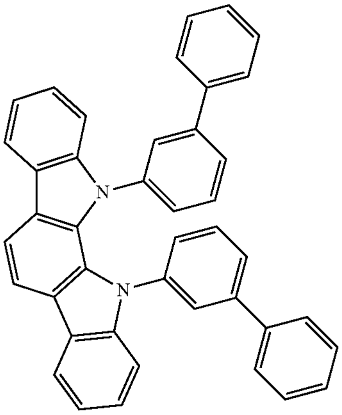
1-22
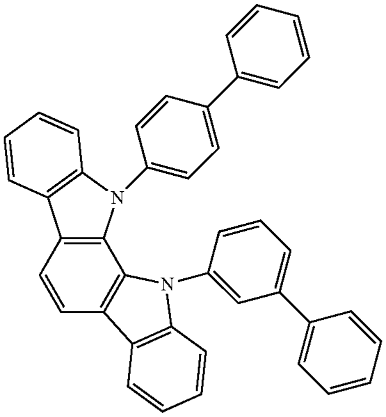
-continued
1-23
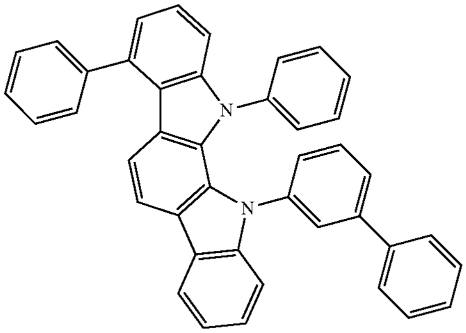
[C 12]
1-24
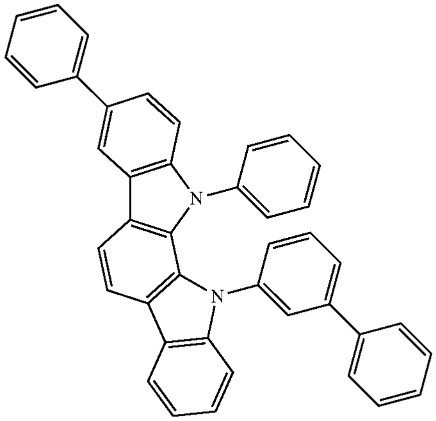
1-25
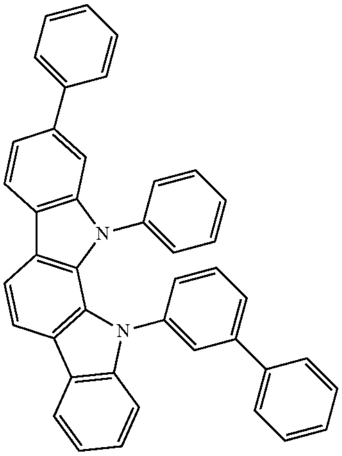

-continued
1-26
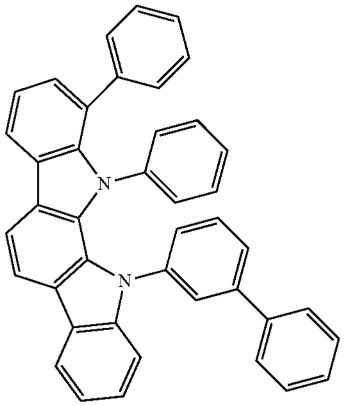
1-27
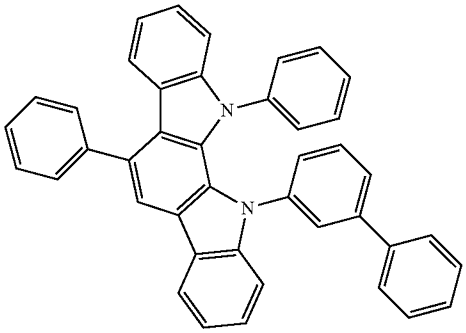
1-28
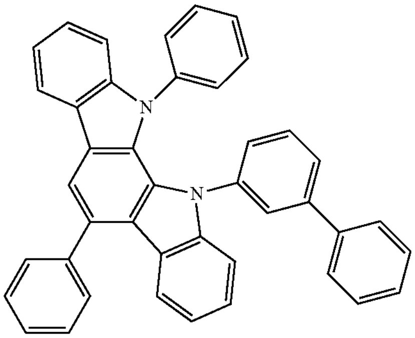
1-29
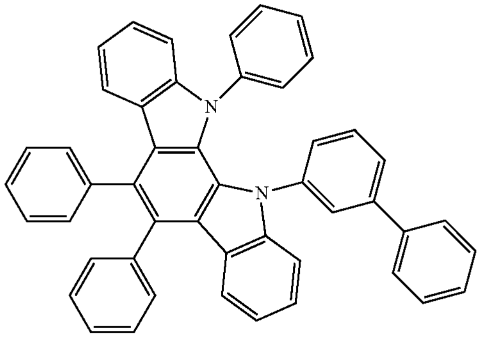
-continued
1-30
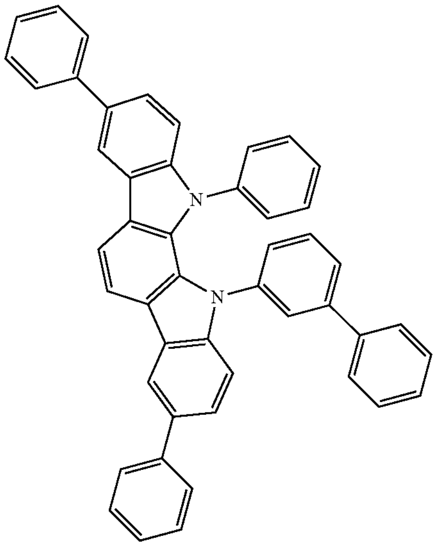
1-31
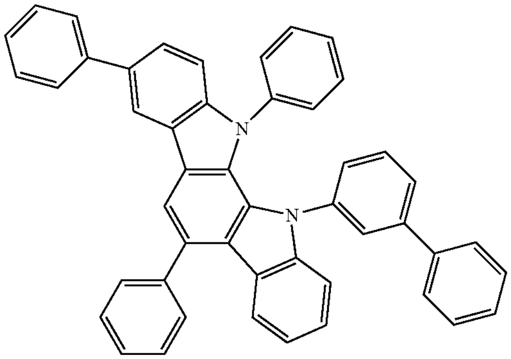
1-32
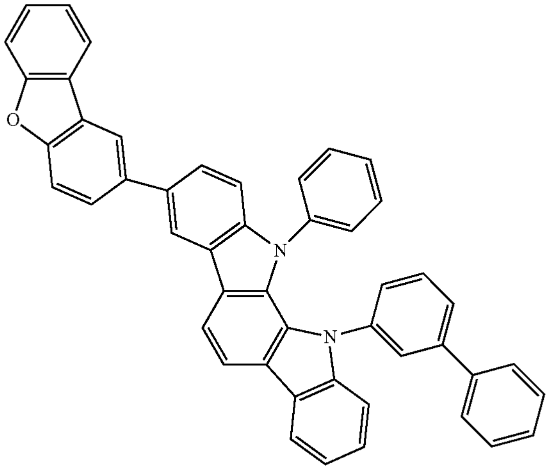

-continued
[C 13]
1-33
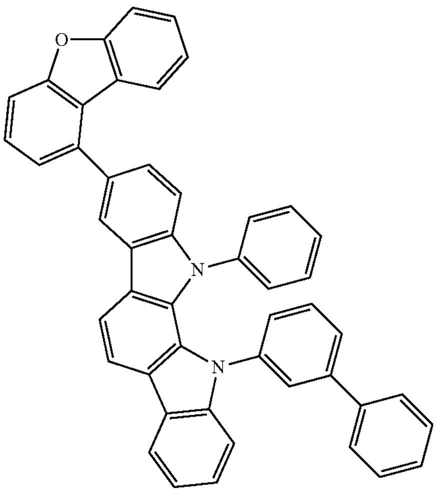
1-34
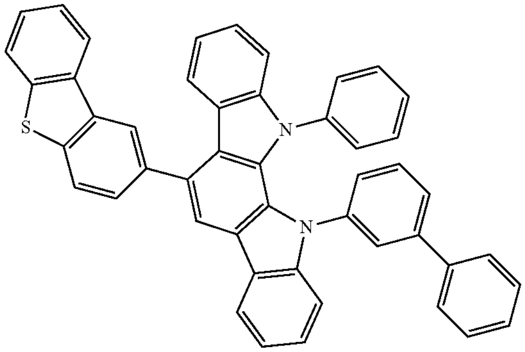
1-35
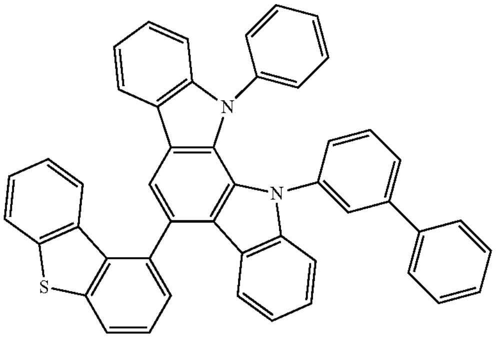
1-36
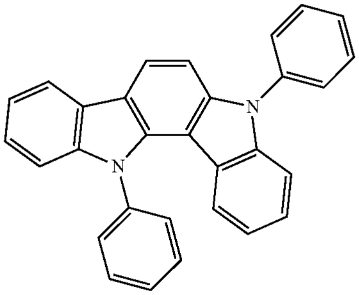
-continued
1-37
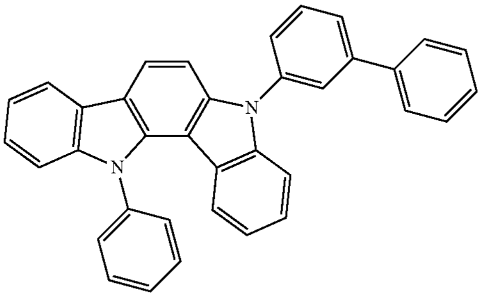
1-38
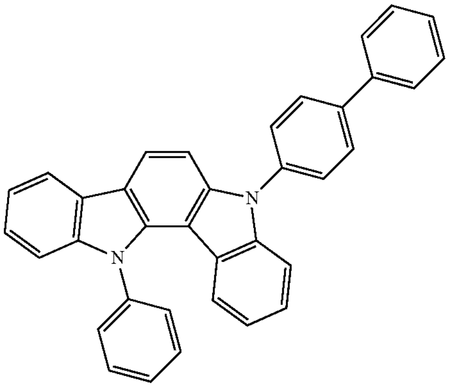
1-39
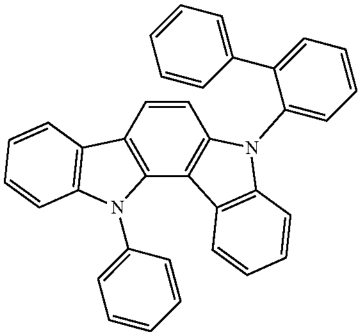
[C 14]
1-40
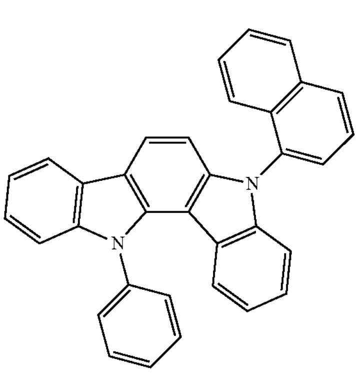

1-41
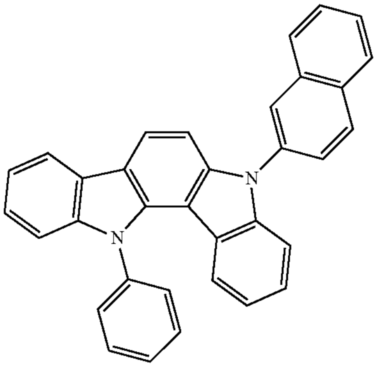
1-42
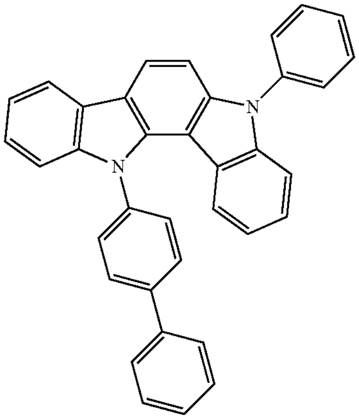
1-43
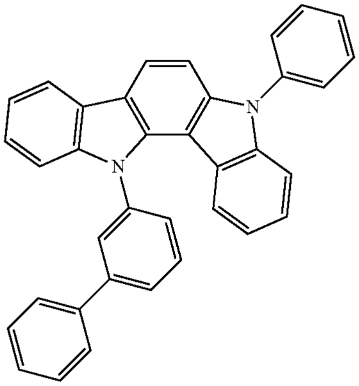
1-44
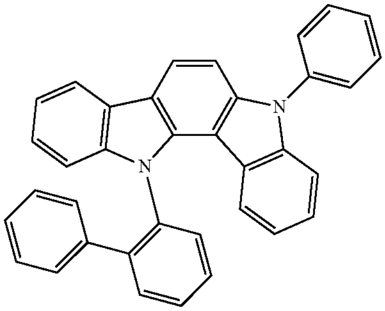
1-45
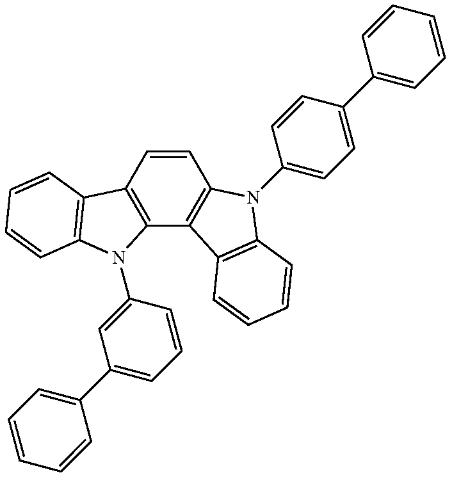
1-46
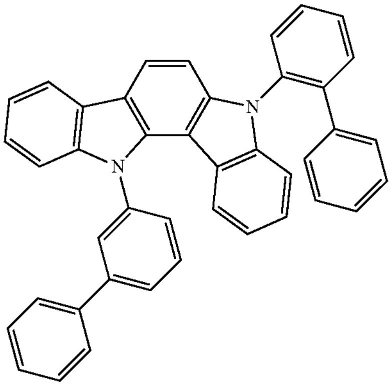
1-47
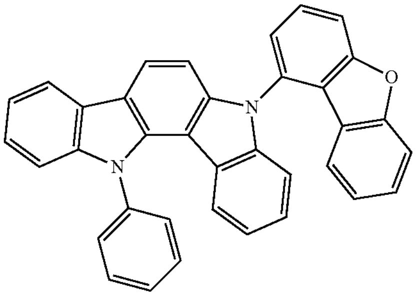
1-48
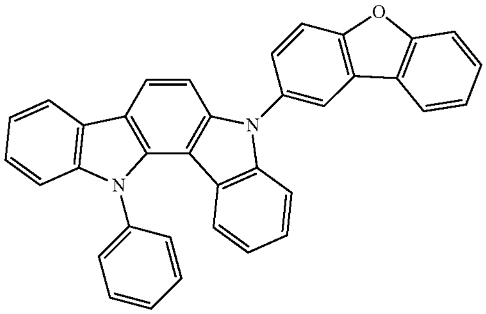

-continued
[C 15]
1-49
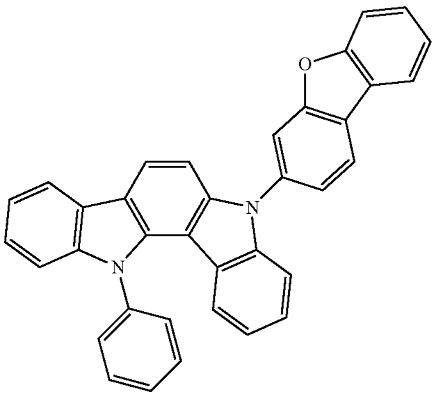
1-50
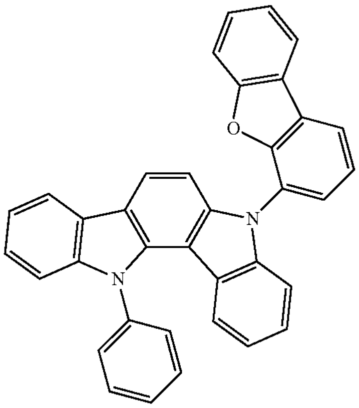
1-51
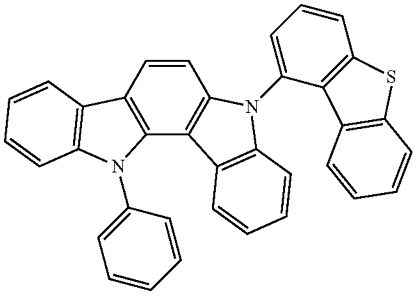
1-52
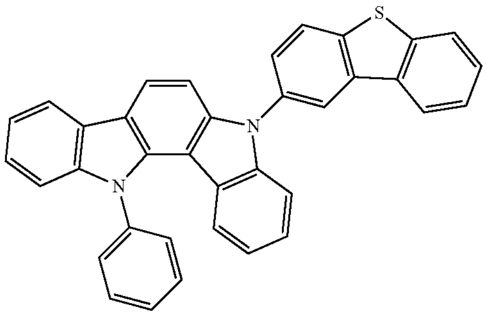
-continued
1-53
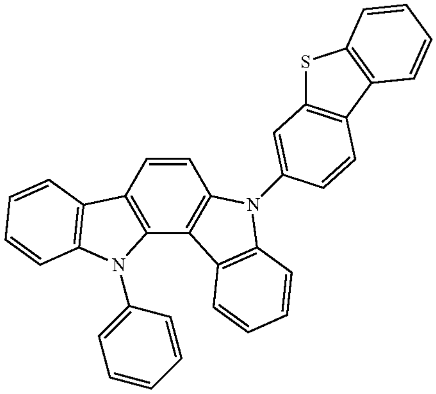
1-54
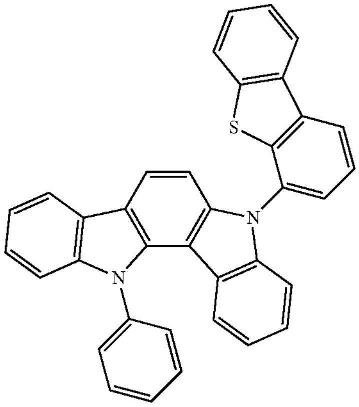
1-55
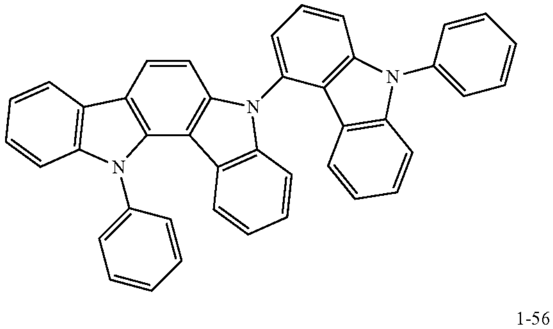
1-56
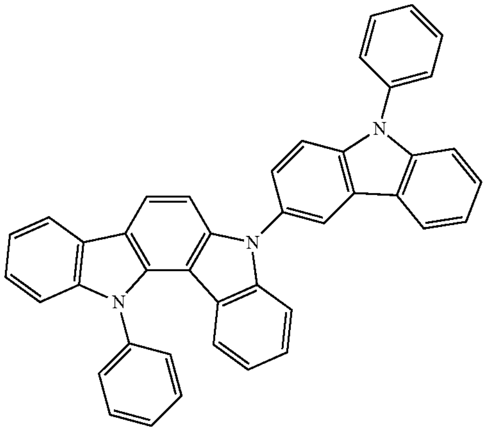

-continued
[C 16]
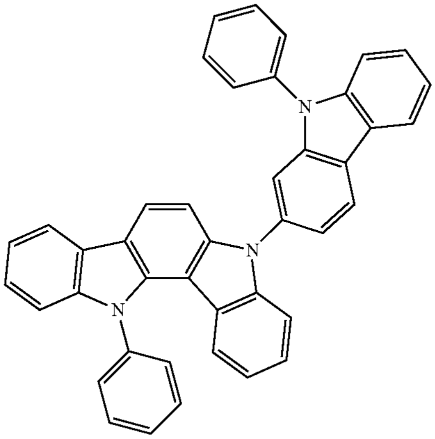
1-57
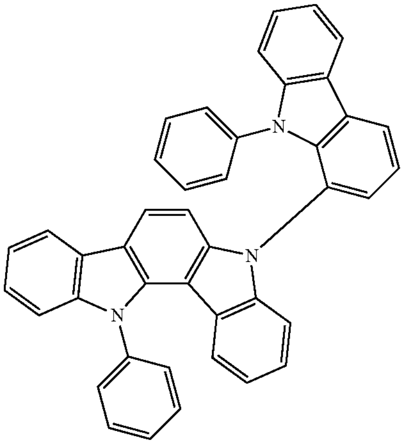
1-58
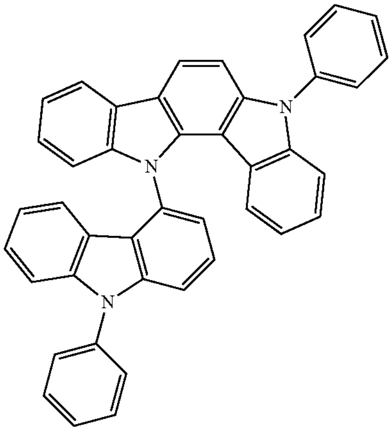
1-59
-continued
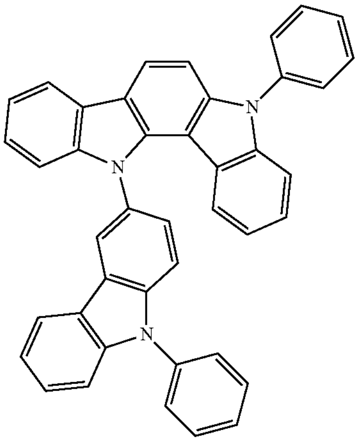
1-60
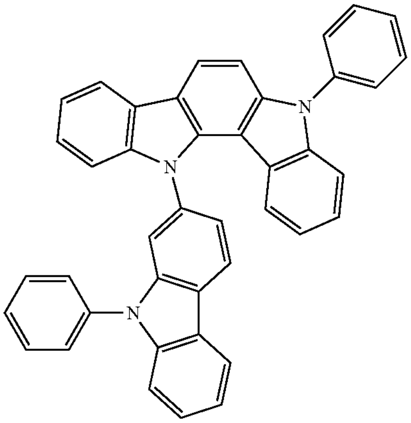
1-61
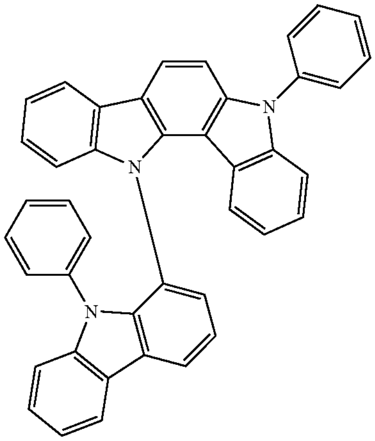
1-62
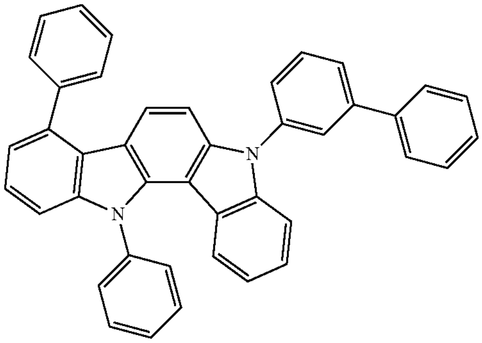
1-63

-continued
1-64
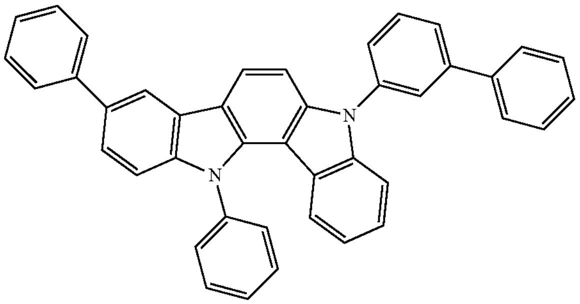
1-65
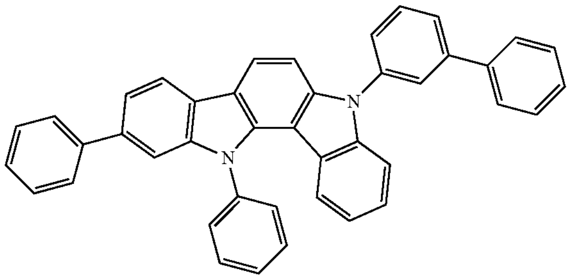
1-66
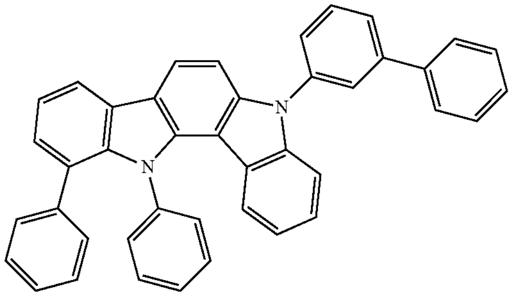
1-67
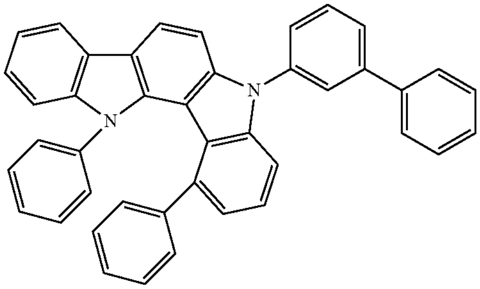
-continued
[C 17]
1-68
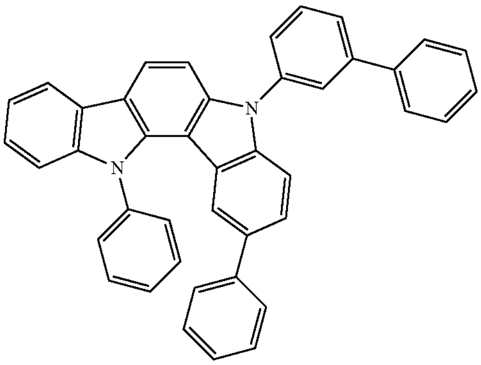
1-69
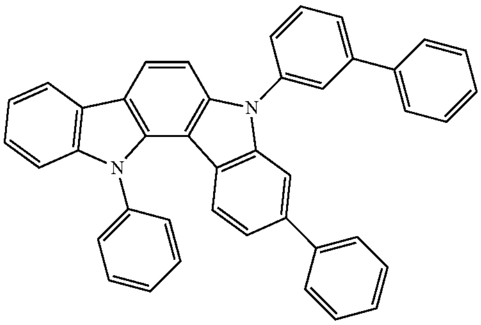
1-70
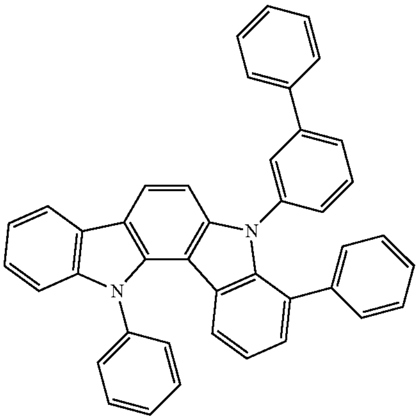
1-71
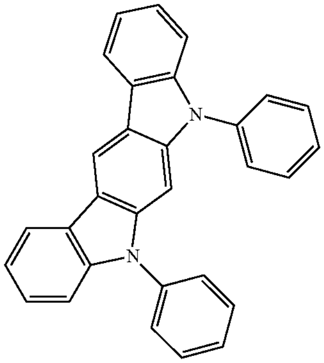

-continued
1-72
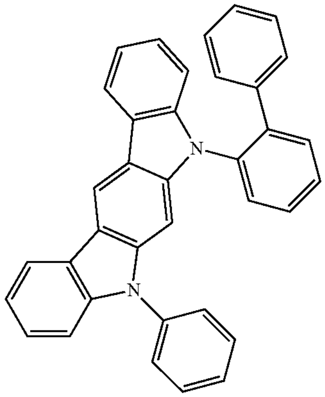
1-73
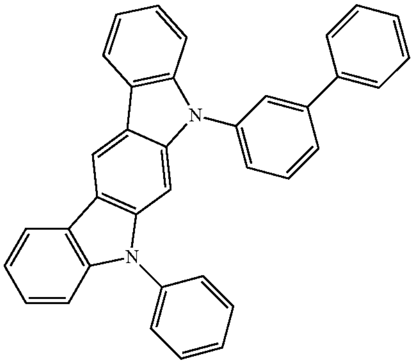
1-74
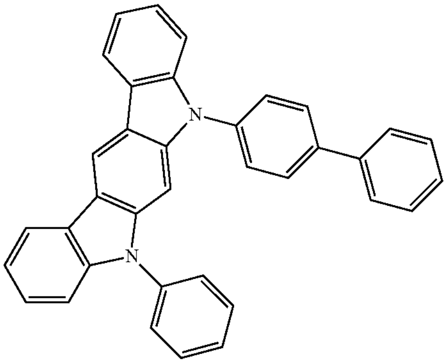
1-75
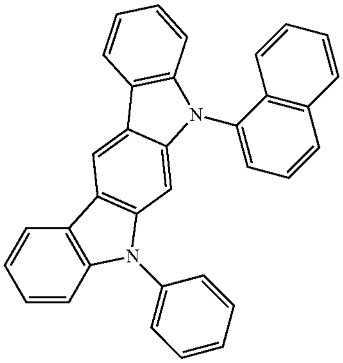
-continued
1-76
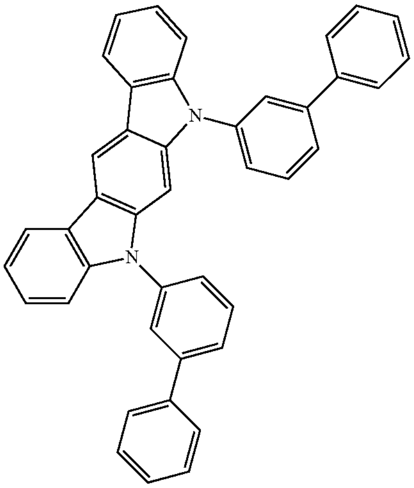
[C 18]
1-77
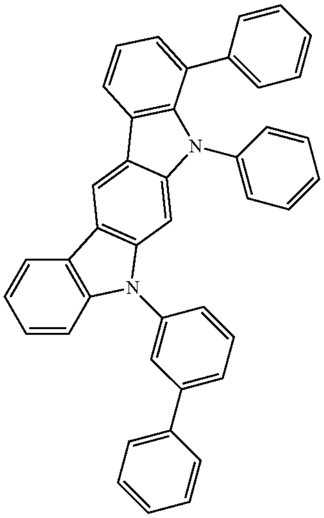
1-78
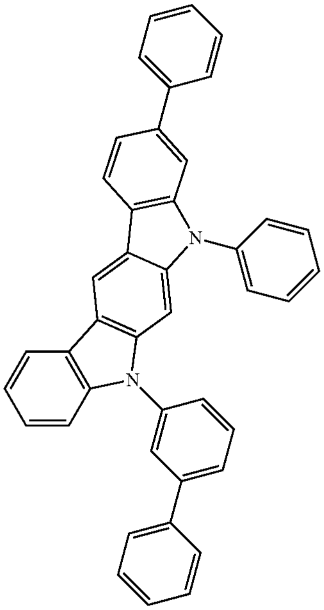

-continued
1-79
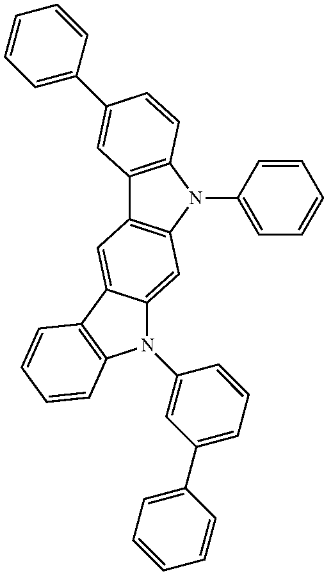
1-80
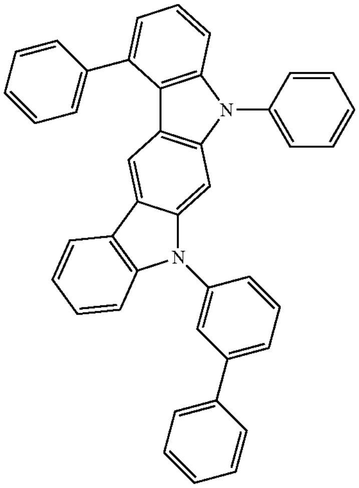
1-81
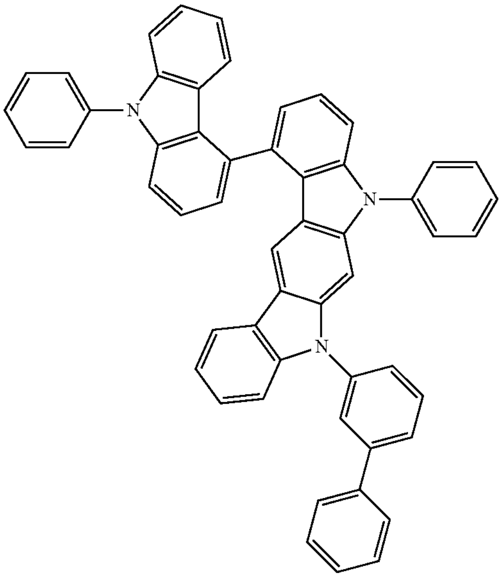
-continued
1-82
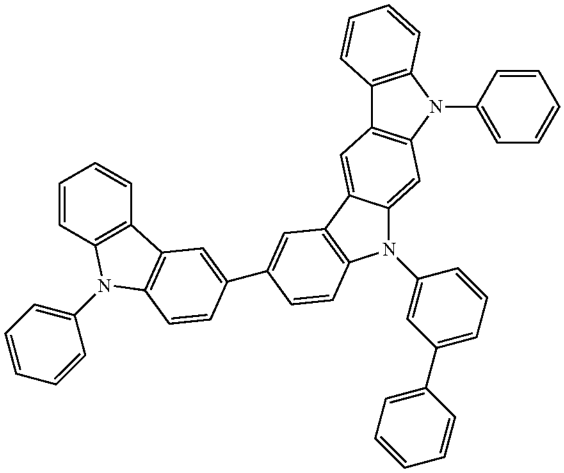
1-83
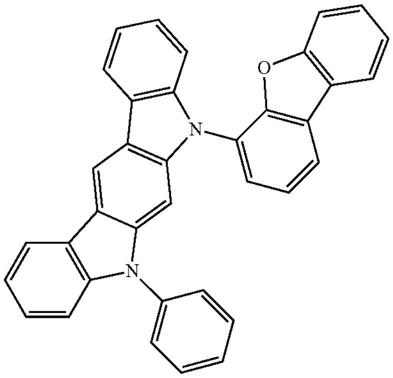
[C 19]
1-84
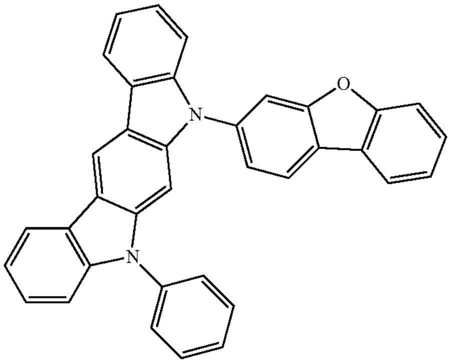
1-85
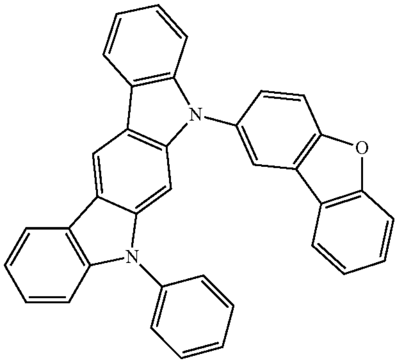

-continued
1-86
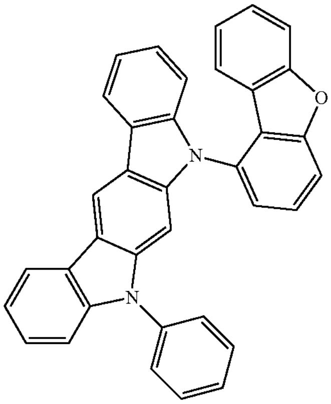
1-87
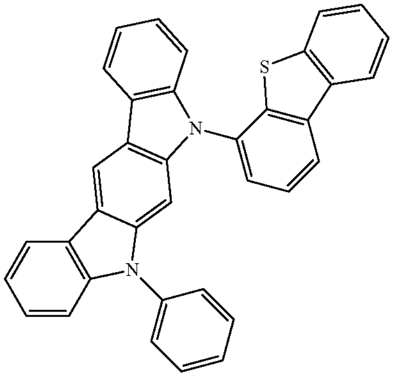
1-88
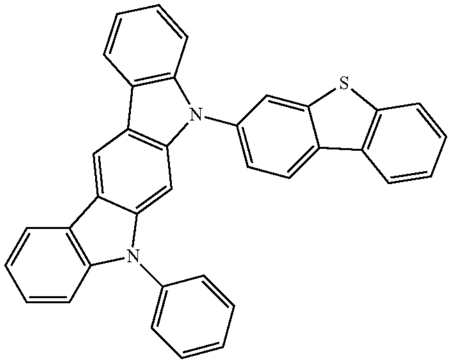
1-89
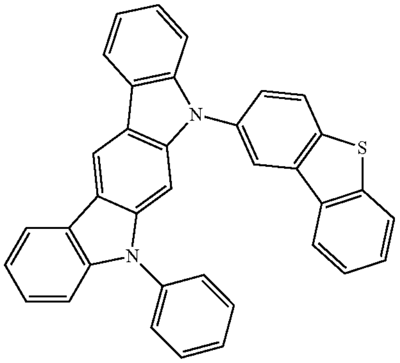
-continued
1-90
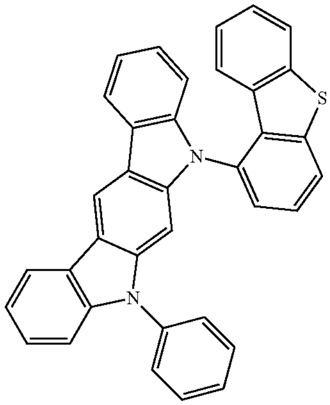
1-91
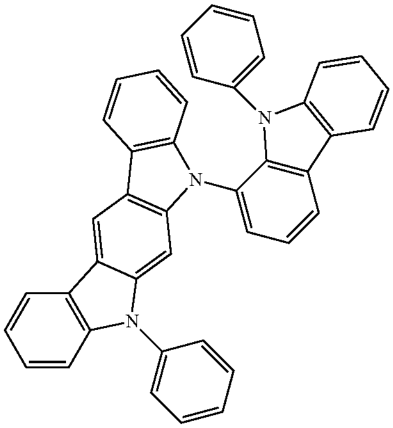
[C 20]
1-92
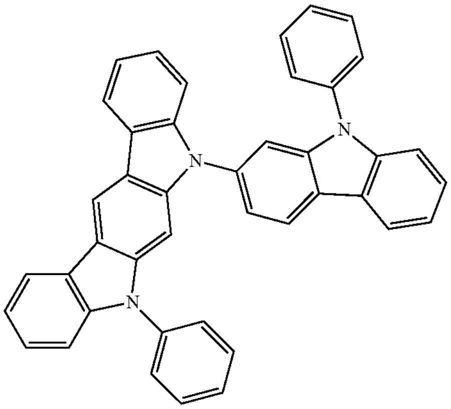
1-93
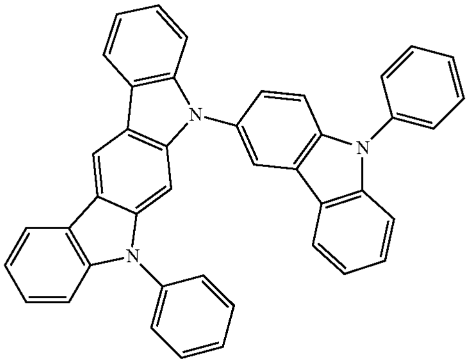

-continued
1-94
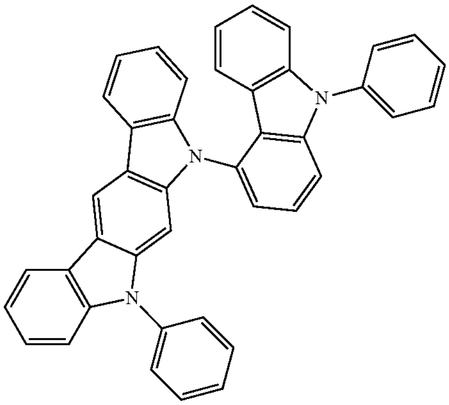
1-95
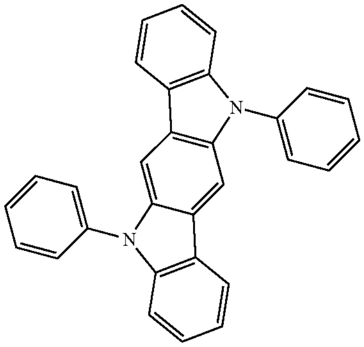
1-96
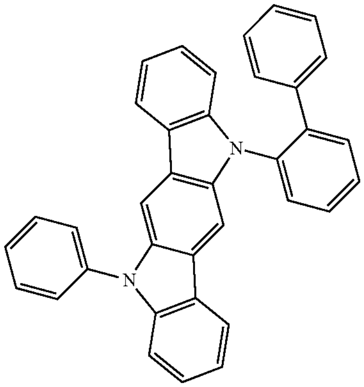
1-97
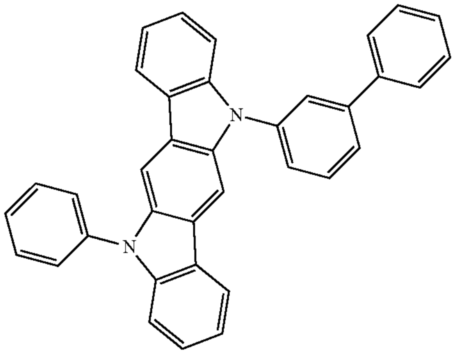
-continued
1-98
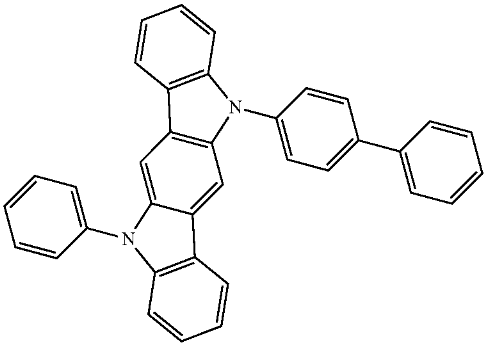
1-99
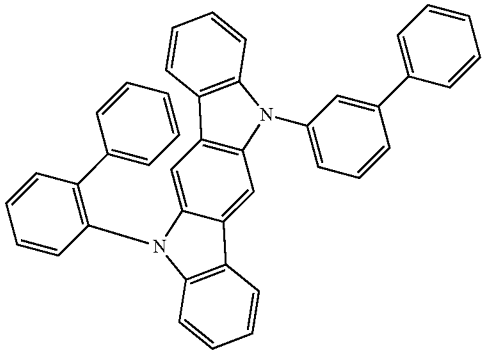
[C 21]
1-100
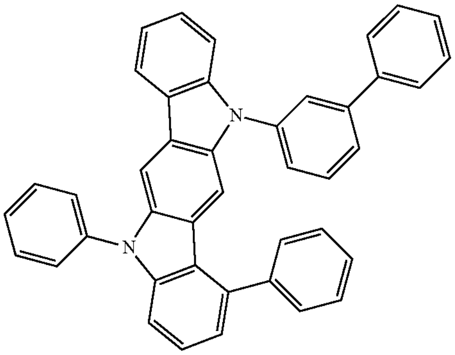
1-101
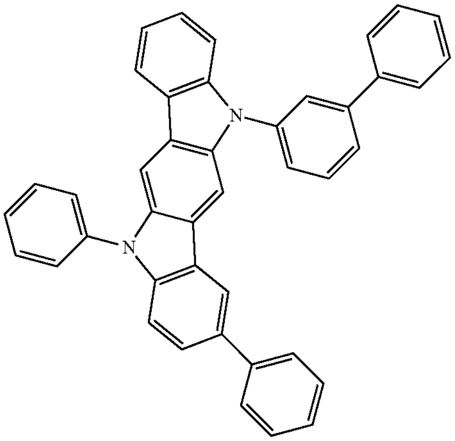

-continued
1-102
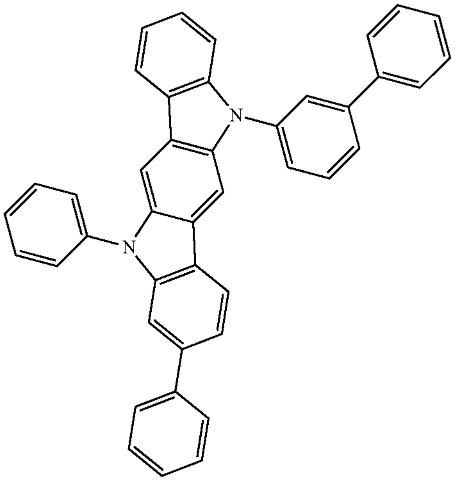
1-103
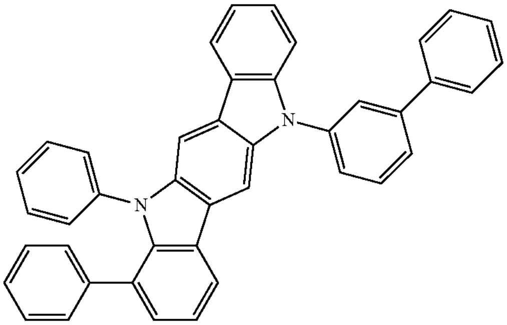
1-104
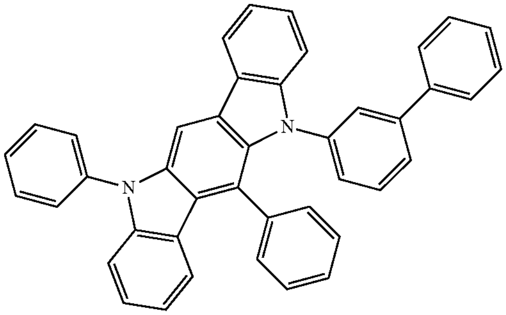
1-105
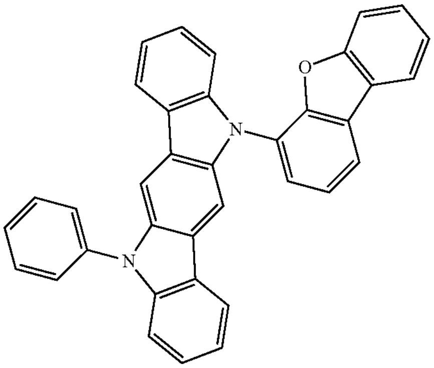
-continued
1-106
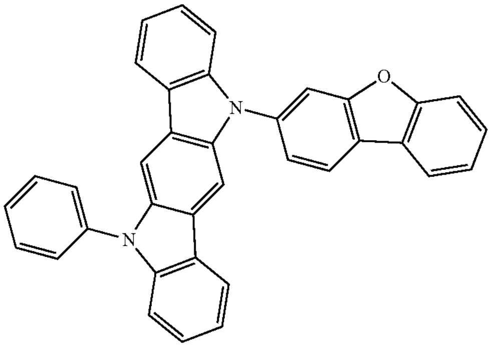
1-107
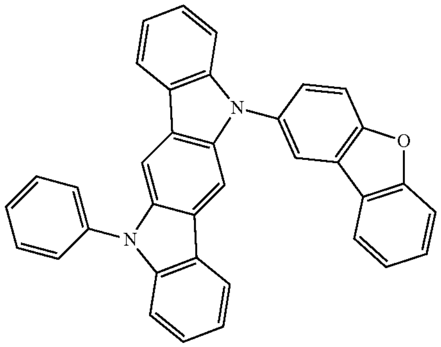
[C 22]
1-108
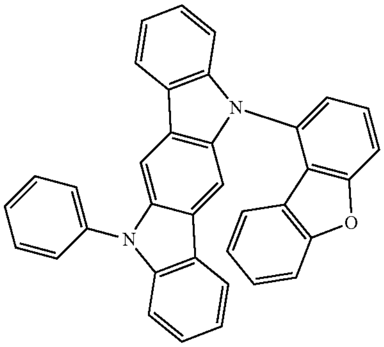
1-109
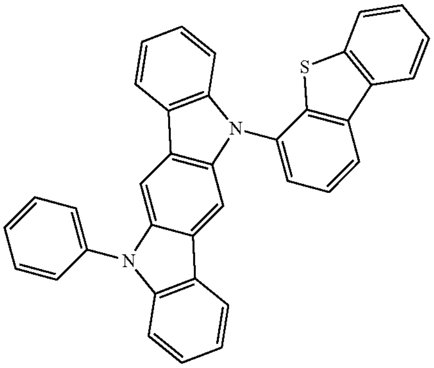

-continued
1-110
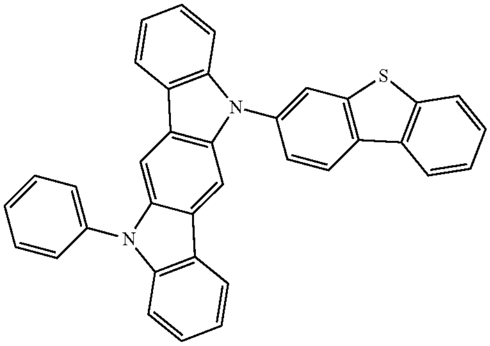
1-111
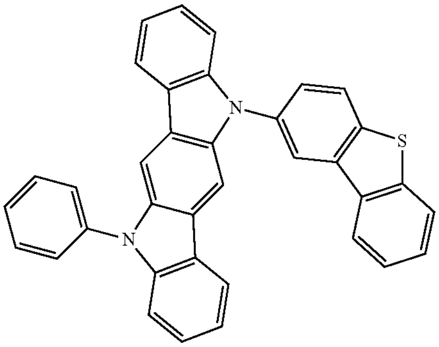
1-112
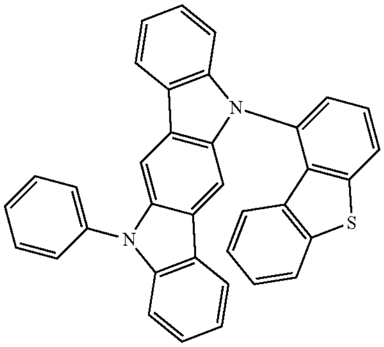
1-113
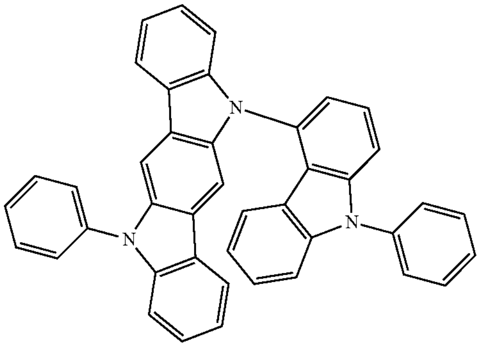
-continued
1-114
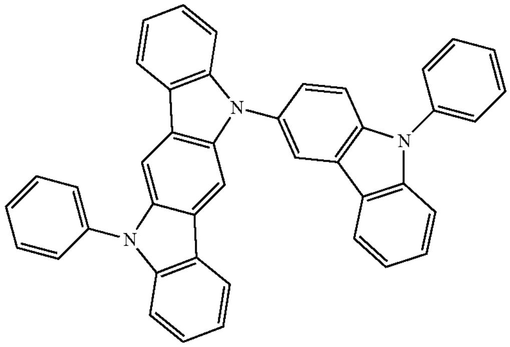
1-115
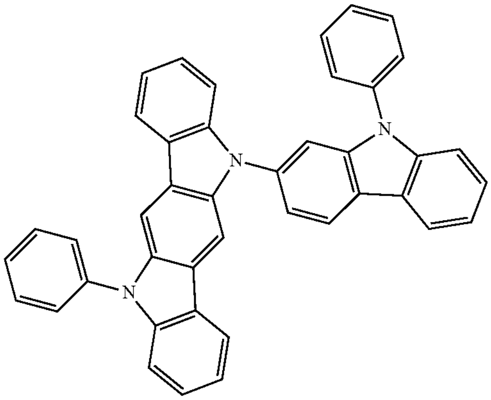
1-116
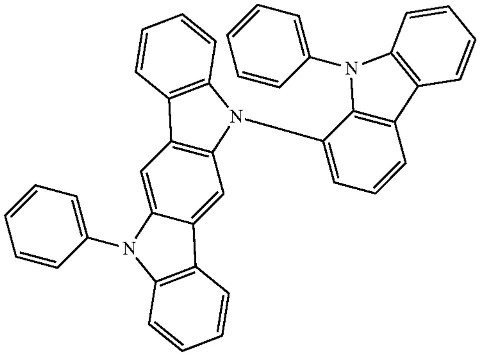
1-117
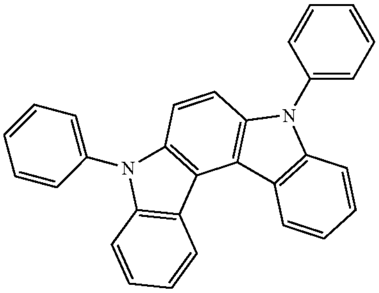

-continued
[C 23]
1-118
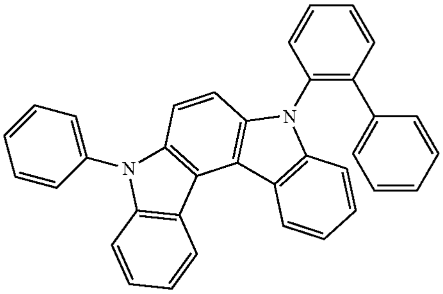
1-119
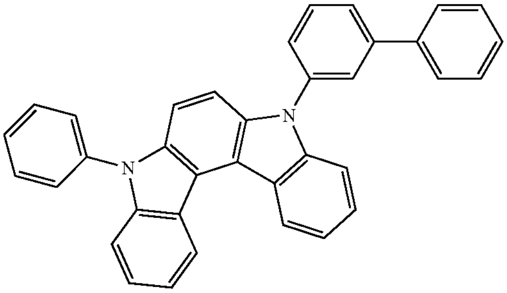
1-120
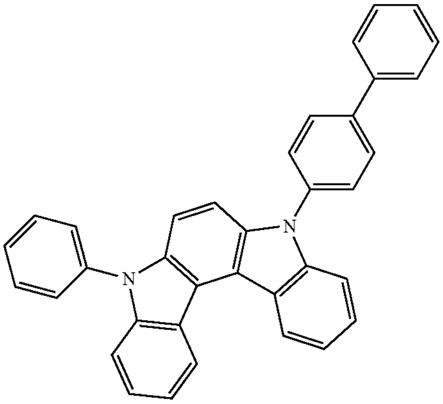
1-121
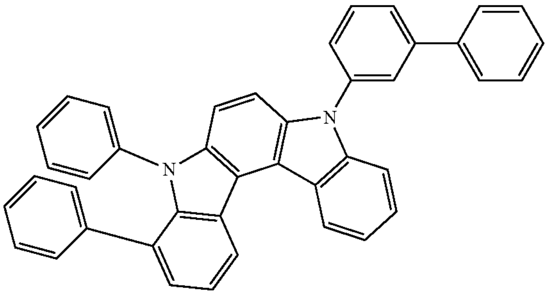
-continued
1-122
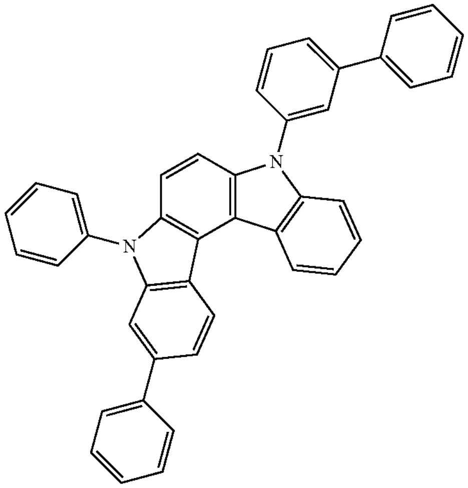
1-123
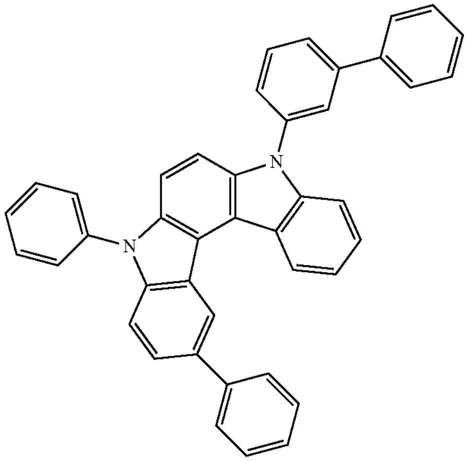
1-124
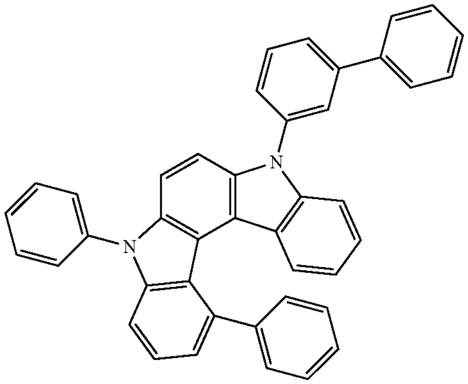

-continued
1-125
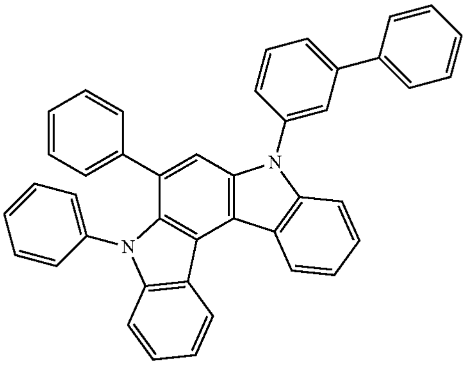
1-126
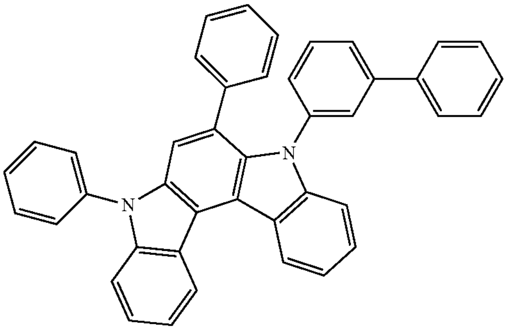
1-128
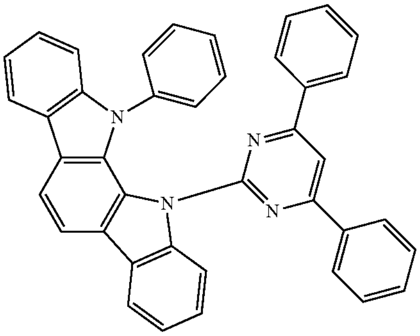
[C 24]
1-129
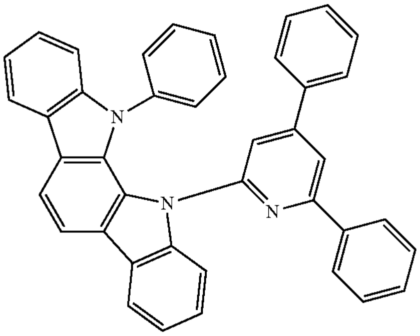
-continued
1-130
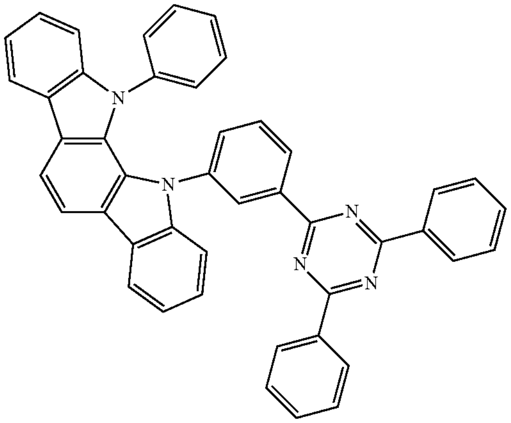
1-131
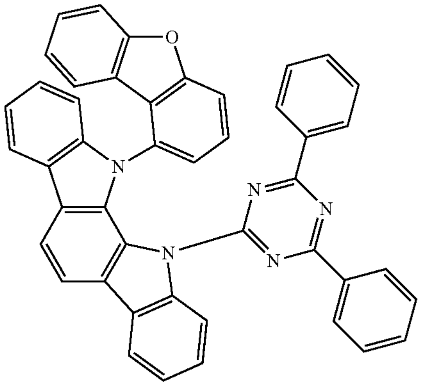
1-132
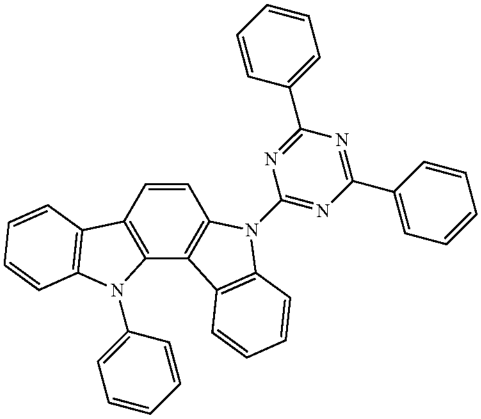

-continued 1-133

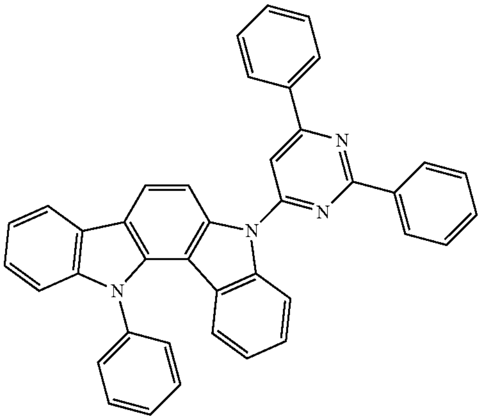

1-134

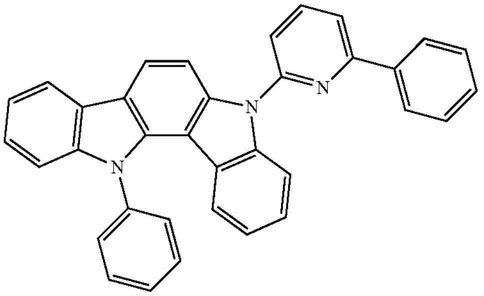

1-135

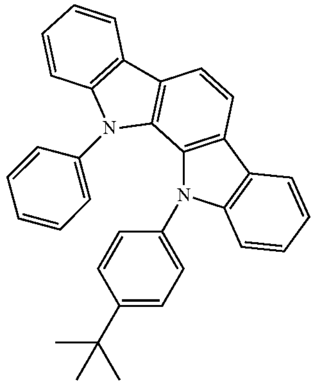

1-136

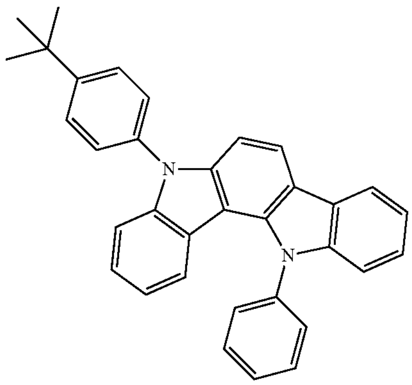

-continued 1-137

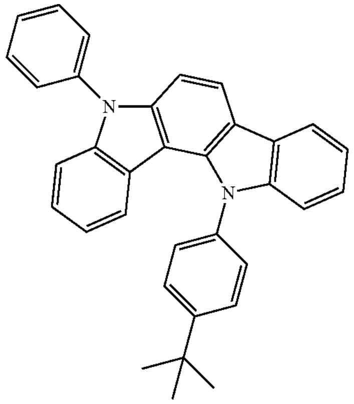

1-138

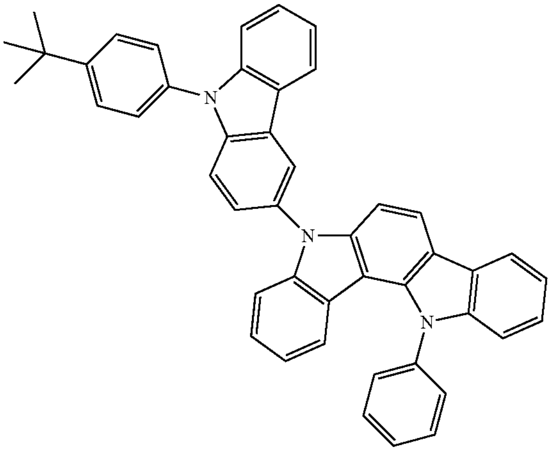

The compound represented by the general formula (2) used in the present invention as the second host will be described.

In the general formula (2), $X^1$ independently represents N or C—H, and at least one $X^1$ represents N. It is preferable that two $X^1$ represent N. It is preferable that three $X^1$ are N, that is, the compound represented by the general formula (2) is preferably a triazine compound.

The preferred example of the general formula (2) is formula (6) or formula (7) above, and, formula (7) is more preferred. In the general formula (2), formula (6) and formula (7), the common symbols have the same meaning.

g, h, i, and j each represent an integer of 0 to 4. More preferably, g, h, i, and j are 0 to 2.

$Ar^3$ represents a substituted or unsubstituted aromatic hydrocarbon group having 6 to 18 carbon atoms, a substituted or unsubstituted aromatic heterocyclic group having 3 to 17 carbon atoms, or a substituted or unsubstituted linked aromatic group formed by linking 2 to 8 aromatic rings thereof. Preferably, $Ar^3$ represents a substituted or unsubstituted aromatic hydrocarbon group having 6 to 12 carbon atoms, a substituted or unsubstituted aromatic heterocyclic group having 3 to 12 carbon atoms, or a substituted or unsubstituted linked aromatic group formed by linking 2 to 6 aromatic rings thereof. More preferably, $Ar^3$ represents a substituted or unsubstituted aromatic hydrocarbon group having 6 to 10 carbon atoms, a substituted or unsubstituted aromatic heterocyclic group having 3 to 10 carbon atoms, or a substituted or unsubstituted linked aromatic group formed by linking 2 to 4 aromatic rings thereof.

When $Ar^3$ is an unsubstituted aromatic hydrocarbon group or an unsubstituted aromatic heterocyclic group, specific examples thereof are the same as described for $Ar^1$ or $R^1$ above. Examples of the unsubstituted linked aromatic group are the same as described for $Ar^1$ above.

$Ar^3$ is preferably a group produced by removing one hydrogen atom from benzene, naphthalene, acenaphthene, acenaphthylene, azulene, pyridine, triazine, dibenzofuran, dibenzothiophene, carbazole, or a compound formed by linking 2 to 4 of these compounds. More preferably, $Ar^3$ is a group produced from benzene, carbazole, or a compound formed by linking 2 to 3 benzene rings.

In formula (6) and formula (7), $R^2$ independently represents deuterium, an aliphatic hydrocarbon group having 1 to 10 carbon atoms, a triarylsilyl group, a substituted or unsubstituted aromatic hydrocarbon group having 6 to 18 carbon atoms, or a substituted or unsubstituted aromatic heterocyclic group having 3 to 17 carbon atoms. $R^2$ is preferably a substituted or unsubstituted aromatic hydrocarbon group having 6 to 12 carbon atoms, or a substituted or unsubstituted aromatic heterocyclic group having 3 to 15 carbon atoms. $R^2$ is more preferably an aromatic hydrocarbon group having 6 to 10 carbon atoms. g, h, i, and j represent integers of 0 to 4.

When $R^2$ represents an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, specific examples thereof are the same as described for $R^1$. Preferably, $R^2$ is a group produced by removing one hydrogen atom from benzene, naphthalene, acenaphthene, acenaphthylene, azulene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzisothiazole, benzothiadiazole, purine, pyranone, coumarin, isocoumarin, chromone, dibenzofuran, dibenzothiophene, dibenzoselenophene, triphenylsilane, or carbazole.

Specific examples of the compounds represented by the general formula (2), formula (6) or formula (7) are shown below, but the compounds are not limited to these exemplified compounds.

[C 25]

2-1

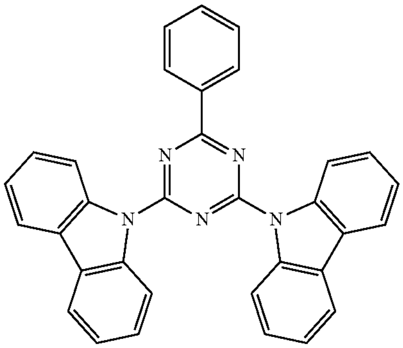

-continued 2-2

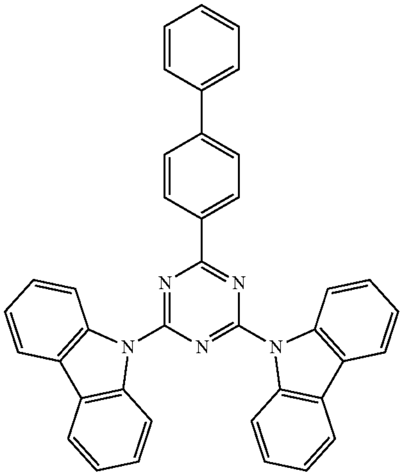

2-3

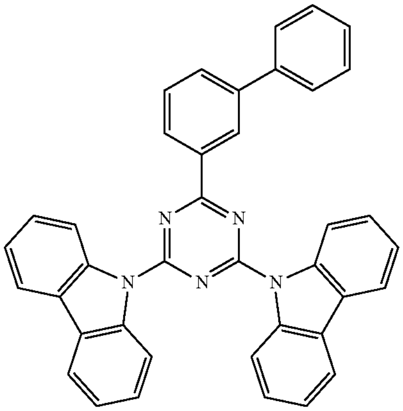

2-4

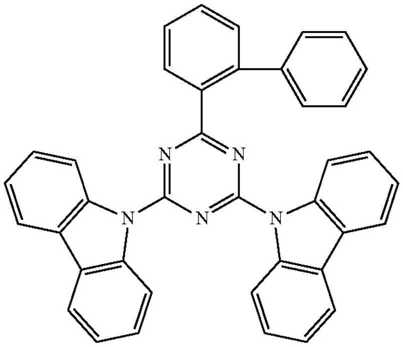

-continued
2-5
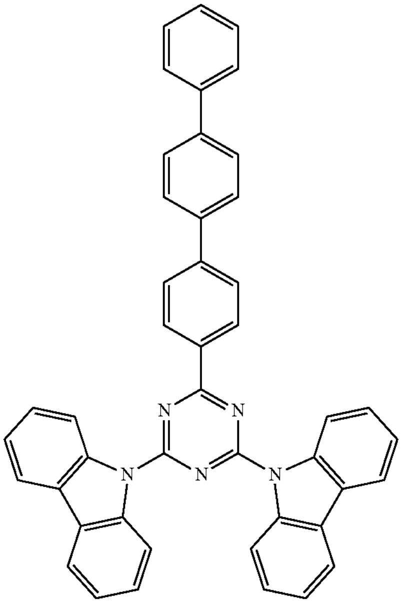
2-6
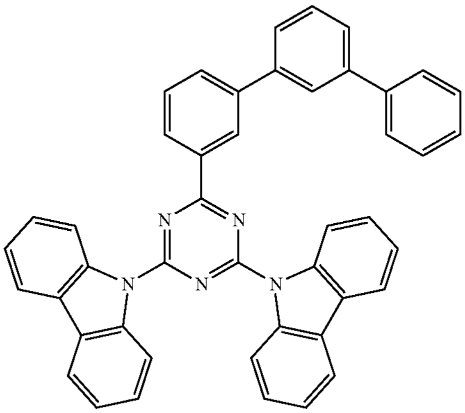
2-7
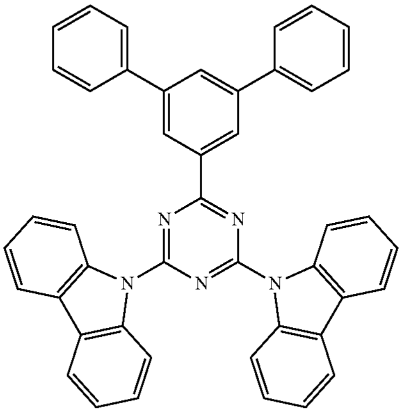
-continued
[CF 26]
2-8
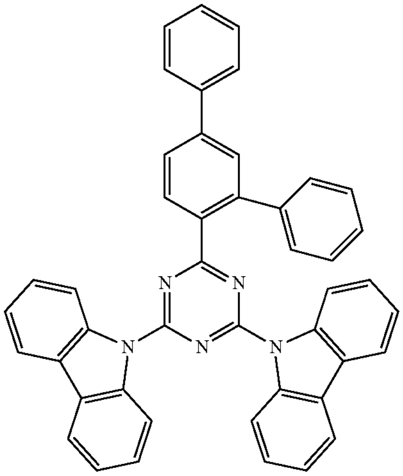
2-9
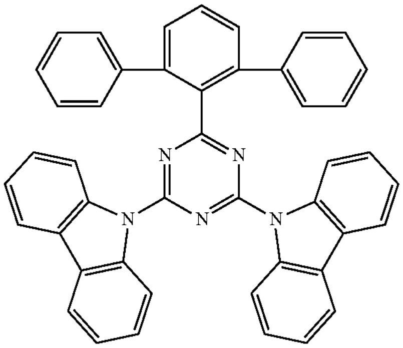
2-10
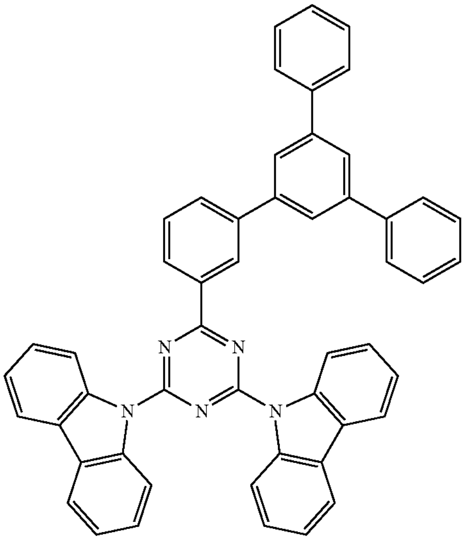

-continued
2-11
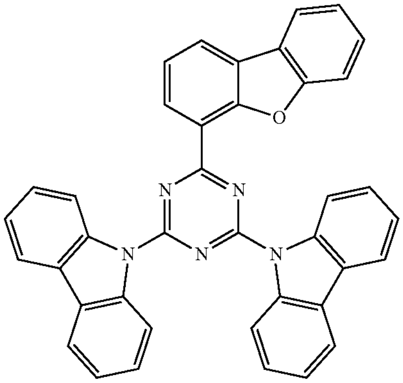
2-12
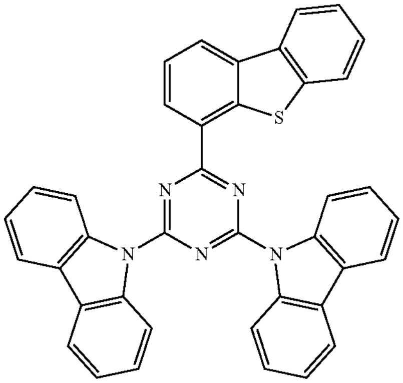
2-13
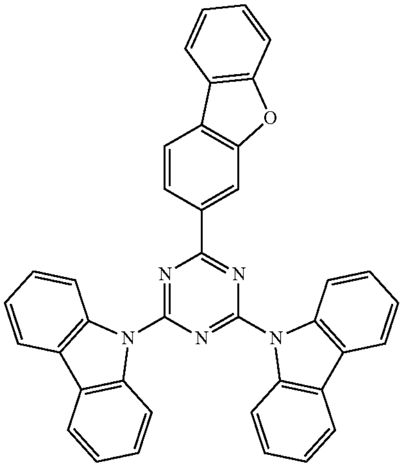
-continued
[C 27]
2-14
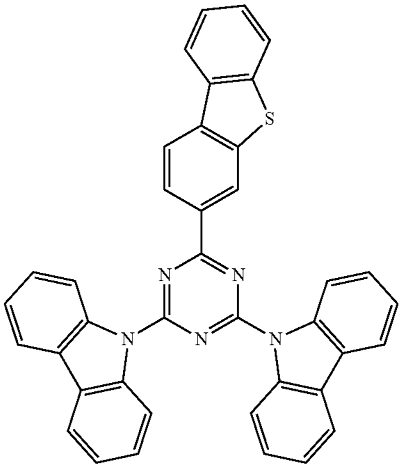
2-15
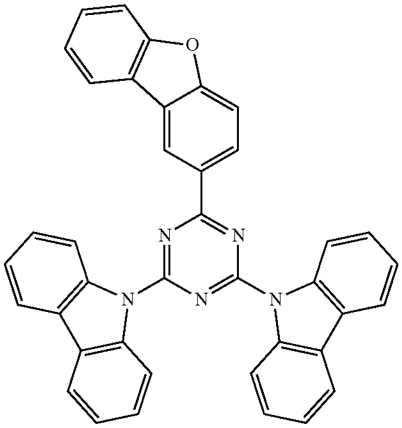
2-16
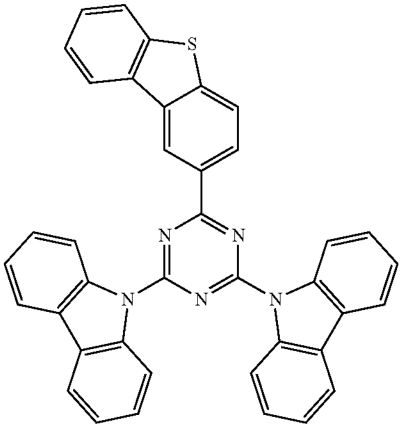

-continued
2-17
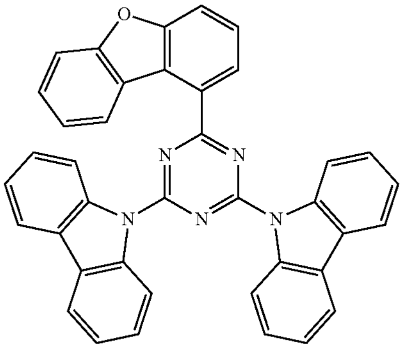
2-18
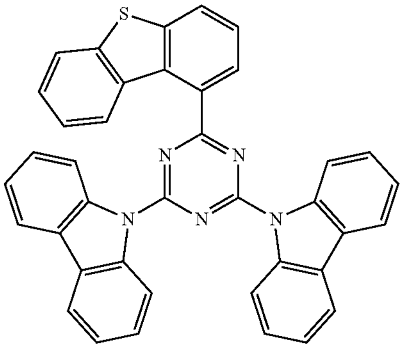
2-19
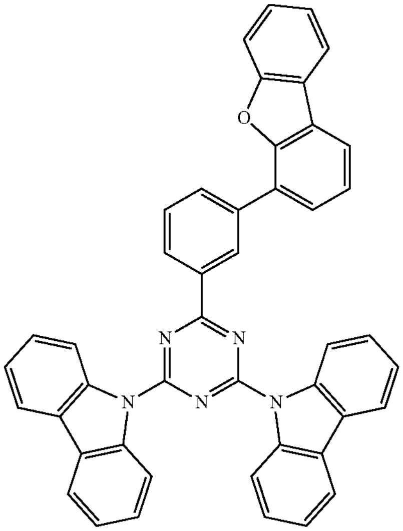
-continued
[C 28]
2-20
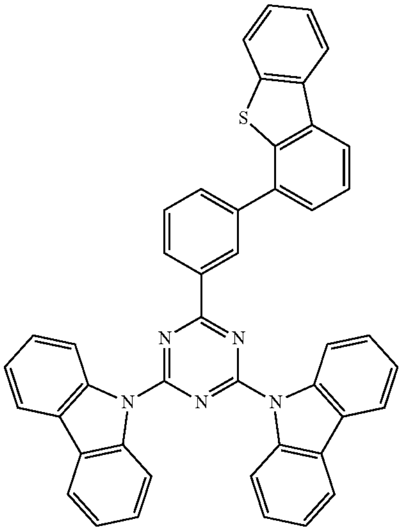
2-21
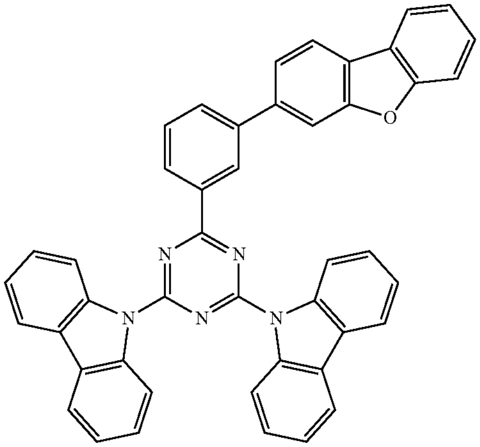
2-22
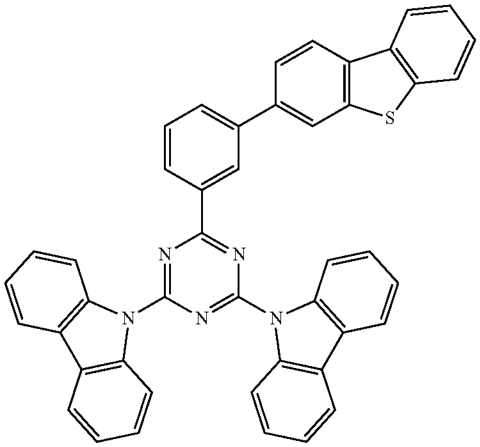

-continued
2-23
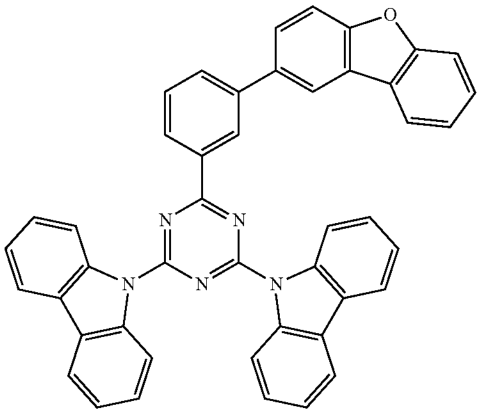
2-24
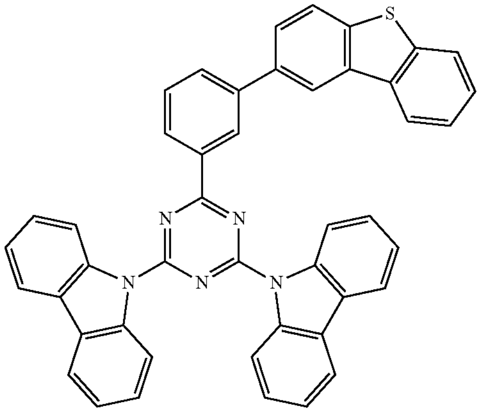
2-25
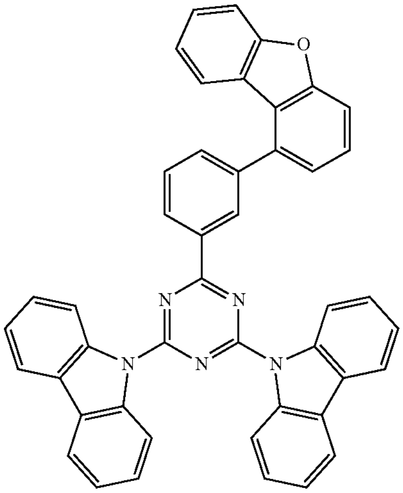
-continued
[C 29]
2-26
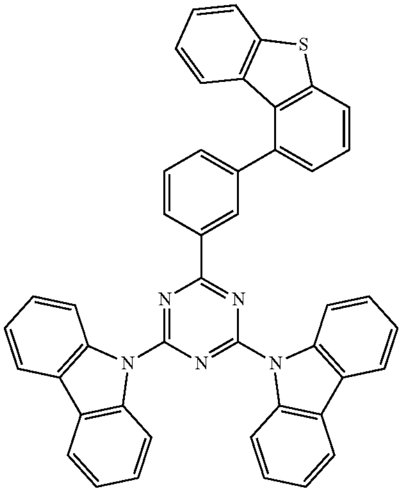
2-27
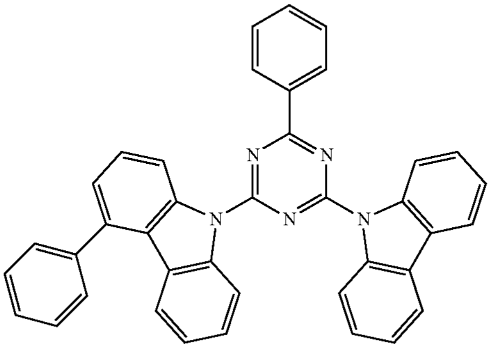
2-28
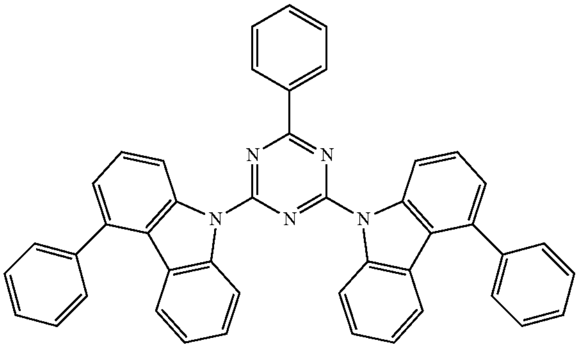

-continued
2-29
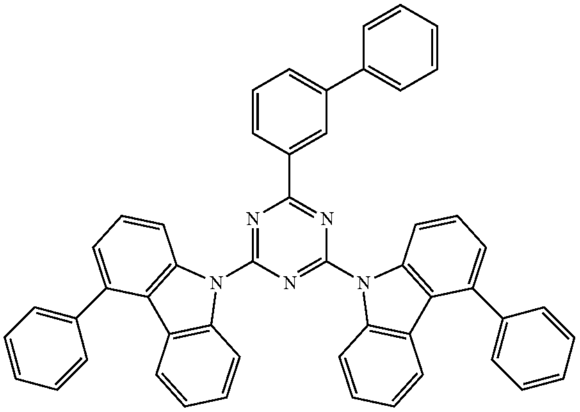
2-30
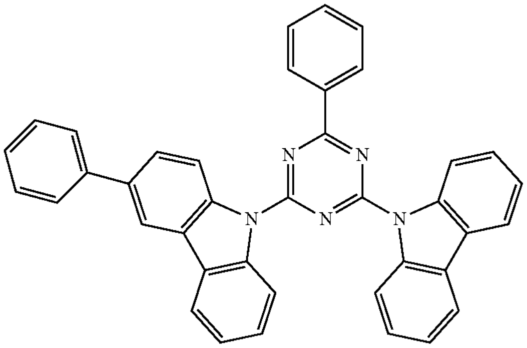
2-31
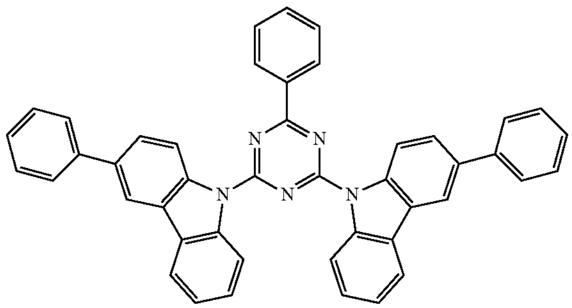
2-32
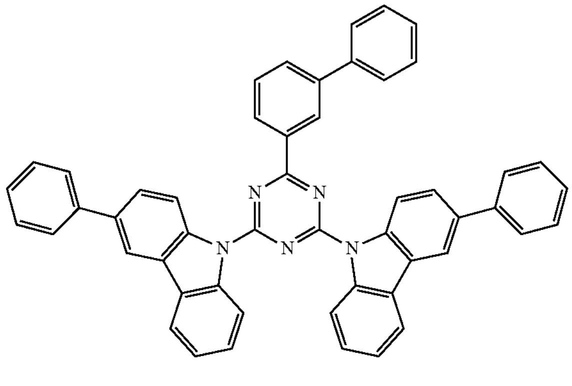
-continued
2-33
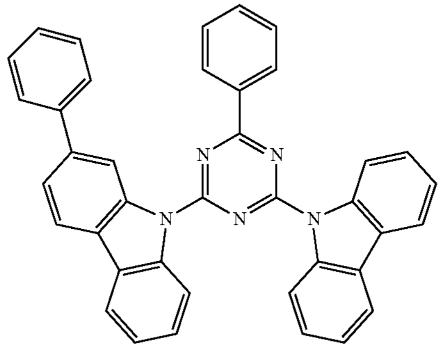
[C 30]
2-34
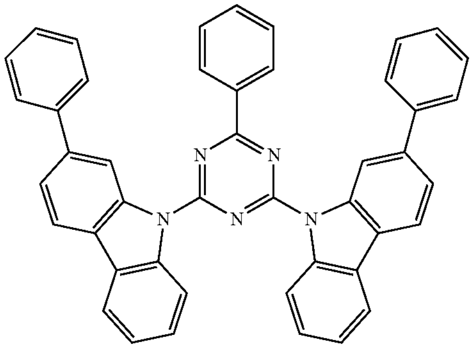
2-35
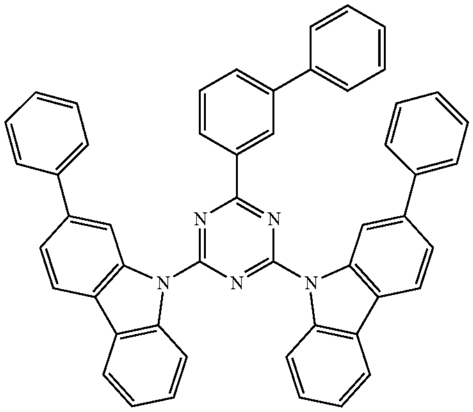
2-36
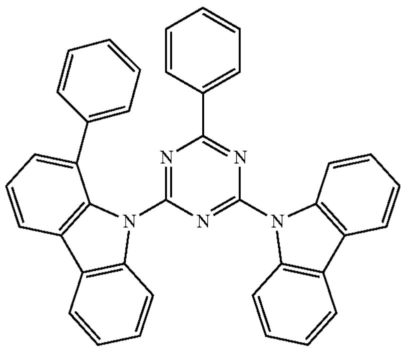

-continued
2-37
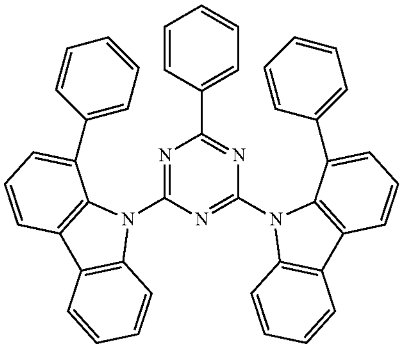
2-38
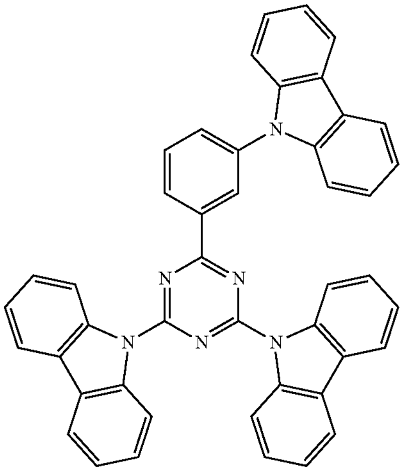
2-39
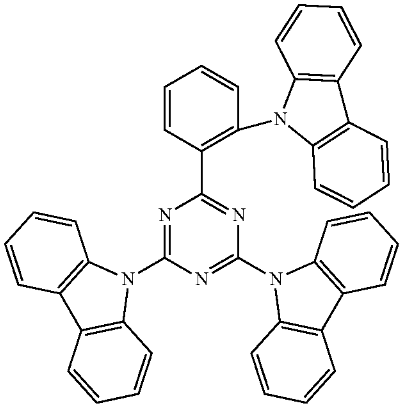
2-40
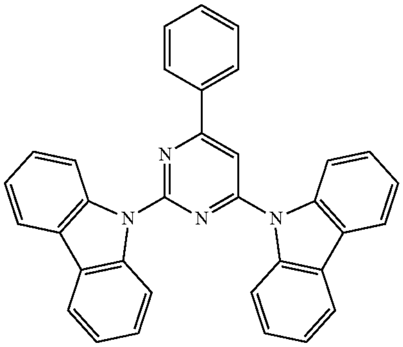
-continued
2-41
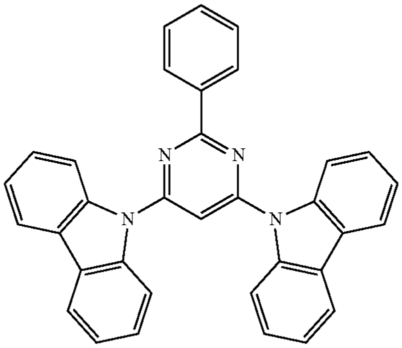
[C 31]
2-42
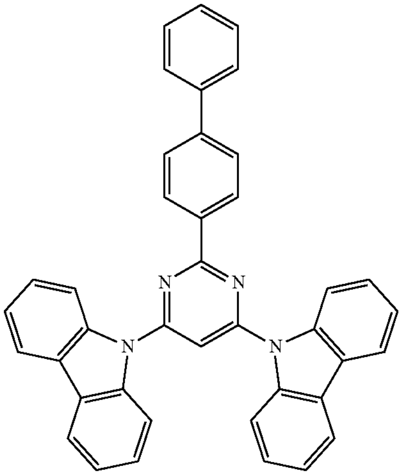
2-43
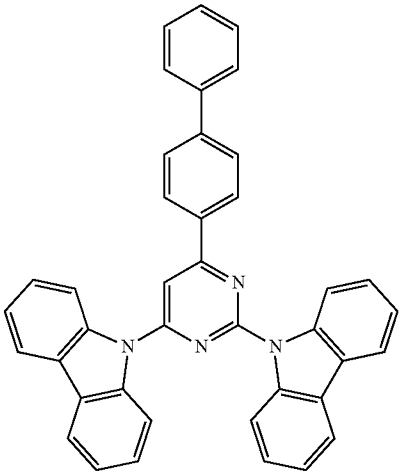

-continued
2-44
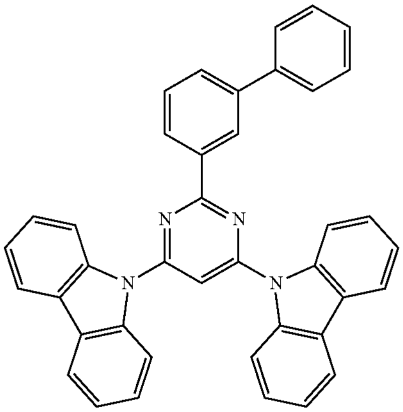
2-45
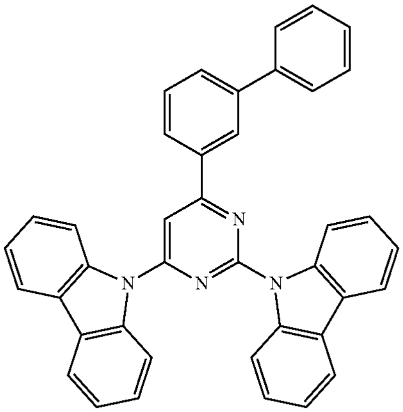
2-46
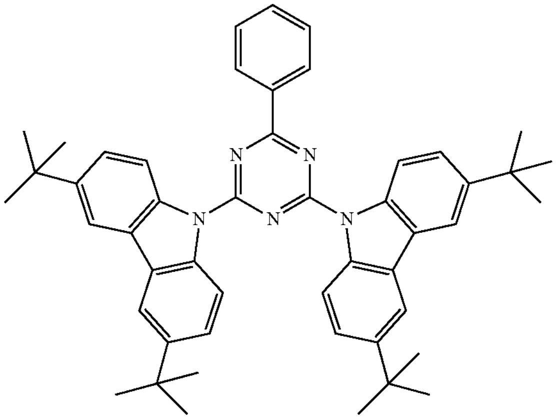
-continued
2-47
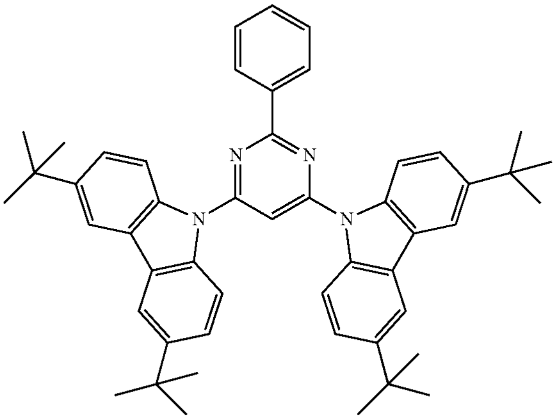
2-48
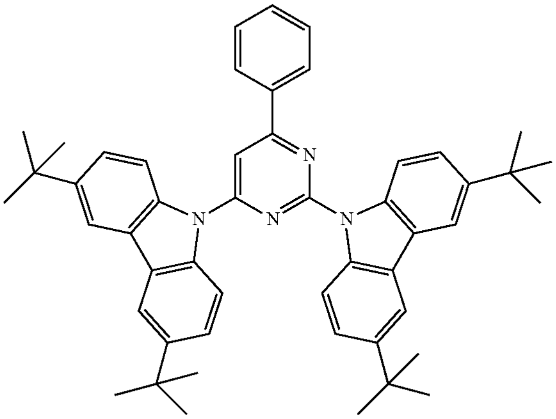
2-49
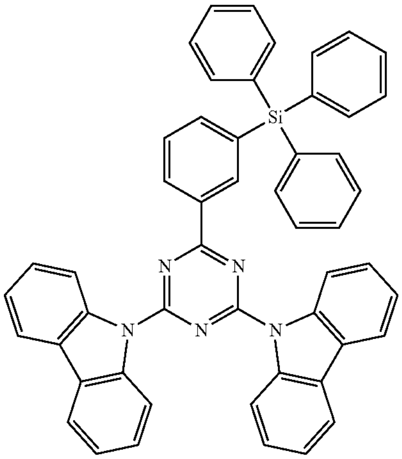

-continued
2-50
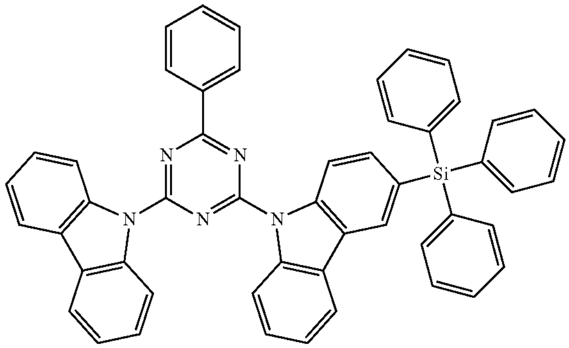
2-51
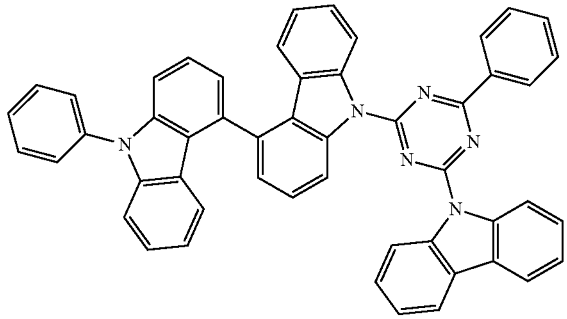
2-52
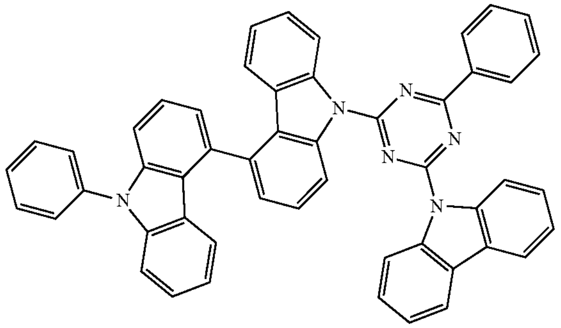
2-53
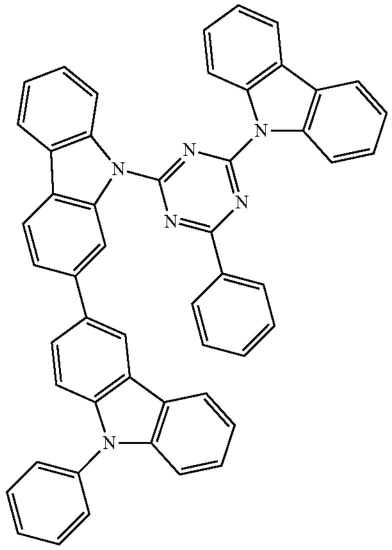
-continued
2-54
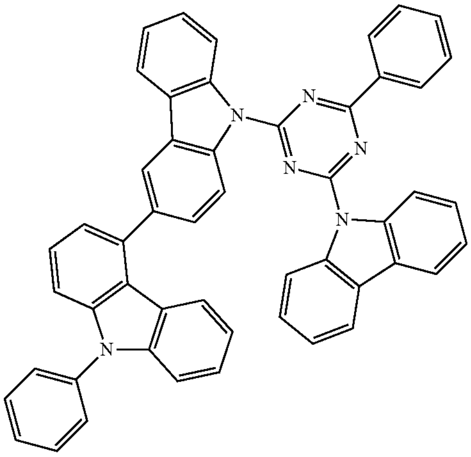
2-55
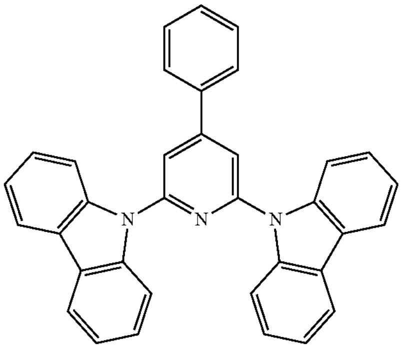
2-56
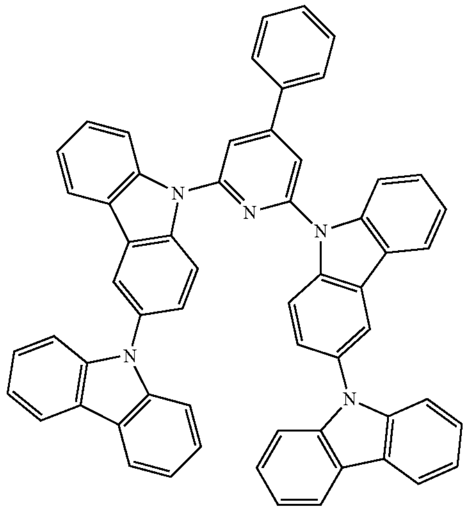

-continued
2-57
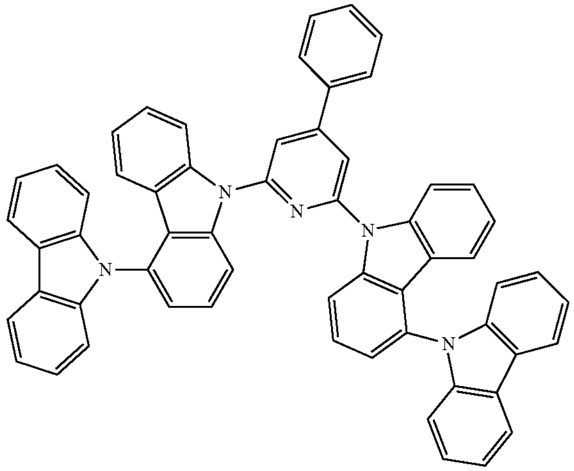
[C 33]
2-58
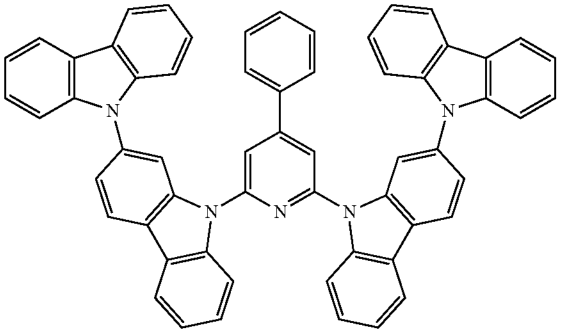
2-59
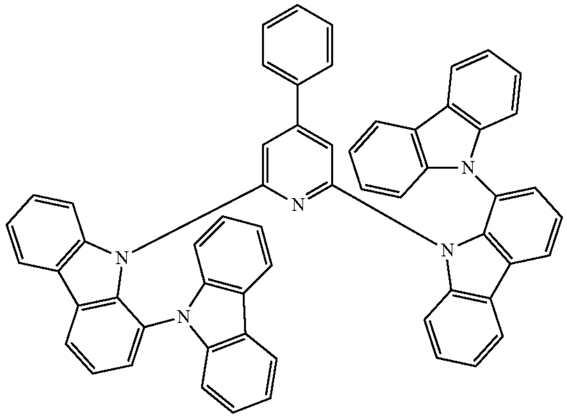
-continued
2-60
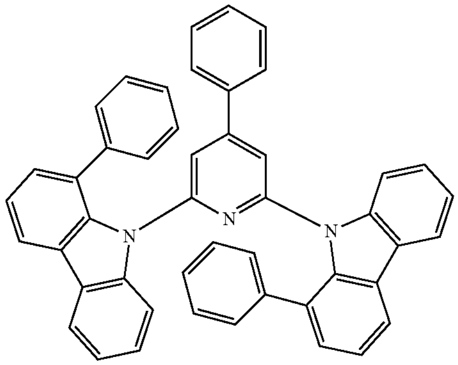
2-61
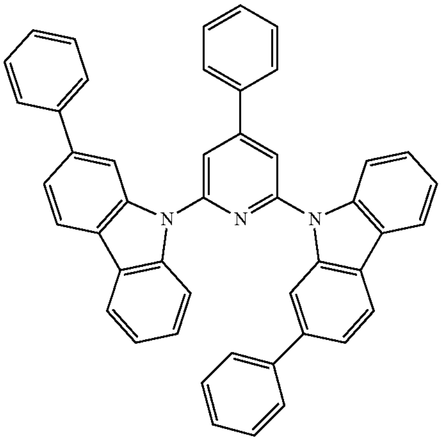
2-62
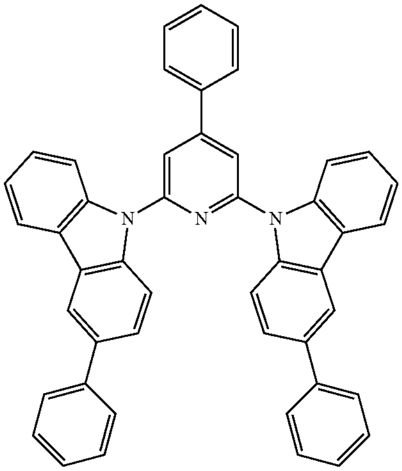

-continued
2-63
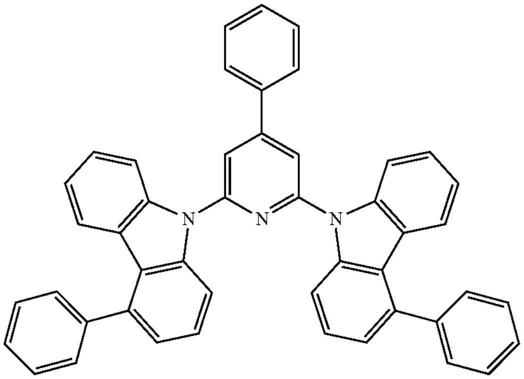
2-64
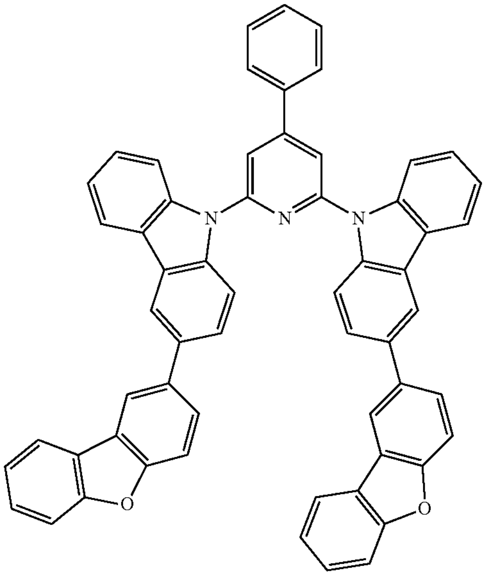
2-65
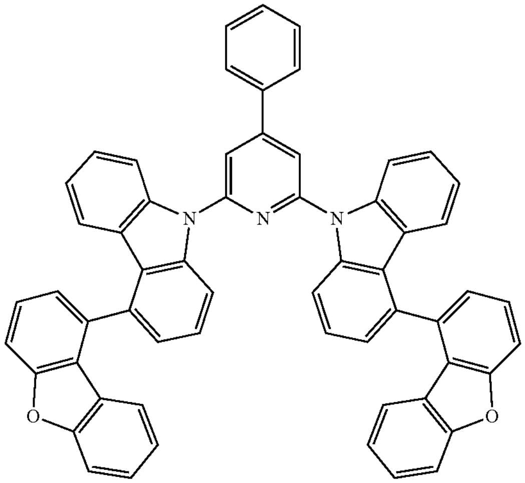
-continued
[C 34]
2-66
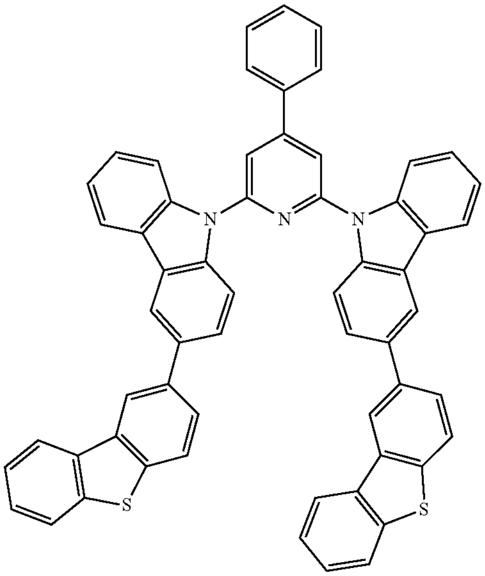
2-67
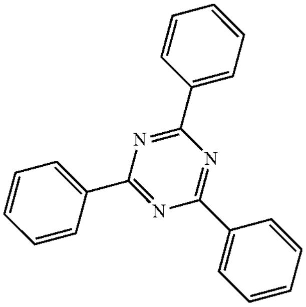
2-68
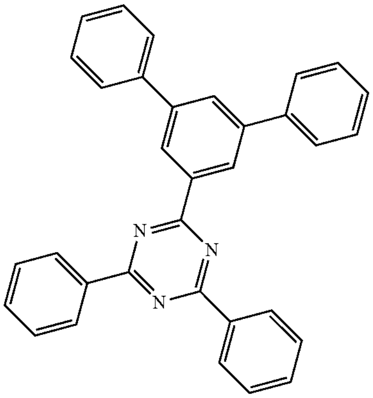

-continued
2-69
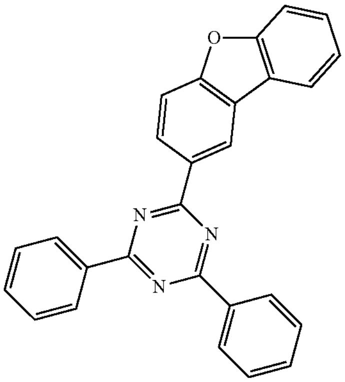
2-70
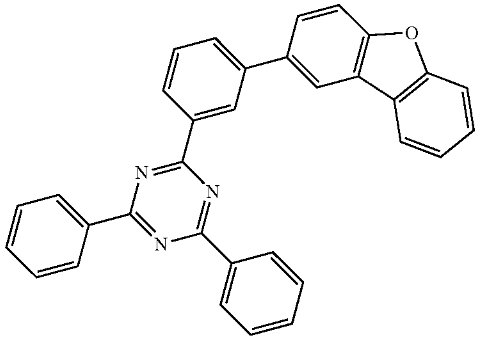
2-71
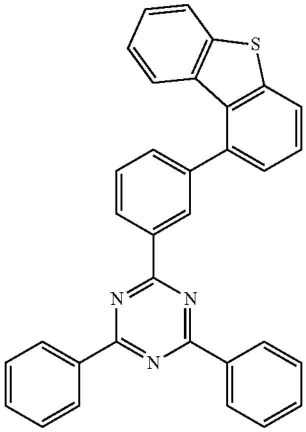
2-72
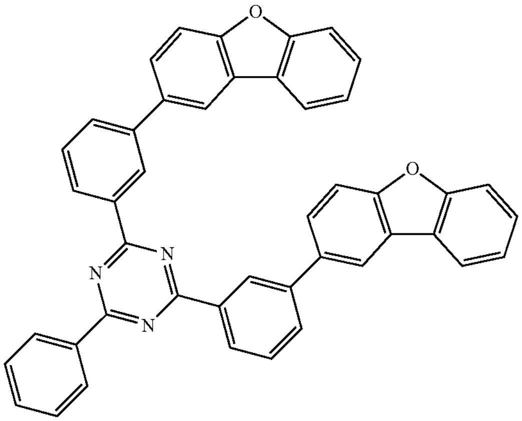
-continued
2-73
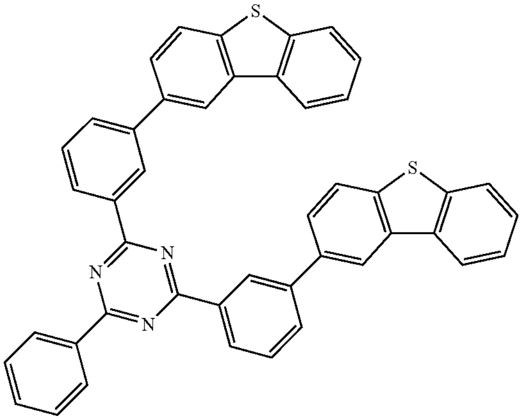
2-74
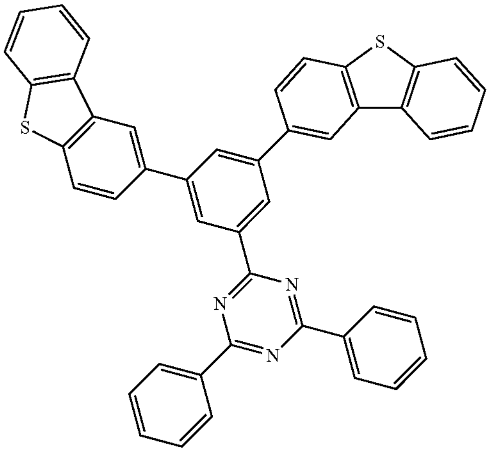
2-75
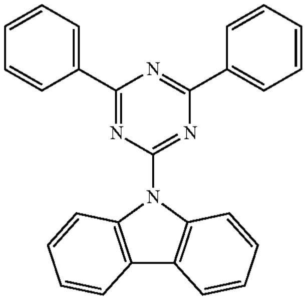
2-76
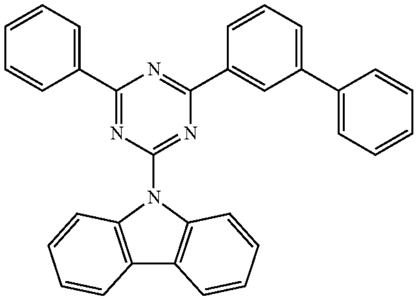

-continued
[C 35]
2-77
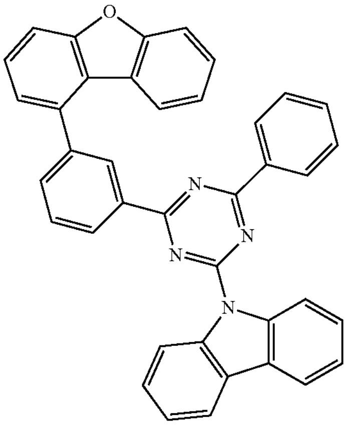
2-78
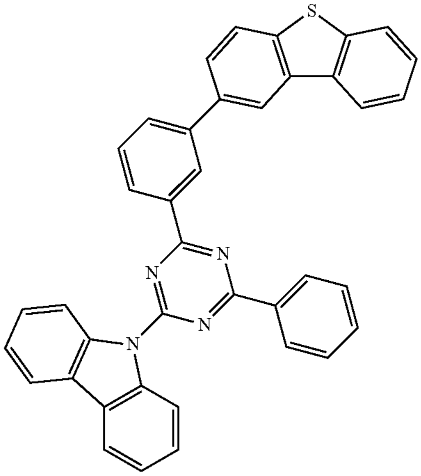
2-79
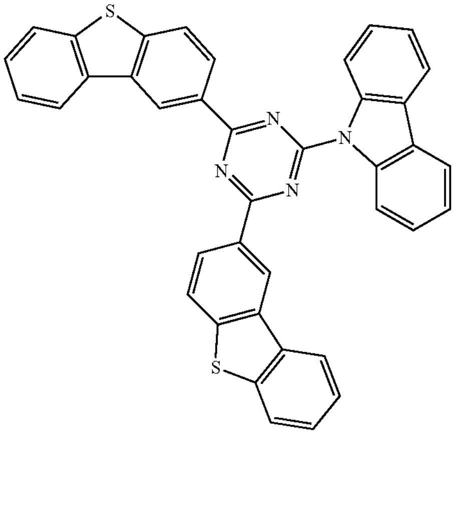
-continued
2-80
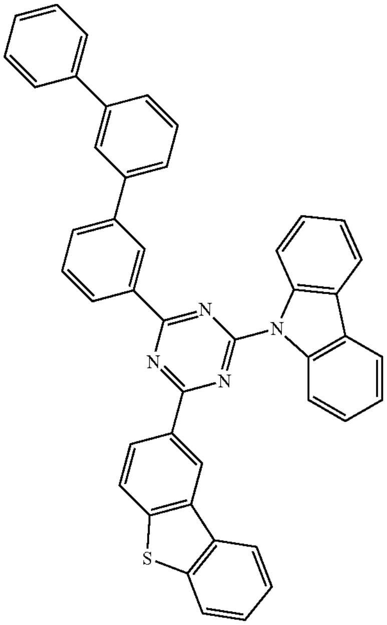
2-81
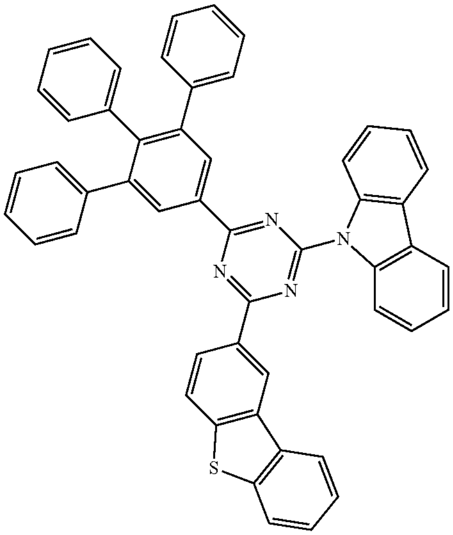
2-82
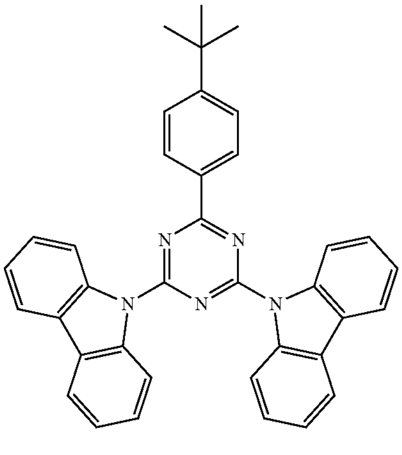

-continued

[C 36]

2-83

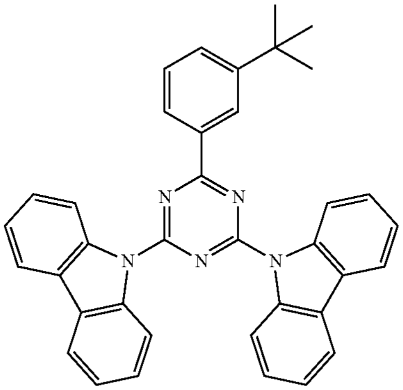

2-84

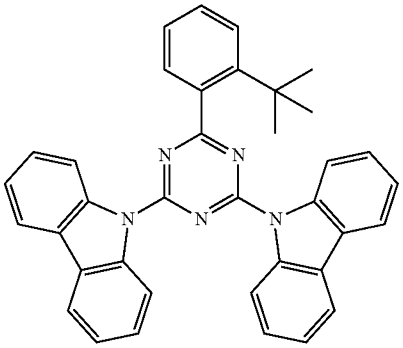

2-85

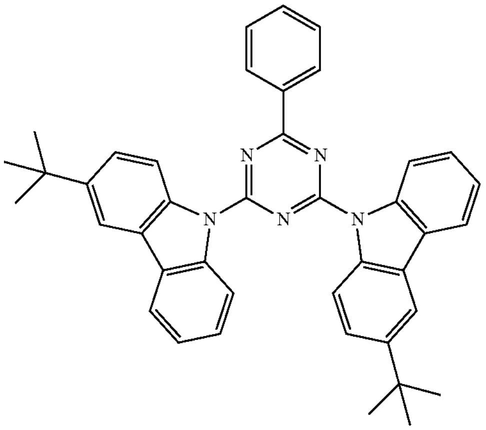

2-86

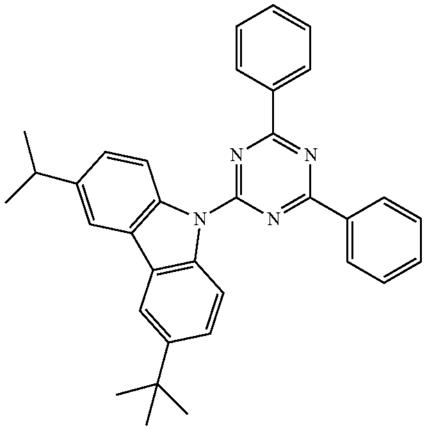

-continued 2-87

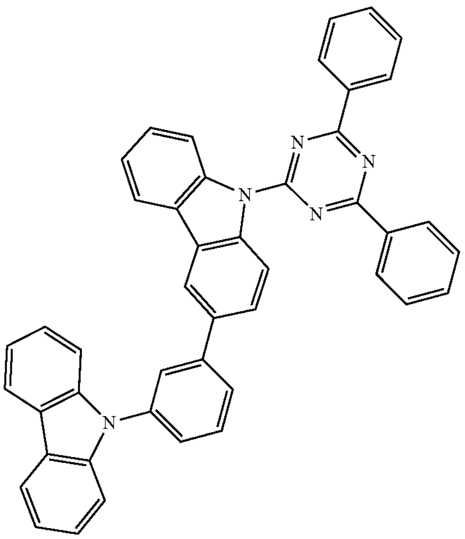

The light emitting dopant used in the organic EL of the present invention is a polycyclic aromatic compound represented by the aforementioned general formula (3) or a polycyclic aromatic compound having a structure represented by the general formula (3) as a substructure (also referred to as a substructured polycyclic aromatic compound).

The substructured polycyclic aromatic compound is preferably the substructured polycyclic aromatic compound represented by the aforementioned general formula (4), and more preferably the boron-containing substructured polycyclic aromatic compound represented by the aforementioned formula (5).

The substructured polycyclic aromatic compound represented by the general formula (4) above or formula (5) above can be regarded as a condensate of the compound represented by the general formula (3) or analogues thereto.

In the general formula (3) and the general formula (4), the C ring, the D ring, the E ring, the F ring, the G ring, the H ring, the I ring, and the J ring are each independently an aromatic hydrocarbon ring having 6 to 24 carbon atoms, or an aromatic heterocyclic ring having 3 to 17 carbon atoms, and they each preferably denote an aromatic hydrocarbon ring having 6 to 20 carbon atoms or an aromatic heterocyclic ring having 3 to 15 carbon atoms. Since the C ring to J ring are aromatic hydrocarbon rings or aromatic heterocyclic rings as described above, they are therefore also referred to as aromatic rings.

Specific examples of the aforementioned aromatic ring include rings of benzene, naphthalene, acenaphthene, acenaphthylene, azulene, anthracene, chrysene, pyrene, phenanthrene, triphenylene, fluorene, benzo[a]anthracene, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzisothiazole, benzothiadiazole, purine, pyranone, coumarin, isocoumarin, chromone, dibenzofuran, dibenzothiophene, dibenzoselenophene, and carbazole. The aromatic ring is more preferably a benzene ring, a naphthalene ring, an anthracene ring, a triphenylene ring, a phenanthrene ring, a pyrene ring, a pyridine ring, a dibenzofuran ring, a dibenzothiophene ring, or a carbazole ring.

In the general formula (3), $Y^4$ is B, P, P═O, P═S, Al, Ga, As, Si—$R^4$ or Ge—$R^5$, preferably B, P, P═O or P═S, and more preferably B.

$R^4$ and $R^5$ independently represent an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms. $R^4$ and $R^5$ are each preferably an aliphatic hydrocarbon group having 1 to 8 carbon atoms, a substituted or unsubstituted aromatic hydrocarbon group having 6 to 12 carbon atoms, or a substituted or unsubstituted aromatic heterocyclic group having 3 to 15 carbon atoms. $R^4$ and $R^5$ are each more preferably a substituted or unsubstituted aromatic hydrocarbon group having 6 to 10 carbon atoms, or a substituted or unsubstituted aromatic heterocyclic group having 3 to 12 carbon atoms.

When $R^4$ and $R^5$ are each an aliphatic hydrocarbon groups having 1 to 10 carbon atoms, a substituted or unsubstituted aromatic hydrocarbon groups having 6 to 18 carbon atoms, or a substituted or unsubstituted aromatic heterocyclic groups having 3 to 17 carbon atoms, specific examples thereof are the same as described for $R^1$ in the general formula (1).

$X^4$ is each independently O, N—$Ar^4$, S or Se, preferably 0, N—$Ar^4$ or S, and more preferably O or N—$Ar^4$.

$Ar^4$ is independently a substituted or unsubstituted aromatic hydrocarbon group having 6 to 18 carbon atoms, a substituted or unsubstituted aromatic heterocyclic group having 3 to 17 carbon atoms, or a linked aromatic group by linking 2 to 8 thereof. $Ar^4$ is preferably a phenyl group, a biphenyl group, or a terphenyl group.

When $Ar^4$ is a substituted or unsubstituted aromatic hydrocarbon group having 6 to 18 carbon atoms, a substituted or unsubstituted aromatic heterocyclic group having 3 to 17 carbon atoms, or a linked aromatic group by linking 2 to 8 thereof, specific examples thereof are the same as described for $Ar^1$ in the general formula (1). However, the number of carbon atoms of the aromatic hydrocarbon group differs.

N—$Ar^4$ may be bonded to an aromatic ring selected from the C ring, the D ring, or the E ring to form a heterocyclic ring containing N. At least one hydrogen atom in the C ring, the D ring, the E ring, $R^4$, $R^{41}$, $R^{42}$, and $Ar^4$ may be replaced with a halogen or deuterium atom.

$R^3$ represents a substituent of the C ring, the D ring, and the E ring, and each independently represents a cyano group, deuterium, a diarylamino group having 12 to 44 carbon atoms, an arylheteroarylamino group having 12 to 44 carbon atoms, a diheteroarylamino group having 12 to 44 carbon atoms, an aliphatic hydrocarbon group having 1 to 10 carbon atoms, a substituted or unsubstituted aromatic hydrocarbon group having 6 to 18 carbon atoms, a substituted or unsubstituted aromatic heterocyclic group having 3 to 17 carbon atoms. $R^3$ is preferably a diarylamino group having 12 to 36 carbon atoms, an arylheteroarylamino group having 12 to 36 carbon atoms, a diheteroarylamino group having 12 to 36 carbon atoms, a substituted or unsubstituted aromatic hydrocarbon group having 6 to 12 carbon atoms, or a substituted or unsubstituted aromatic heterocyclic ring having 3 to 15 carbon atoms. $R^3$ is more preferably a diarylamino group having 12 to 24 carbon atoms, an arylheteroaryl group having 12 to 24 carbon atoms, a diheteroarylamino group having 12 to 24 carbon atoms, a substituted or unsubstituted aromatic hydrocarbon group having 6 to 10 carbon atoms, or a substituted or unsubstituted aromatic heterocyclic group having 3 to 12 carbon atoms.

When $R^3$ representing a diarylamino group having 12 to 44 carbon atoms, an arylheteroarylamino group having 12 to 44 carbon atoms, a diheteroarylamino group having 12 to 44 carbon atoms, or an aliphatic hydrocarbon group having 1 to 10 carbon atoms, specific examples thereof include diphenylamino, dibiphenylamino, phenylbiphenylamino, naphthylphenylamino, dinaphthylamino, dianthranylamino, diphenanthrenylamino, dipyrenylamino, dibenzofuranylphenylamino, dibenzofuranylbiphenylamino, dibenzofuranylnaphthylamino, dibenzofuranylanthranylamino, dibenzofuranylphenanthrenylamino, dibenzofuranylpyrenylamino, bis-dibenzofuranylamino, carbazolylphenylamino, carbazolylnaphthylamino, carbazolylanthranylamino, carbazolylphenanthrenylamino, carbazolylpyrenylamino, dicarbazolylamino, methyl, ethyl, propyl, butyl, pentyl, hexyl, heptyl, octyl, and nonyl. $R^3$ is preferably diphenylamino, dibiphenylamino, phenylbiphenylamino, naphthylphenylamino, dinaphthylamino, dianthranylamino, diphenanthrenylamino, or dipyrenylamino. $R^3$ is more preferably diphenylamino, dibiphenylamino, phenylbiphenylamino, naphthylphenylamino, dinaphthylamino, dibenzofuranylphenylamino, or carbazolylphenylamino.

v each independently represents an integer of 0 to 4, preferably an integer of 0 to 2, and more preferably of 0 to 1. x represents an integer of 0 to 3, preferably an integer of 0 to 2, and more preferably of 0 to 1.

The aforementioned substructured polycyclic aromatic compound may be that represented by the general formula (4) or formula (5) above.

In the general formula (3), the general formula (4) and formula (5), the common symbols have the same meaning.

In the general formula (4), w represents an integer of 0 to 4, y represents an integer of 0 to 3, and z represents an integer of 0 to 2. In formula (5), m and n represent integers of 0 to 4, o and p represent integers of 0 to 3, and q represents an integer of 0 to 2. Preferably w, y, z, m, and n are independently 0 or 1.

In the general formula (4), the F ring to the J ring are as described above.

The F ring and the G ring have the same meaning as the C ring and D ring in the general formula (3), and the H ring and the J ring have the same meaning as the E ring, and the I ring is a tetravalent group (when z=0) because it has a shared structure.

In formula (5), $X^9$ independently represents N—$Ar^6$, O or S, and at least one $X^9$ represents N—$Ar^6$. $Ar^6$ has the same meaning as $Ar^4$ in the general formula (3). N—$Ar^6$ may be bonded with the aforementioned aromatic ring to form a heterocyclic ring containing N.

$R^9$ independently represents a cyano group, deuterium, a diarylamino group having 12 to 44 carbon atoms, an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms.

Specific examples thereof are the same as those described for $R^3$.

The substructured polycyclic aromatic compound will be described below with reference to the general formula (4) and formula (5).

The general formula (4) is composed of the structure represented by the general formula (3) and the portion of the structure thereof. From another point of view, the general formula (4) includes two structures represented by the general formula (3), and they share the I ring. Namely, the general formula (4) includes the structure represented by the general formula (3) as a substructure.

Formula (5) is similar to the above, and specifically, it can be understood that the formula (5) is composed of the structure represented by the general formula (3) and the portion of the structure thereof with the central benzene ring shared.

The substructured polycyclic aromatic compound as used in the present invention has the structure represented by the general formula (3) as a substructure. The compound suitably has a structure lacking in any of the rings from the C ring to the E ring in the general formula (3) as another substructure. Then, the compound preferably has the structure represented by the general formula (3) as one substructure and one to three above-described other substructures. The bond between the structure represented by the general formula (3) and the other substructure may be a bond by condensation or formation of one or more rings, or a bond by one or more atomic bonds.

The preferred example of the aforementioned general formula (3), the general formula (4) or formula (5), or the substructured polycyclic aromatic compound are formulae (4-a) to (4-h) below.

[C 37]

(4-a)

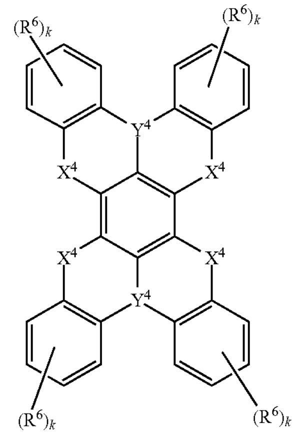

(4-b)

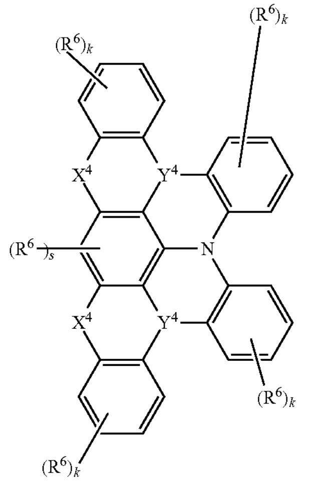

-continued (4-c)

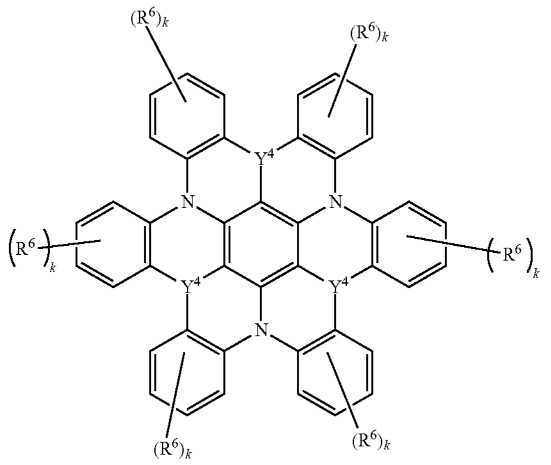

(4-d)

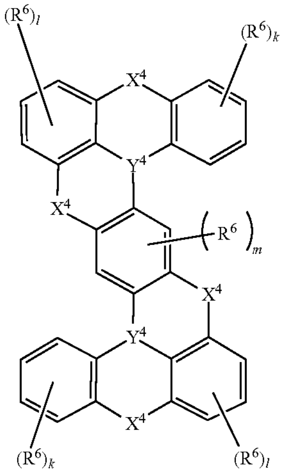

The substructured polycyclic aromatic compound represented by formula (4-a) above corresponds to, for example, such a compound represented by formula (3-64), which is described below. Namely, formula (4-a) has a structure in which two structures of general formula (3) share the central benzene ring, and it is understood that formula (4-a) represents a compound including a structural unit of the general formula (3) and one substructure thereof.

The substructured polycyclic aromatic compound represented by formula (4-b) corresponds to, for example, such a compound represented by formula (3-65) described below. Namely, formula (4-b) has a structure in which two structures of general formula (3) share the central benzene ring, and it is understood that formula (4-b) represents a compound including a structural unit of the general formula (3) and one substructure thereof. If explained in the general formula (3), the substructured polycyclic aromatic compound has a structure in which one of $X^4$ is N—$Ar^4$ bonded to another aromatic ring to form a ring (condensed ring structure).

The substructured polycyclic aromatic compound represented by formula (4-c) corresponds to, for example, such a compound represented by formula (3-66) described below. Namely, if explained in the general formula (3), the substructured polycyclic aromatic compound has a structure having the structural unit represented by three general formulae (3) so as to share the benzene ring as the E ring.

Namely, it is understood that formula (4-c) represents a compound having a structural unit represented by the general formula (3) and including two substructures each of which is a structure formed by removing one benzene ring from the compound of the general formula (3). In addition, $X^4$ is N—$Ar^4$ and bonded to another adjacent ring to form a ring in the structure.

[C 38]

(4-e)

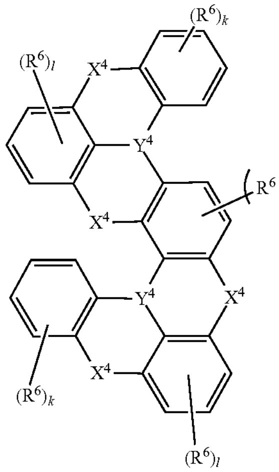

(4-f)

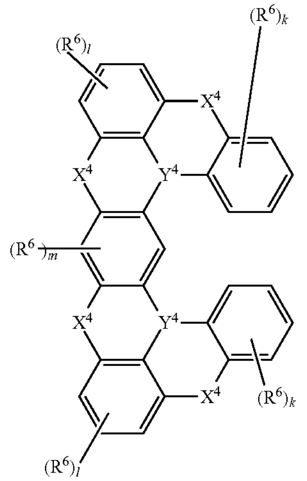

(4-g)

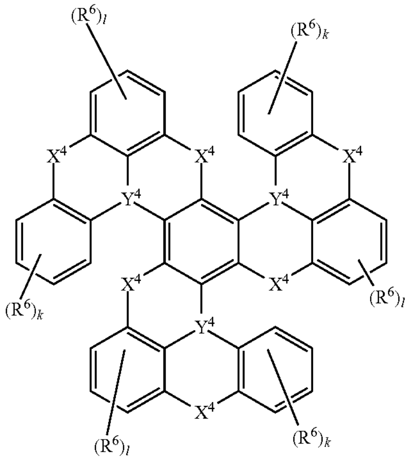

-continued (4-h)

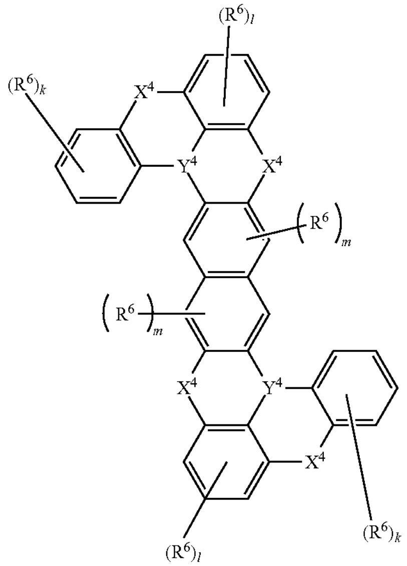

Further, the substructured polycyclic aromatic compounds represented by formula (4-d), formula (4-e), formula (4-f), and formula (4-g) correspond to, for example, such compounds represented by formula (3-67), formula (3-68), formula (3-69), and formula (3-70) described below.

Namely, they are each a compound having two or three unit structures represented by the general formula (3) in one compound so as to share the benzene ring as the C ring (or D ring). Namely, it is understood that they are each a compound having the unit structure represented by the general formula (3) as a substructure and include one substructure that is a structure formed by removing one benzene ring from the compound of the general formula (3).

The substructured polycyclic aromatic compound represented by formula (4-h) corresponds to, for example, such compounds represented by formula (3-71), formula (3-72), formula (3-73), formula (3-74), and formula (3-75) described below. Namely, if explained in the general formula (3), it is a substructured polycyclic aromatic compound having a naphthalene ring as the C ring and two unit structures represented by the general formula (3) in one compound so as to share the naphthalene ring. In other words, it is understood formula (4-h) represents a compound having the unit structure represented by the general formula (3) as a substructure and including one or two substructures each of which is a structure formed by removing one C ring (naphthalene ring) from the compound of the general formula (3).

In formulae (4-a) to (4-h), $X^4$ and $Y^4$ are as defined in the general formula (3), and $R^6$, k, l, and m have the same meaning as $R^9$, m, o, and q in formula (5). s is 0 to 1, preferably 0.

The substructured polycyclic aromatic compound of the present invention can be said to be a compound having a structure in which a plurality of compounds of the general formula (4) are linked by sharing one or two rings (the C ring to the E ring) in the structural unit of the general formula (4), the compound including at least one structural unit of the general formula (4).

The number of compounds of the general formula (4) forming the above structure is 2 to 5 and preferably 2 to 3.

The above sharing the rings (the C ring to the E ring) may be made on one, two, or even three rings.
Specific examples of the polycyclic aromatic compounds and the substructured polycyclic aromatic compounds represented by the general formula (3), the general formula (4) or formula (5) will be described below, but are not limited to these exemplified compounds.
[C 39]
3-1
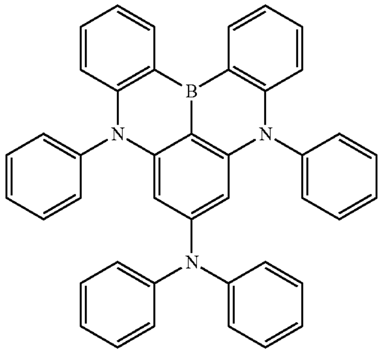
3-2
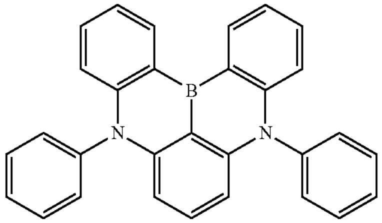
3-3
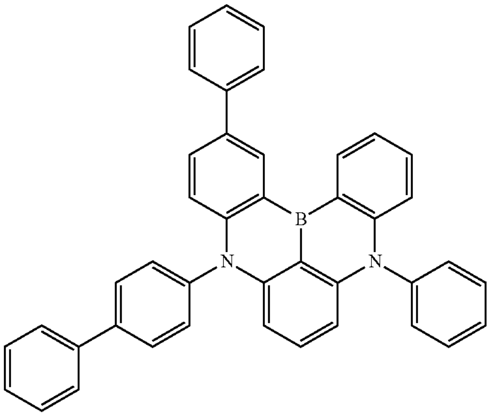
3-4
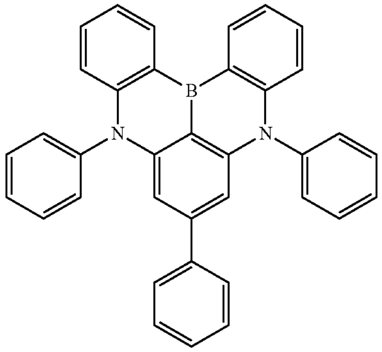
-continued
3-5
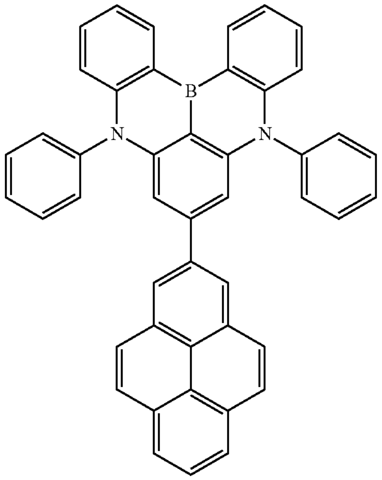
3-6
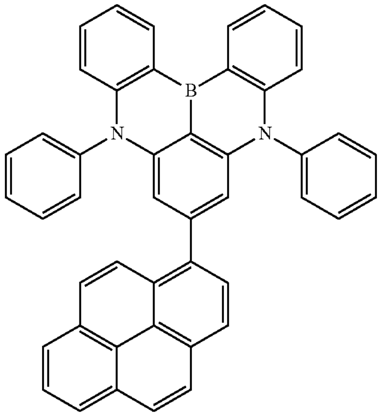
3-7
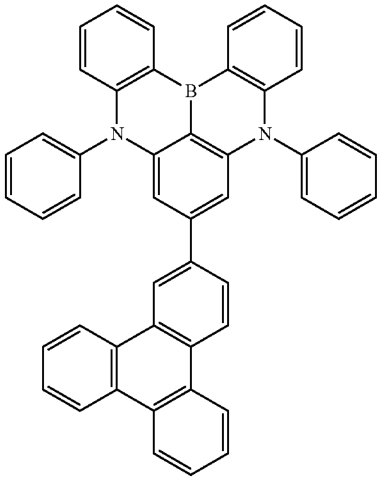

-continued
3-8
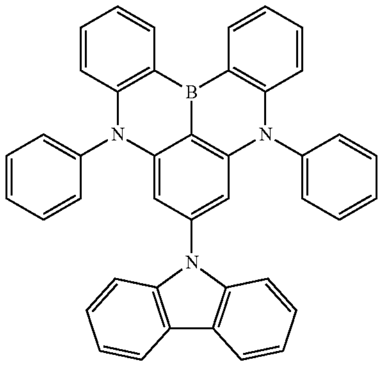
3-9
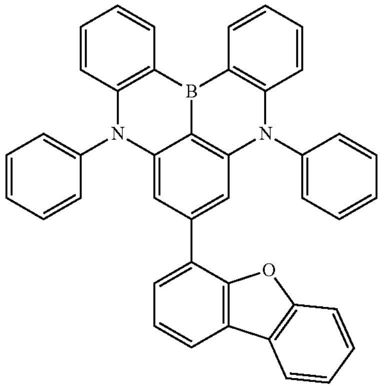
3-10
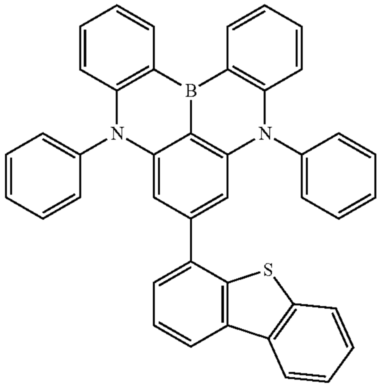
[C 40]
3-11
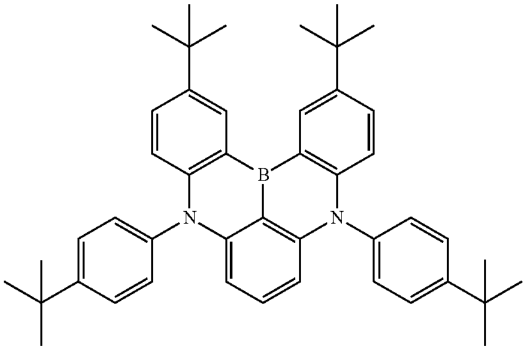
-continued
3-12
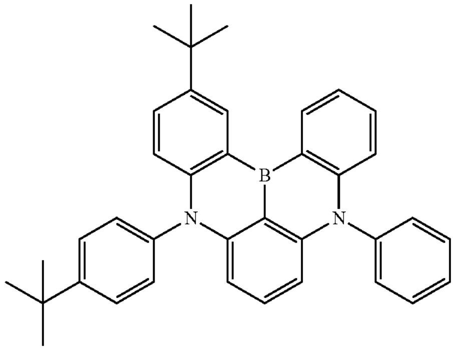
3-13
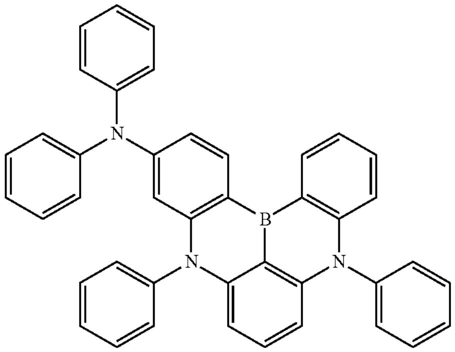
3-14
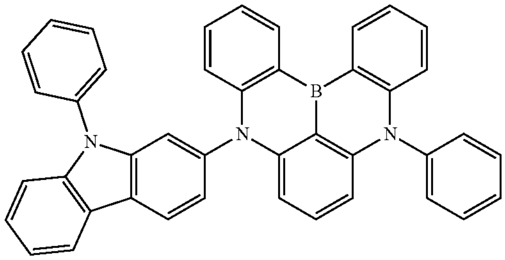
3-15
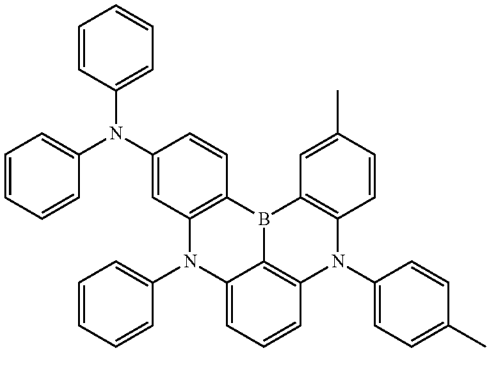

-continued
3-16
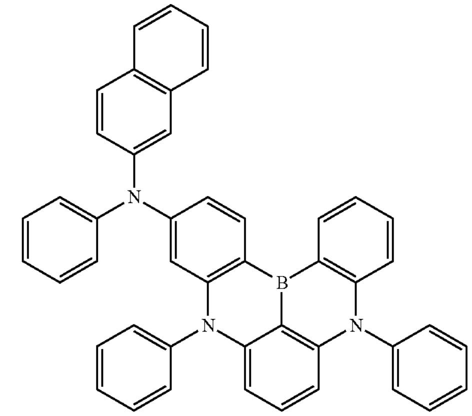
3-17
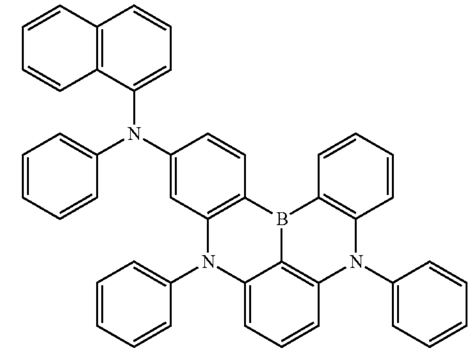
3-18
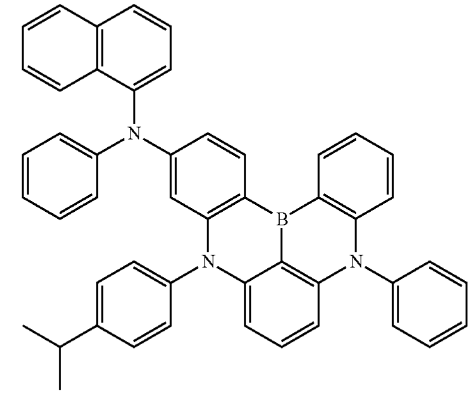
[C 41]
3-19
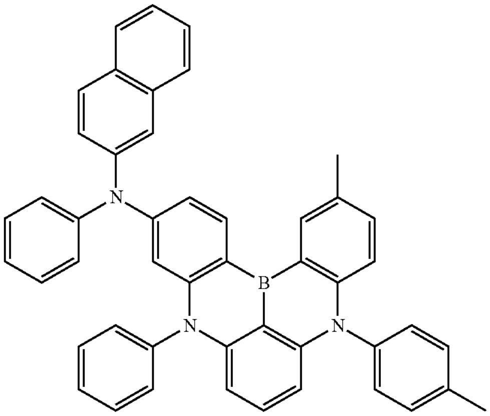
-continued
3-20
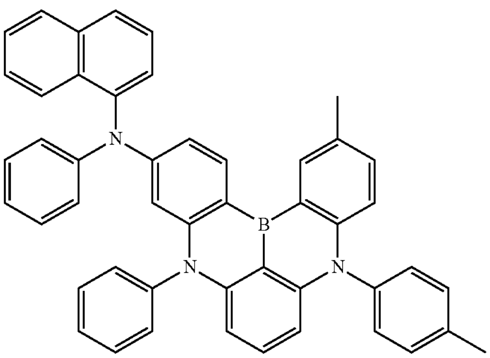
3-21
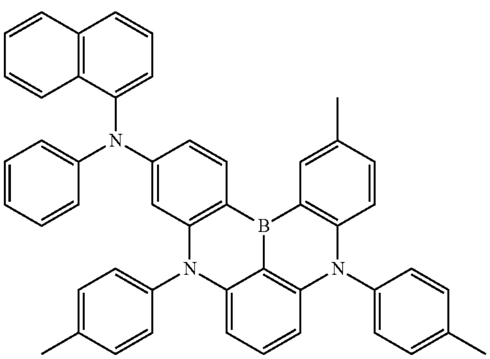
3-22
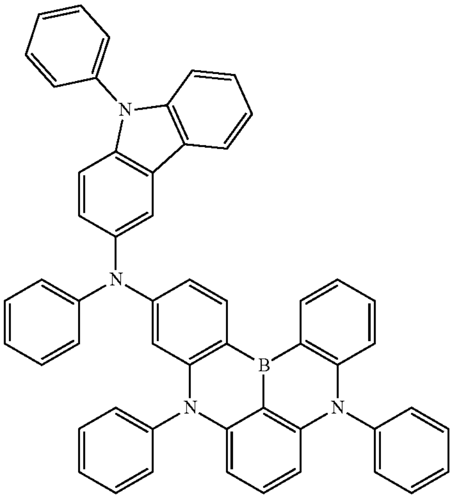

-continued
3-23
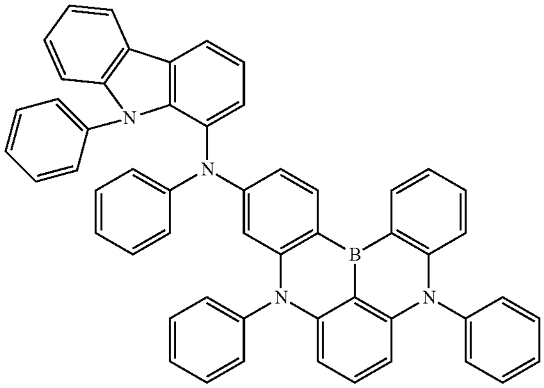
3-24
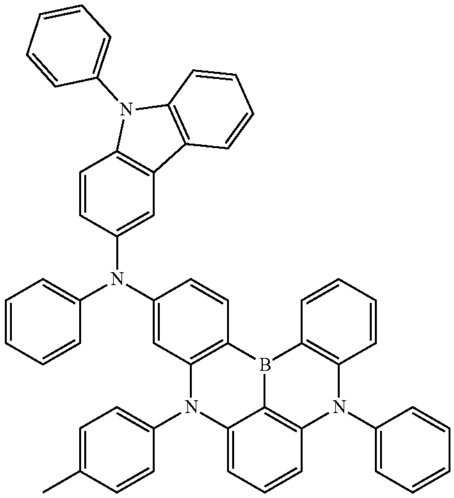
3-25
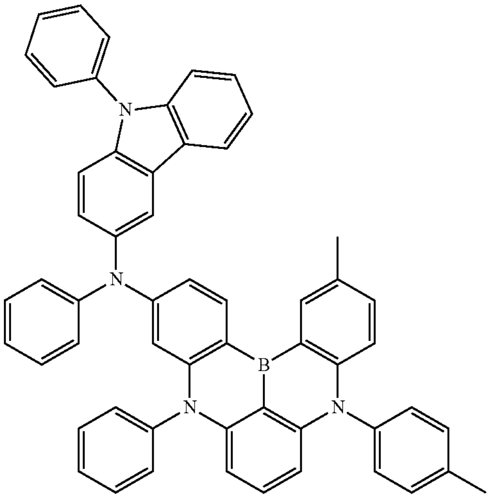
-continued
3-26
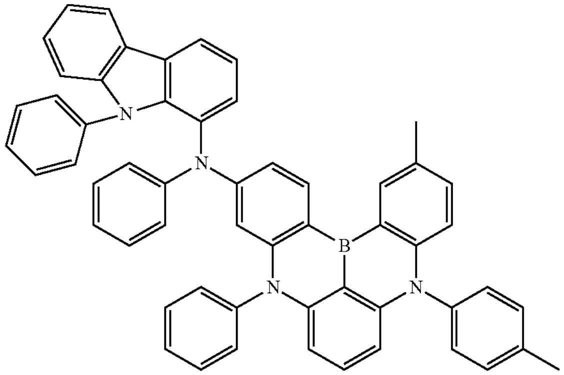
[C 42]
3-27
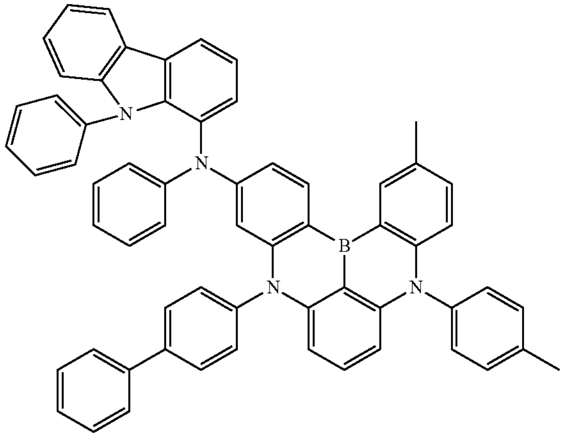
3-28
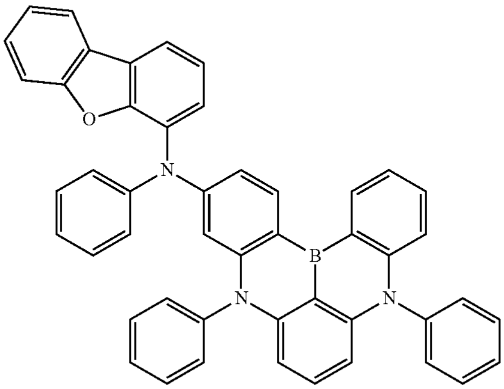

-continued
3-29
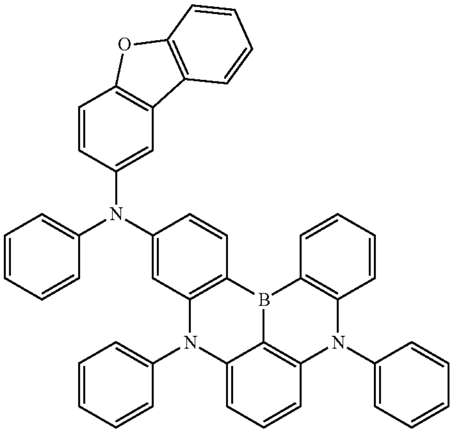
3-30
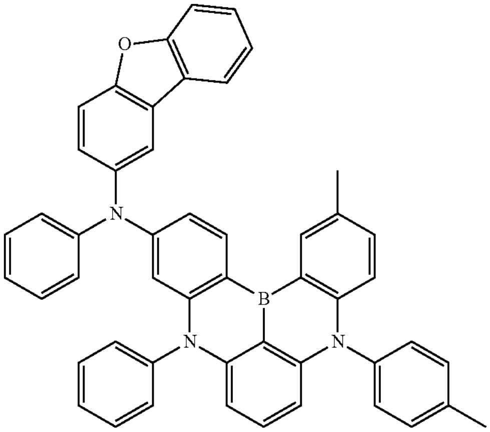
3-31
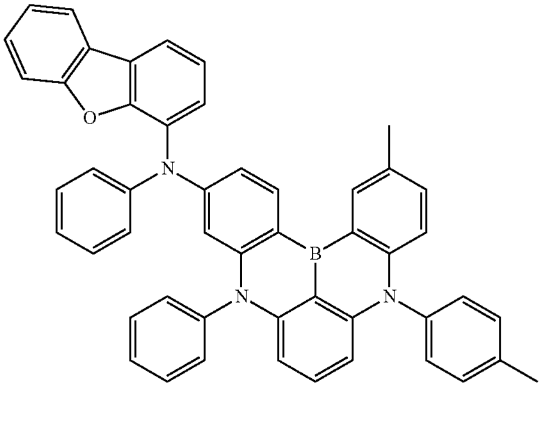
-continued
3-32
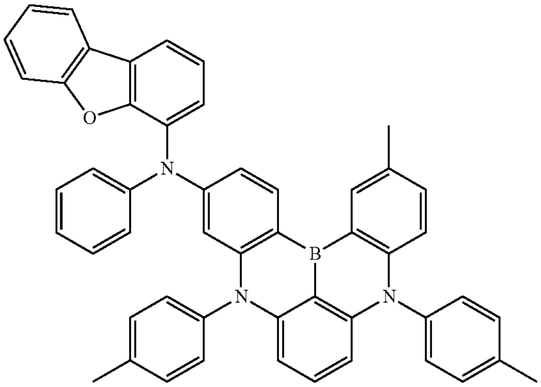
3-33
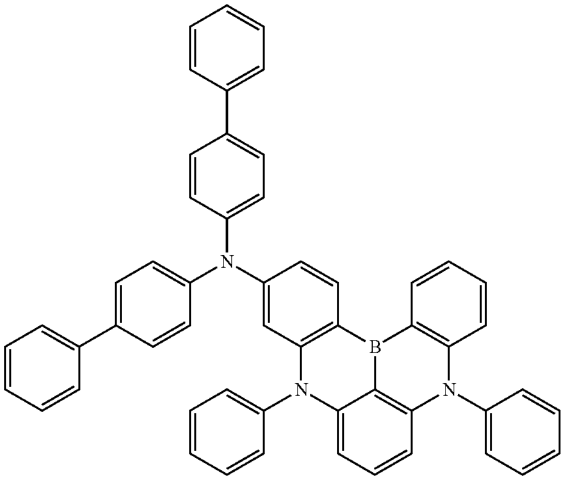
3-34
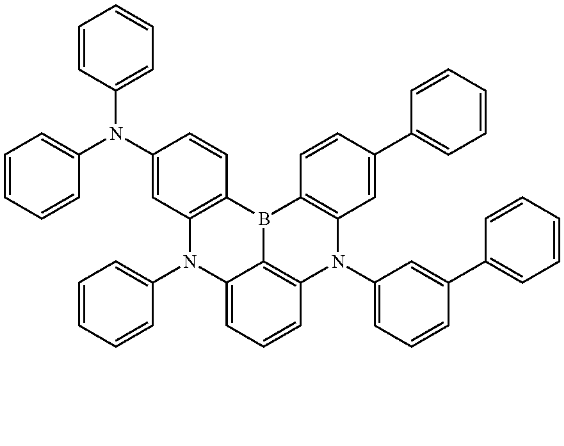

-continued
[C 43]
3-35
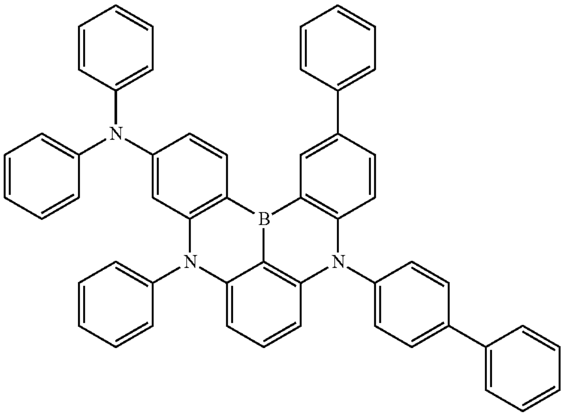
3-36
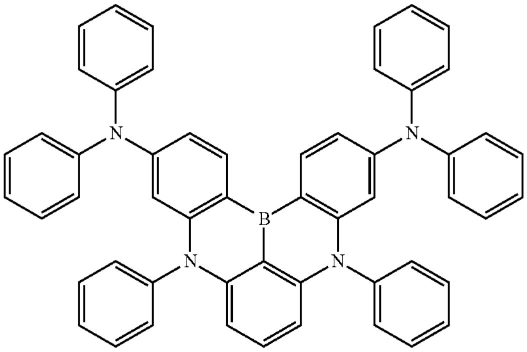
3-37
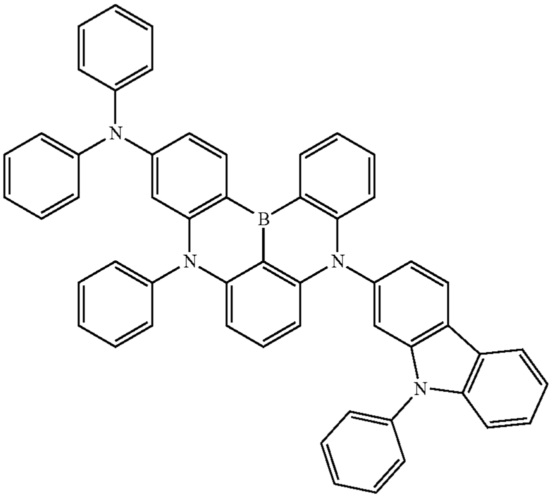
-continued
3-38
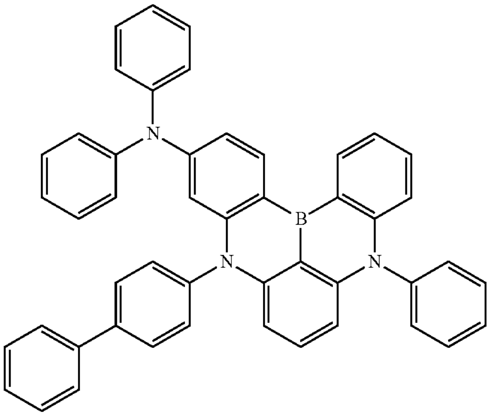
3-39
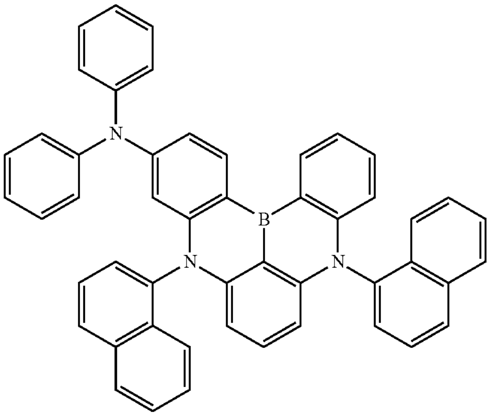
3-40
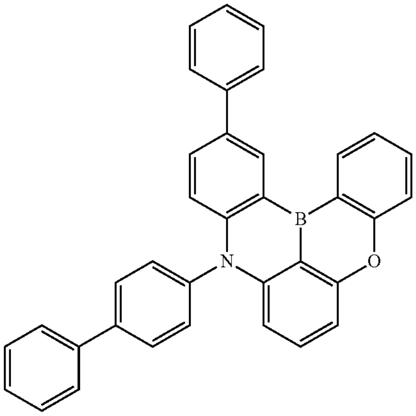

-continued
3-41
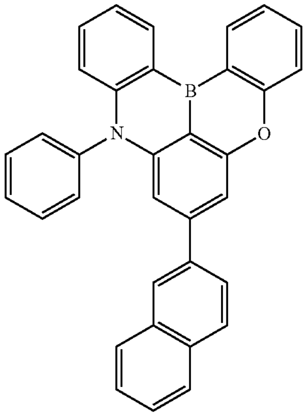
3-42
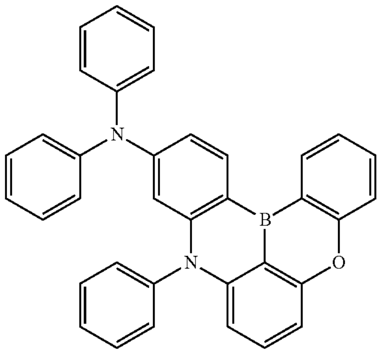
3-43
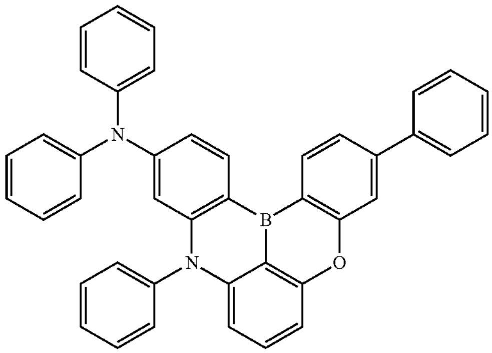
[C 44]
3-44
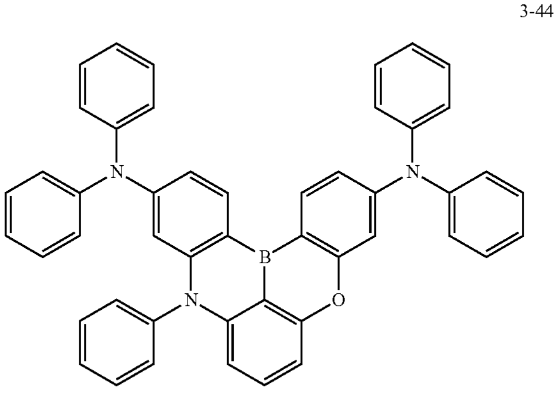
-continued
3-45
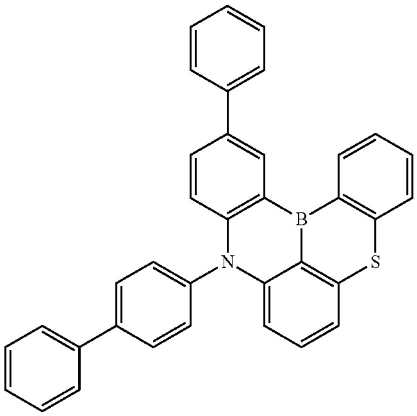
3-46
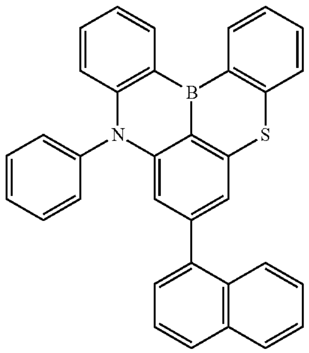
3-47
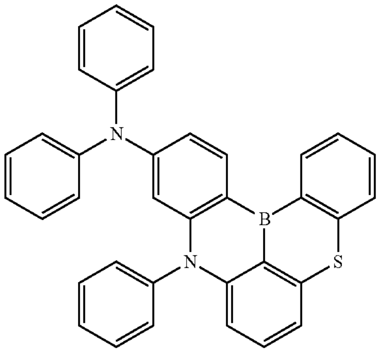
3-48
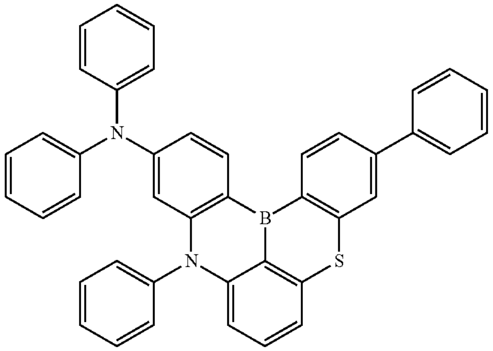

-continued
3-49
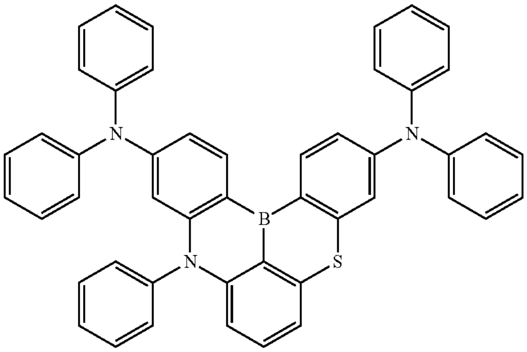
3-50
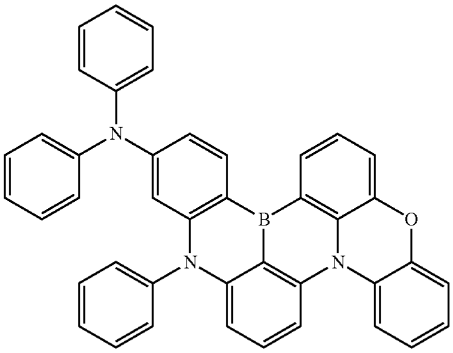
-continued
3-51
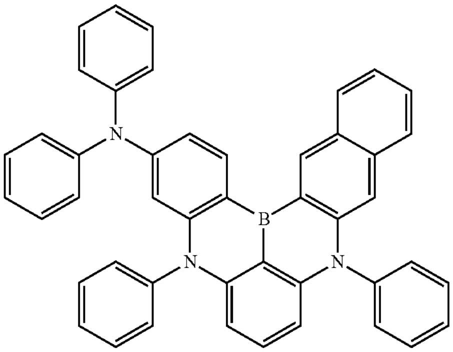
3-52
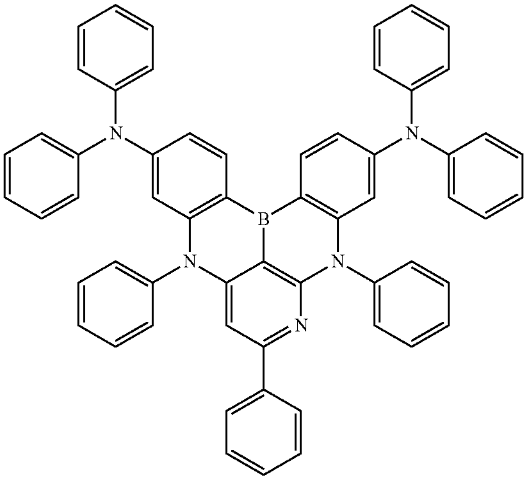
[C 45]
3-53
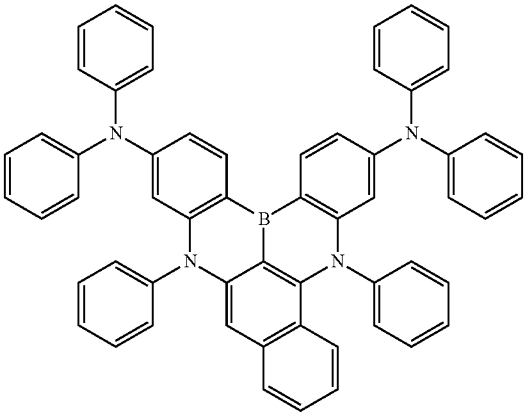
3-54
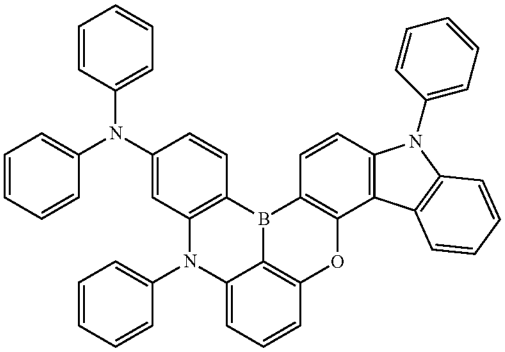

-continued
3-55
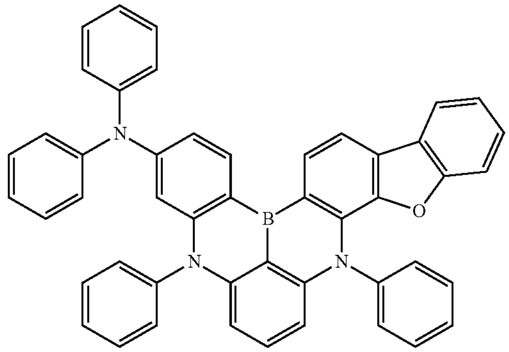
3-56
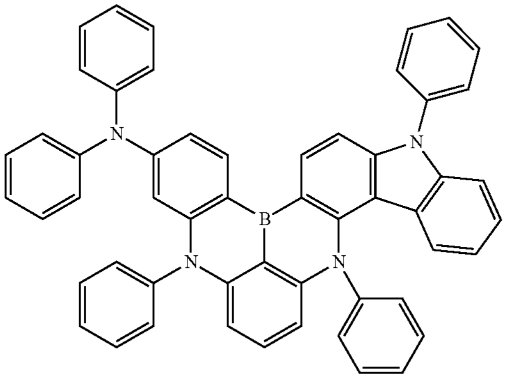
3-57
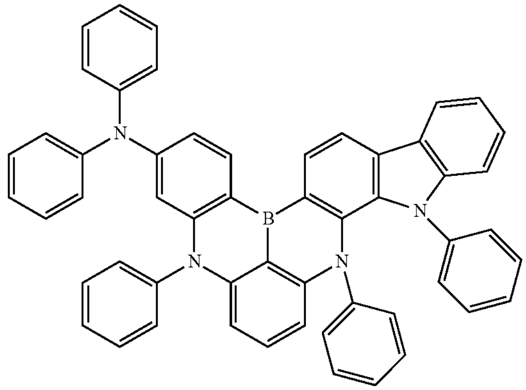
3-58
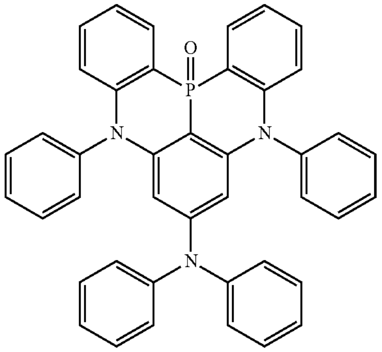
3-59
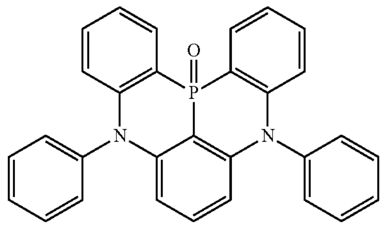
3-60
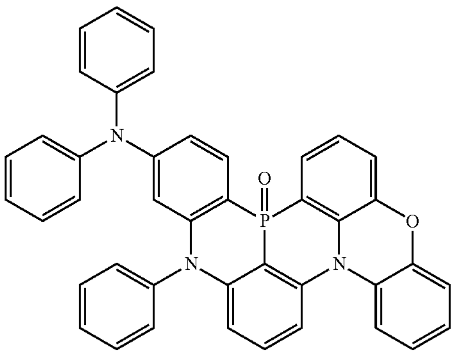
3-61
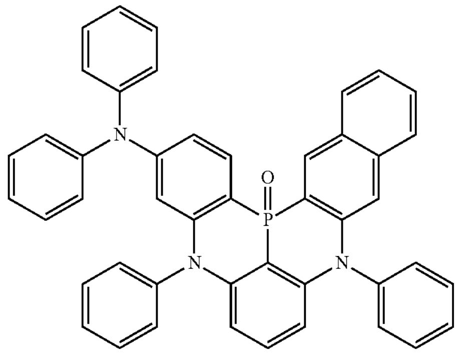
3-62
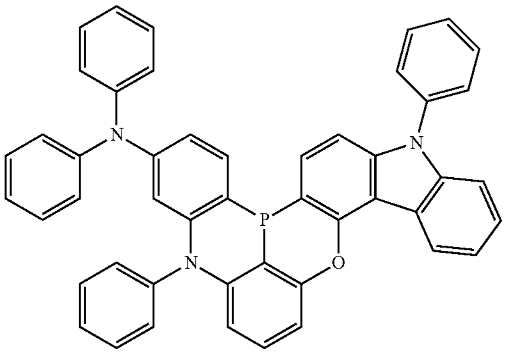

-continued
[C 46]
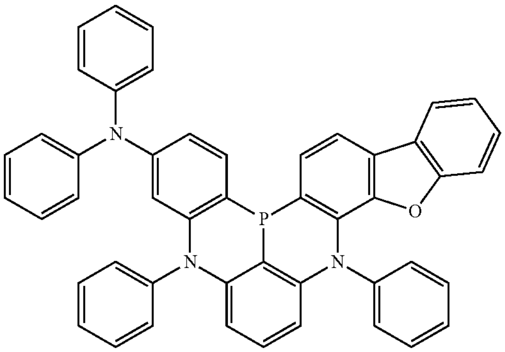
3-63
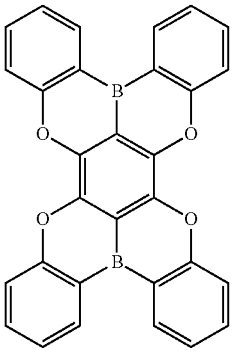
3-64
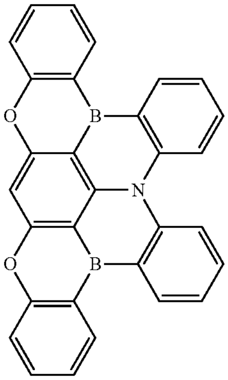
3-65
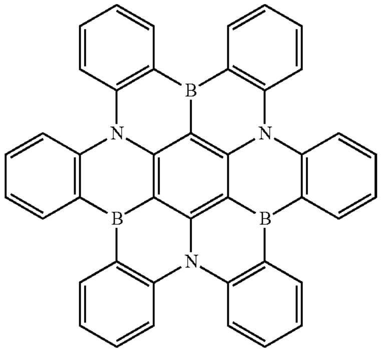
3-66
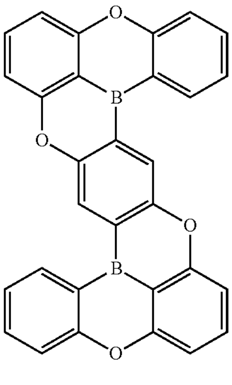
3-67
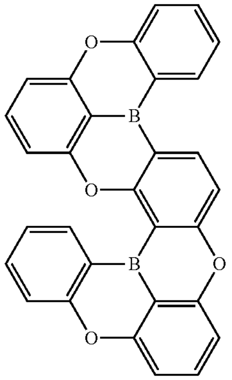
3-68
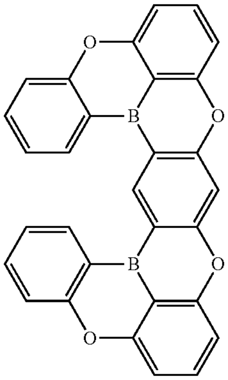
3-69
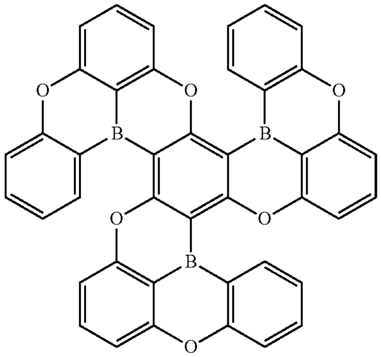
3-70

-continued
3-71
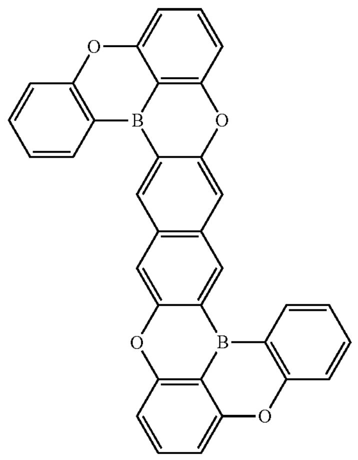
3-72
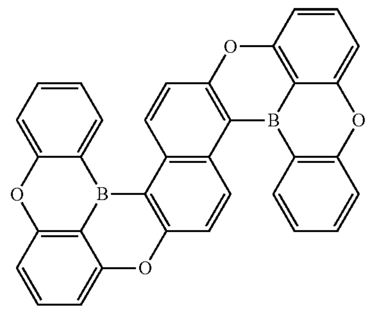
3-73
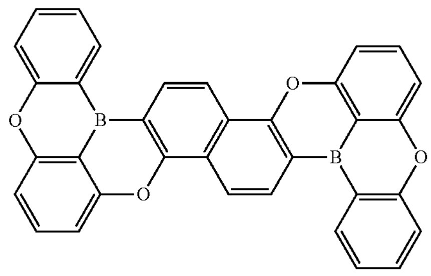
3-74
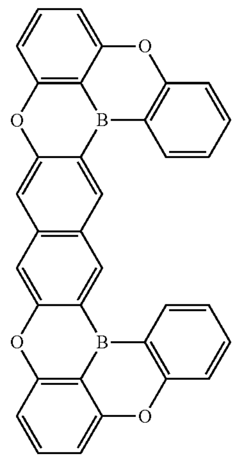
3-75
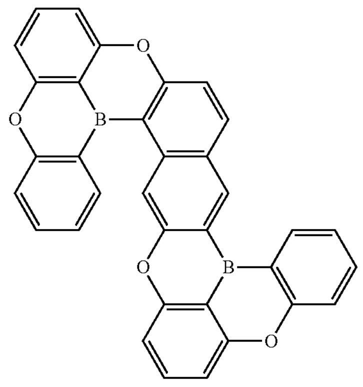

-continued
[C 47]
3-76
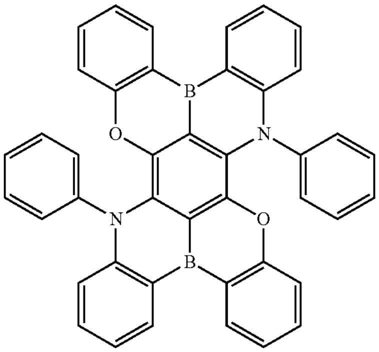
3-77
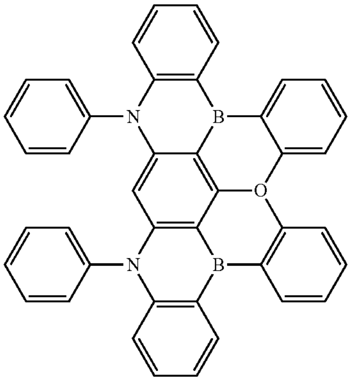
3-78
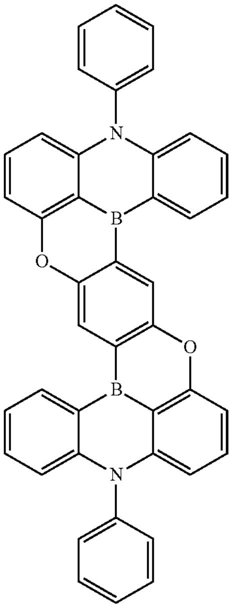
3-79
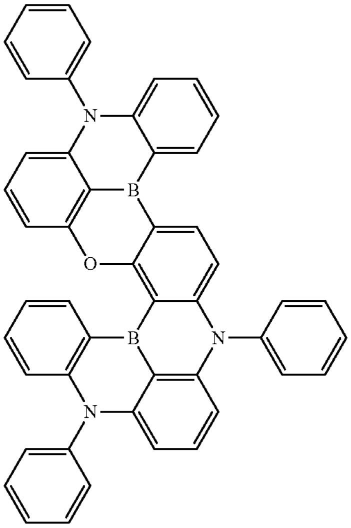
3-80
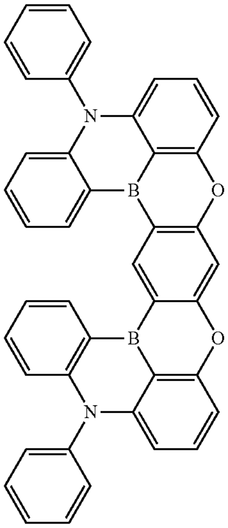
3-81
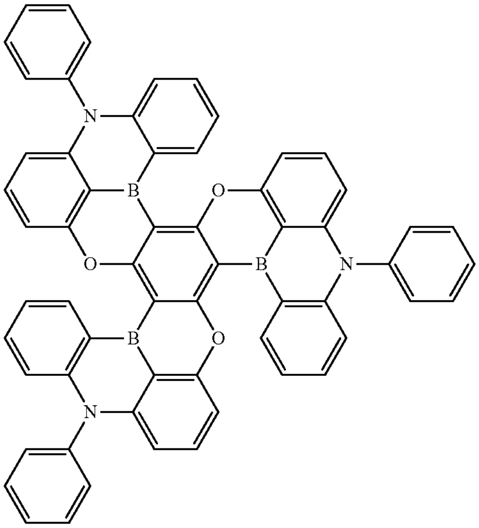

-continued
3-82
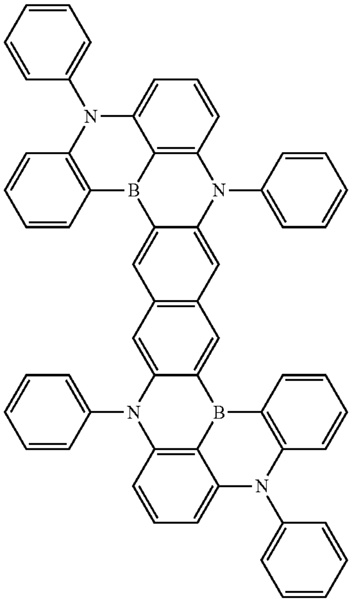
3-83
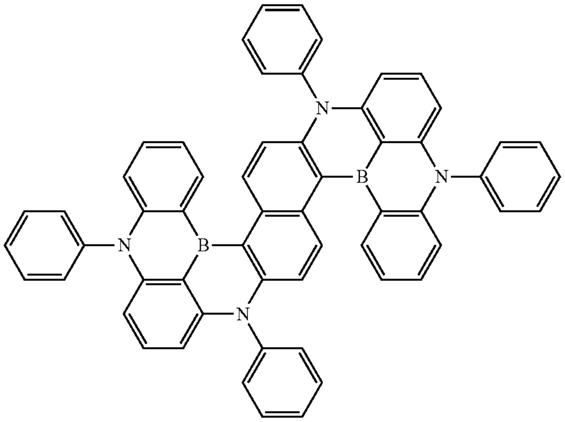
[C 48]
3-84
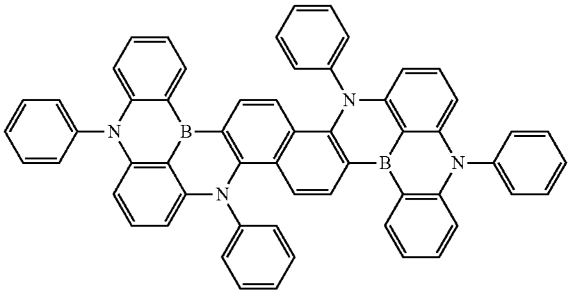
3-85
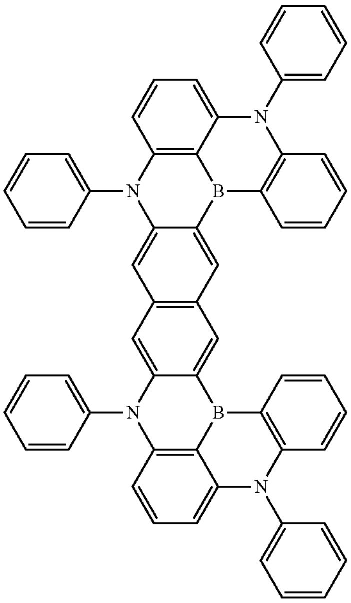

-continued
3-86
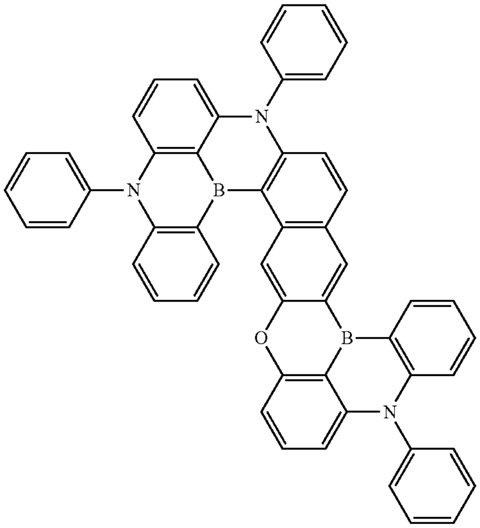
4-1
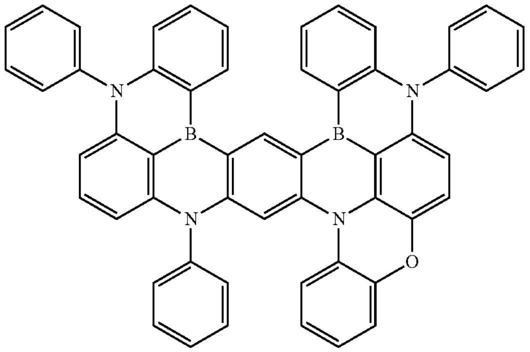
4-2
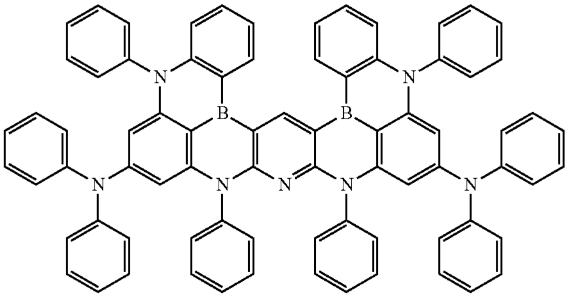
4-3
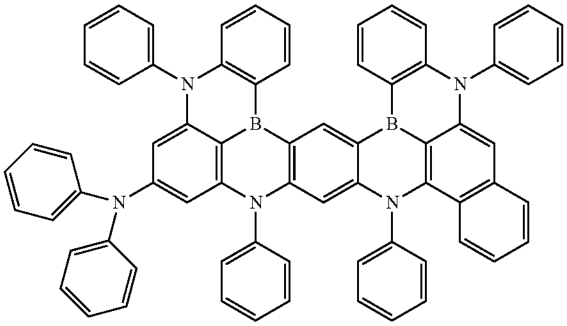
4-4
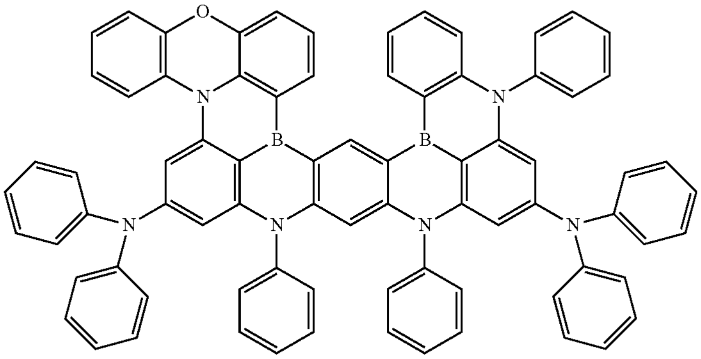

-continued
[C 49]
4-5
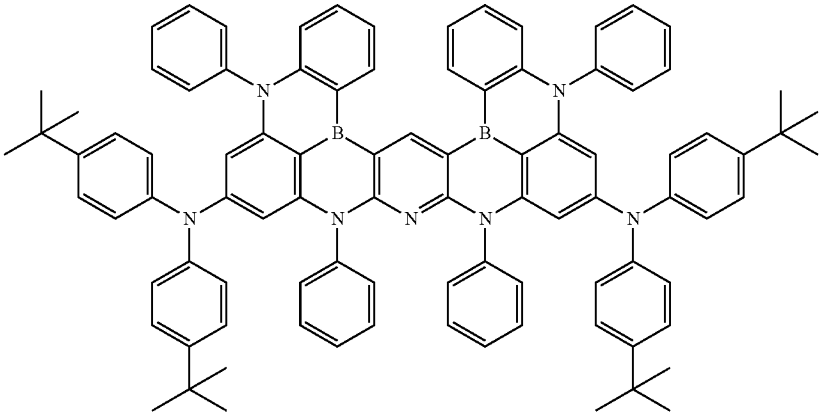
4-6
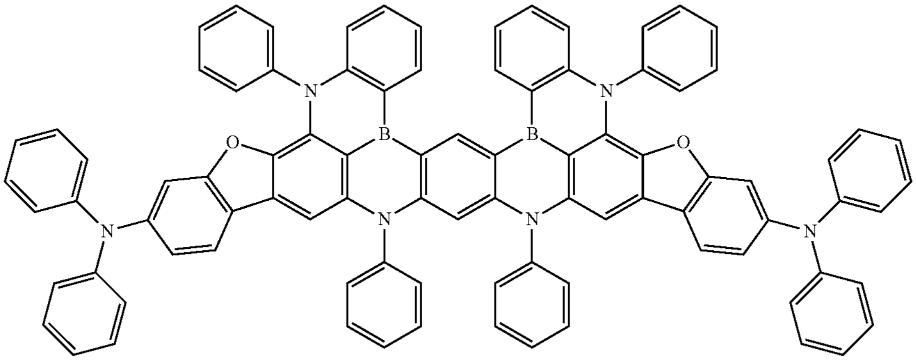
4-7
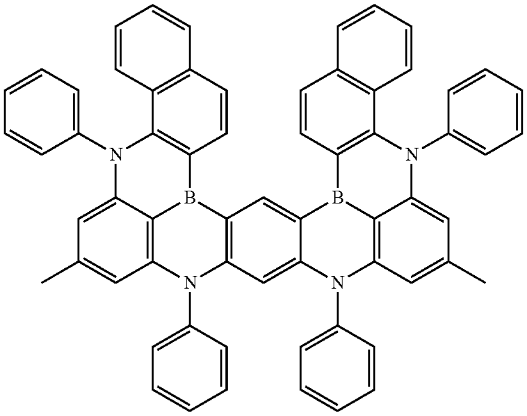
4-8
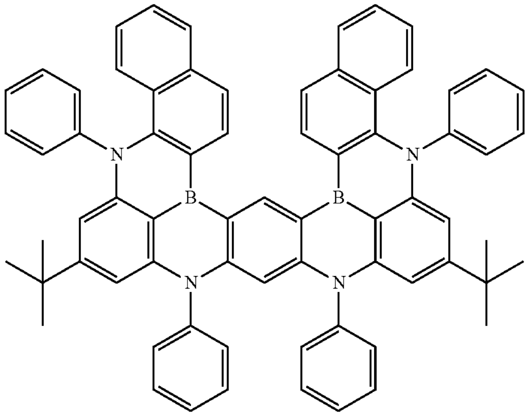
4-9
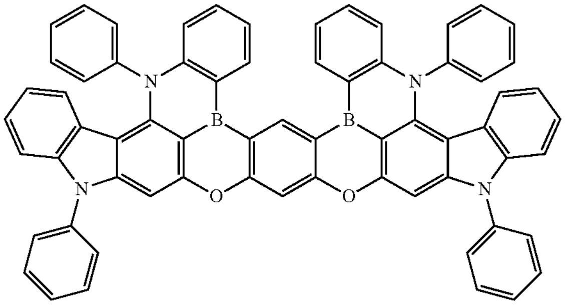
4-10
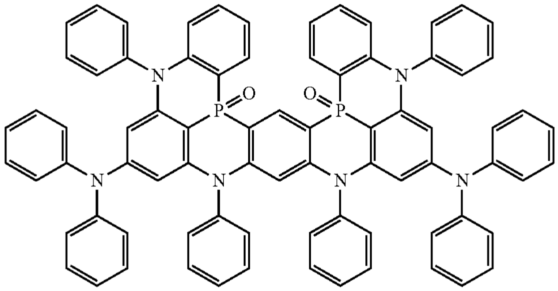

-continued
[C 50]
4-11
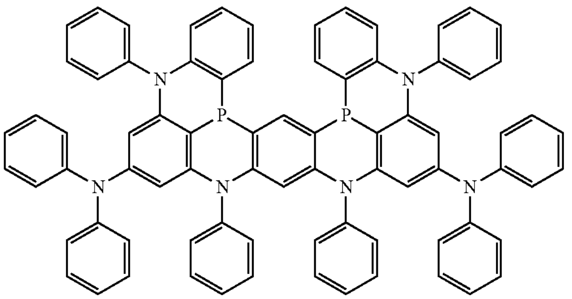
4-12
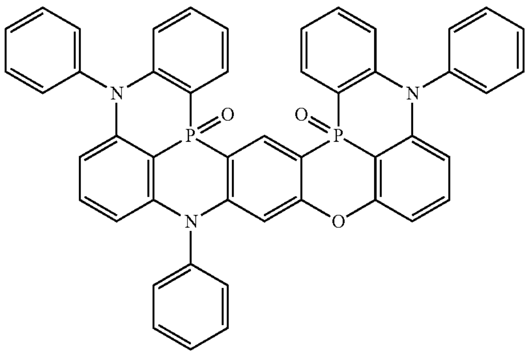
4-13
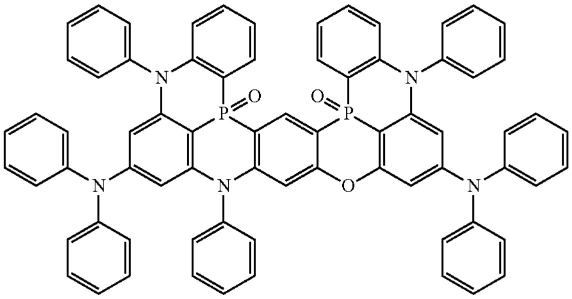
4-14
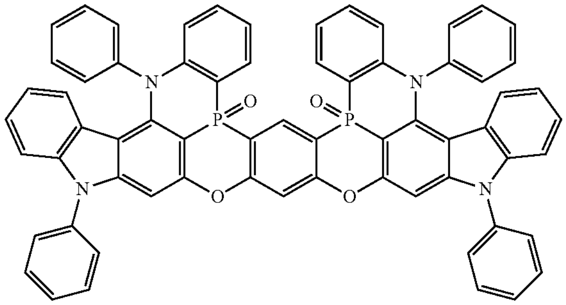
4-15
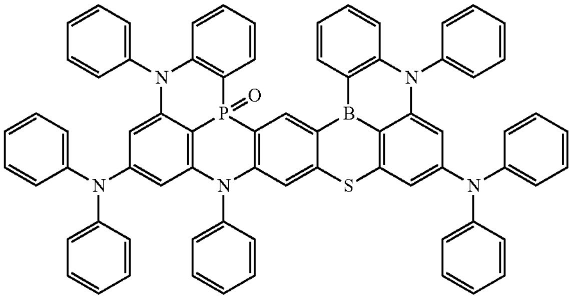
4-16
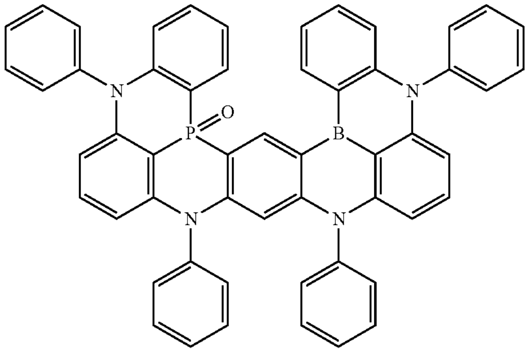
4-17
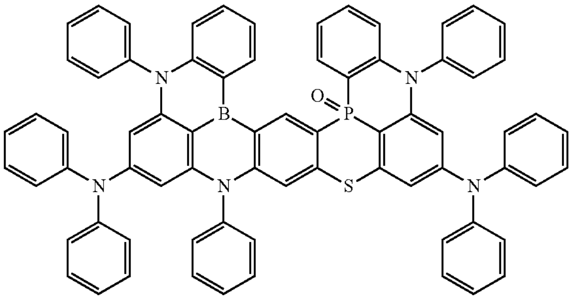
4-18
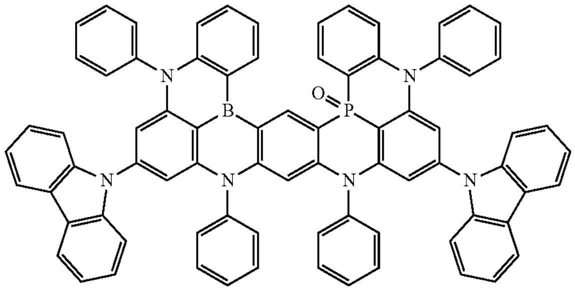

-continued
4-19
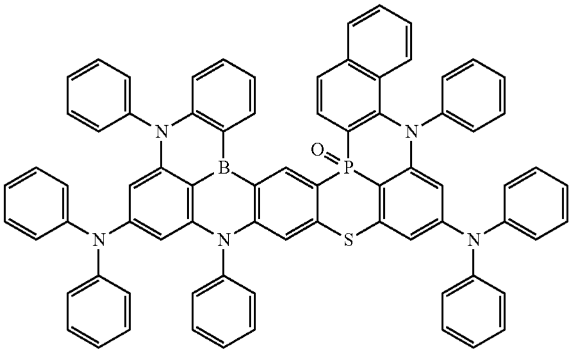
4-20
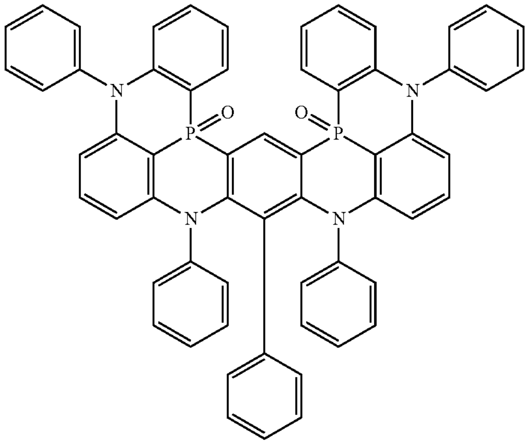
[C 51]
4-21
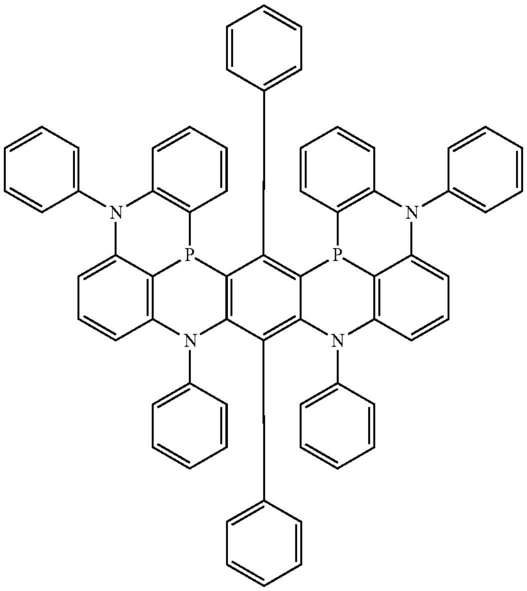
4-22
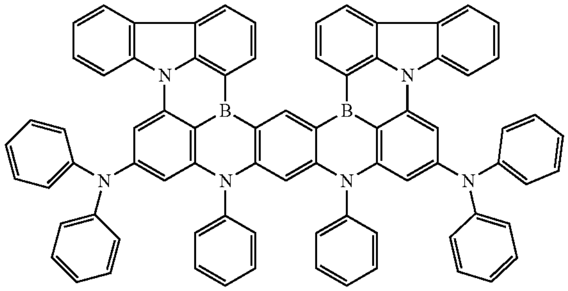
[C 52]
5-1
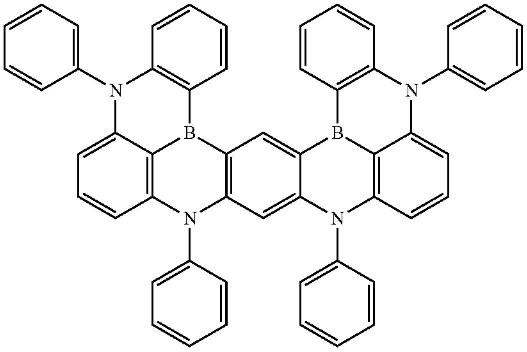
5-2
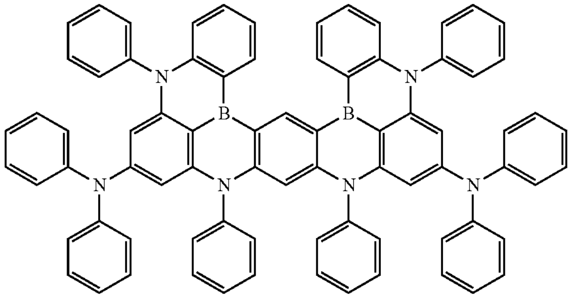

-continued
5-3
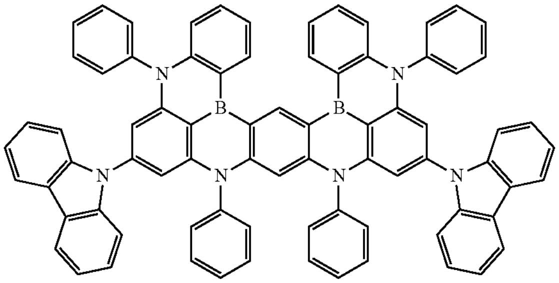
5-4
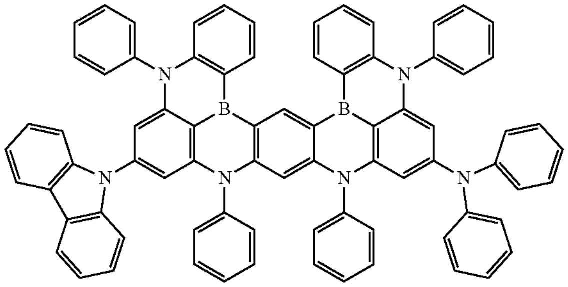
5-5
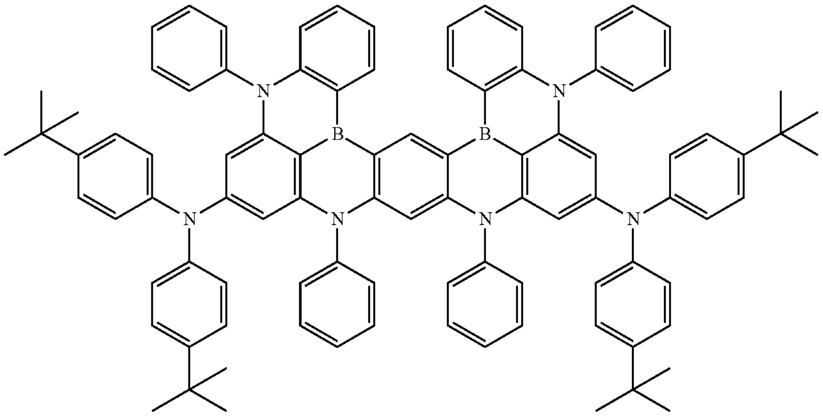
[C 53]
5-6
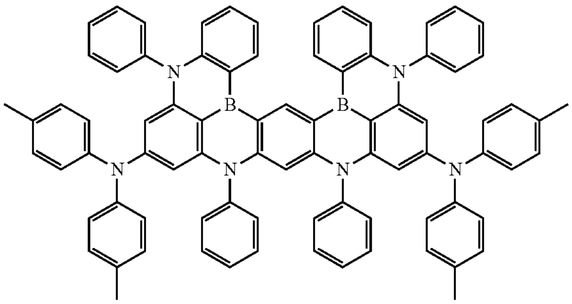
5-7
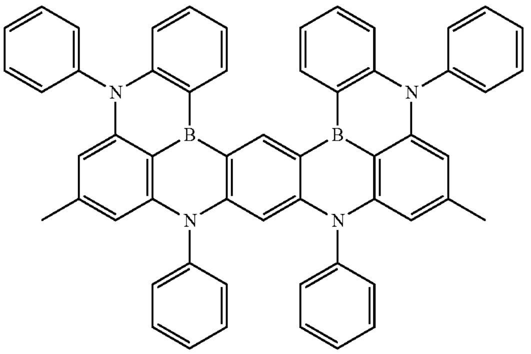
5-8
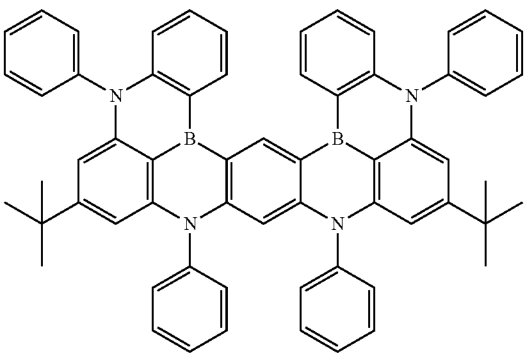
5-9
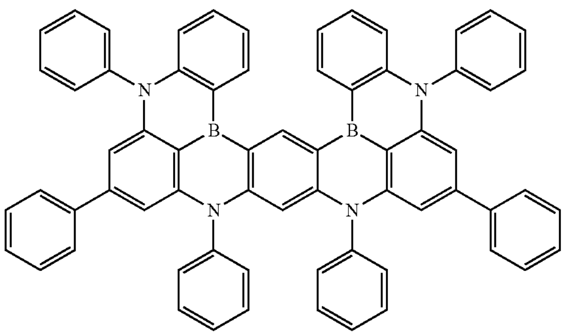

-continued
5-10
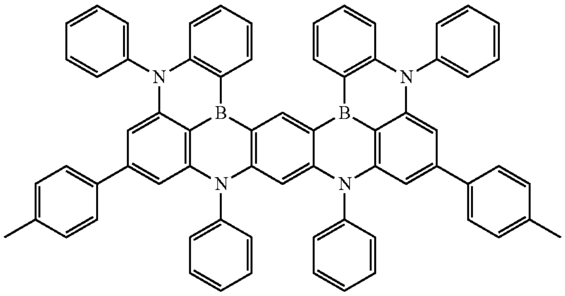
5-11
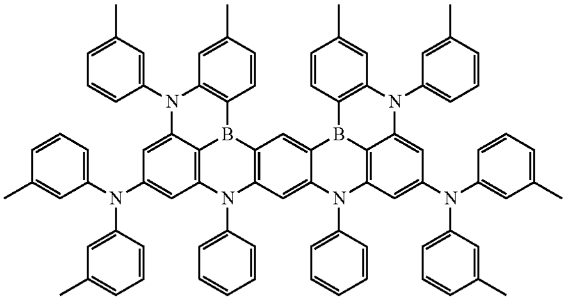
5-12
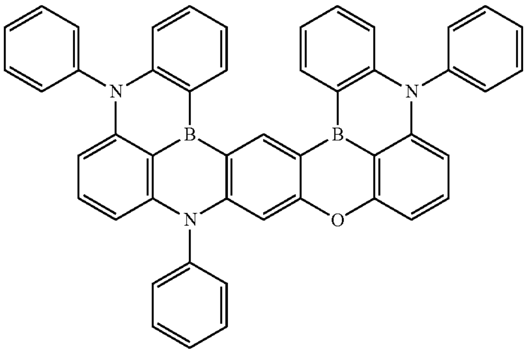
5-13
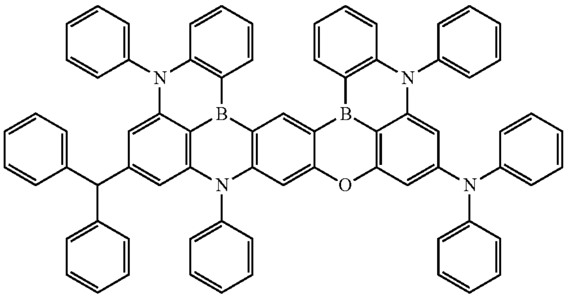
5-14
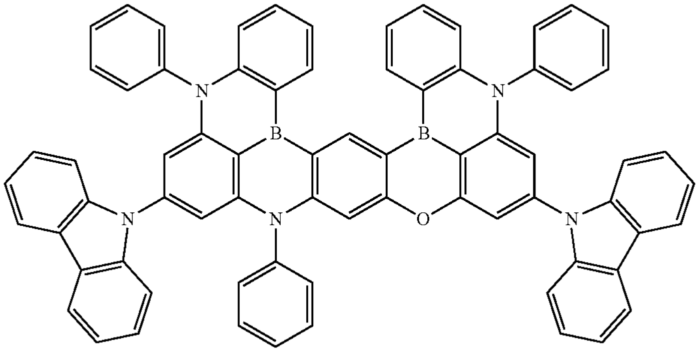
[C 54]
5-15
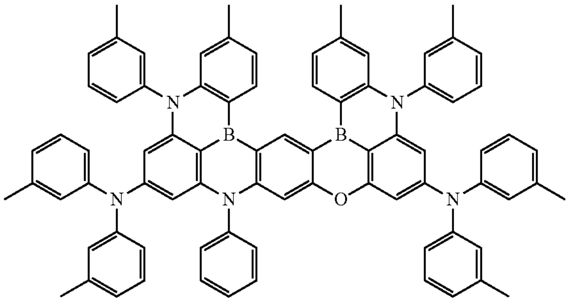
5-16
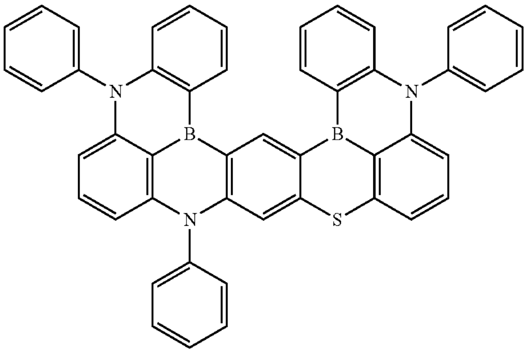

-continued 5-17

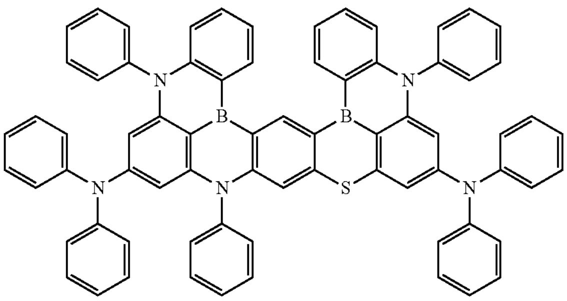

5-18

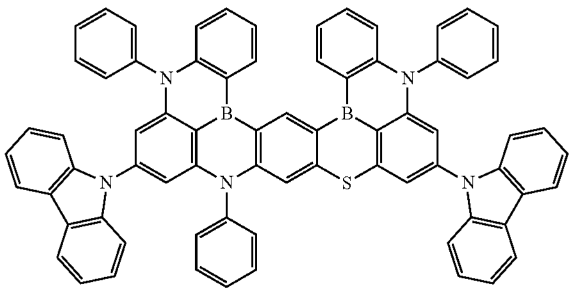

5-19

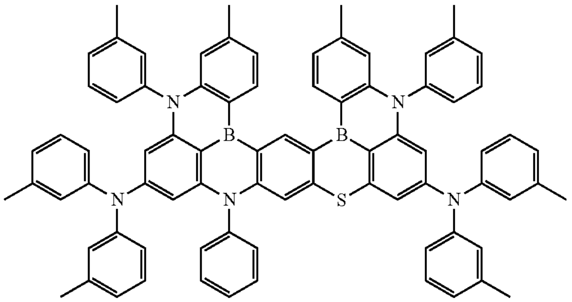

5-20

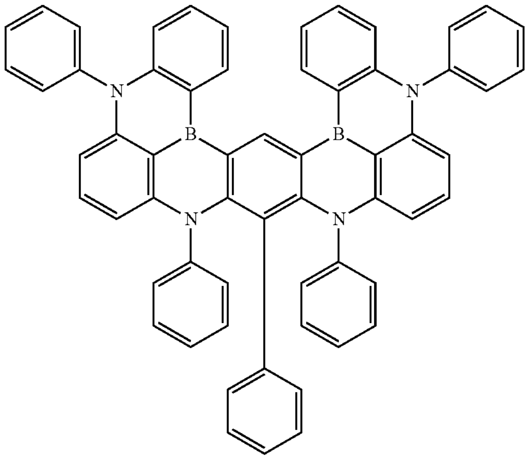

5-21

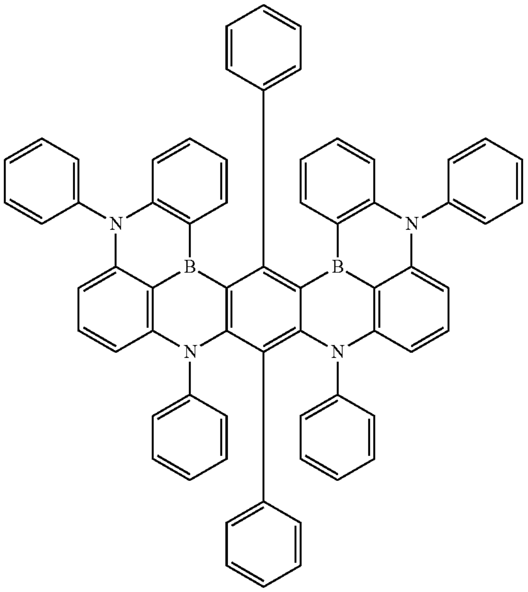

The organic light emitting material used as a light emitting dopant in the organic EL device of the present invention favorably has a ΔEST of 0.20 eV or less, preferably 0.15 eV or less, and more preferably 0.10 eV or less.

The ΔEST represents a difference between excited singlet energy (S1) and excited triplet energy (T1). Here, S1 and T1 are measured by the method described in the Examples.

By using a material selected from the polycyclic aromatic compound or the substructured polycyclic aromatic compound represented by the aforementioned general formula (3) (hereinafter referred to as a polycyclic aromatic compound material) as the light emitting dopant, and using a material selected from the compounds represented by the general formula (1) above as the first host and a material selected from the compounds represented by the general formula (2) above as the second host, an excellent organic EL device can be provided.

In another example of the invention, a compound with a ΔEST of 0.20 eV or less is used as the light emitting dopant. In this case, the compound as the light emitting dopant is not necessarily the polycyclic aromatic compound material described above and may be a compound with the ΔEST of 0.20 eV or less, preferably 0.15 eV or less, and more preferably 0.10 eV. Such a compound has been known as the Thermally Activated Delayed Fluorescence material (TADF) in many literatures such as Patent Literature 2 and can be selected therefrom.

Next, the structure of the organic EL device of the present invention will be described with reference to the drawings; however, the structure of the organic EL device of the present invention is not limited thereto.

FIG. 1 shows a cross-sectional view of a structure example of a typical organic EL device used in the present invention. Reference numeral 1 denotes a substrate, reference numeral 2 denotes an anode, reference numeral 3 denotes a hole injection layer, reference numeral 4 denotes a hole transport layer, reference numeral 5 denotes a light emitting layer, reference numeral 6 denotes an electron transport layer, and reference numeral 7 denotes a cathode. The organic EL device of the present invention may have an exciton blocking layer adjacent to the light emitting layer, or may have an electron blocking layer between the light emitting layer and the hole injection layer. The exciton blocking layer may be inserted on either the anode side or the cathode side of the light emitting layer or may be inserted on both sides at the same time. The organic EL device of the present invention has the anode, the light emitting layer, and the cathode as essential layers, but preferably has a hole injection/transport layer and an electron injection/transport layer in addition to the essential layers, and further preferably has a hole blocking layer between the light emitting layer and the electron injection/transport layer. The hole injection/transport layer means either or both of the hole injection layer and the hole transport layer, and the electron injection/transport layer means either or both of the electron injection layer and electron transport layer.

It is also possible to have a structure that is the reverse of the structure shown in FIG. 1, that is, the cathode 7, the electron transport layer 6, the light emitting layer 5, the hole transport layer 4, and the anode 2 can be laminated on the substrate 1, in the order presented. Also, in this case, layers can be added or omitted, as necessary.

—Substrate—

The organic EL device of the present invention is preferably supported on a substrate. The substrate is not particularly limited and may be a substrate conventionally used for organic EL devices, and for example, a substrate made of glass, transparent plastic, or quartz can be used.

—Anode—

As the anode material in the organic EL device, a material made of a metal, alloy, or conductive compound having a high work function (4 eV or more), or a mixture thereof is preferably used. Specific examples of such an electrode material include metals such as Au, and conductive transparent materials such as CuI, indium tin oxide (ITO), $SnO_2$, and ZnO. An amorphous material capable of producing a transparent conductive film such as IDIXO ($In_2O_3$—ZnO) may also be used. As the anode, these electrode materials may be formed into a thin film by a method such as vapor deposition or sputtering, and then a pattern of a desired form may be formed by photolithography. Alternatively, when a highly precise pattern is not required (about 100 μm or more), a pattern may be formed through a mask of a desired form at the time of vapor deposition or sputtering of the above electrode materials. Alternatively, when a coatable material such as an organic conductive compound is used, a wet film forming method such as a printing method and a coating method can also be used. When light is extracted from the anode, the transmittance is desirably more than 10%, and the sheet resistance as the anode is preferably several hundred Ω/square or less. The film thickness is selected within a range of usually 10 to 1,000 nm, and preferably 10 to 200 nm, although it depends on the material.

—Cathode—

On the other hand, a material made of a metal (referred to as an electron injection metal), alloy, or conductive compound having a low work function (4 eV or less) or a mixture thereof is used as the cathode material. Specific examples of such an electrode material include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare earth metal. Among them, in terms of electron injection properties and durability against oxidation and the like, a mixture of an electron injection metal with a second metal that has a higher work function value than the electron injection metal and is stable, for example, a magnesium/silver mixture, a magnesium/aluminum mixture, a magnesium/indium mixture, an aluminum/aluminum oxide ($Al_2O_3$) mixture, a lithium/aluminum mixture, or aluminum is suitable. The cathode can be produced by forming a thin film from these cathode materials by a method such as vapor deposition and sputtering. The sheet resistance as the cathode is preferably several hundred Ω/square or less, and the film thickness is selected within a range of usually 10 nm to 5 μm, and preferably 50 to 200 nm. To transmit the light emitted, either one of the anode and the cathode of the organic EL device is favorably transparent or translucent because light emission brightness is improved.

The above metal is formed to have a film thickness of 1 to 20 nm on the cathode, and then a conductive transparent material mentioned in the description of the anode is formed on the metal, so that a transparent or translucent cathode can be produced. By applying this process, a device in which both anode and cathode have transmittance can be produced.

—Light Emitting Layer—

The light emitting layer is a layer that emits light after holes and electrons respectively injected from the anode and the cathode are recombined to form excitons, and the light emitting layer includes the light emitting dopant and the hosts.

The light emitting dopant and the host can be used so that the amount of the light emitting dopant is, for example, 0.10 to 10% and the amount of the host is 99.9% to 90%. Preferably the amount of the light emitting dopant is 1.0 to 5.0% and the amount of the host is 99 to 95%. More preferably the amount of the light emitting dopant is 1.0 to 3.0% and the amount of the host is 99 to 97%.

In the present description, % denotes % by mass unless otherwise noted.

As the hosts in the light emitting layer, the aforementioned first host and the second host are used. For the first host and the second host, for example, the first host can be used in an amount of 10 to 90% and the second host can be used in an amount of 90 to 10%. Preferably, the amount of the first host is 30 to 70% and the amount of the second host is 70 to 30%. More preferably, the amount of the first host is 40 to 60% and the amount of the second host is 60 to 40%.

Furthermore, one or more known hosts as other hosts may be used in combination with those described above, and the amount thereof used may be 50% or less and preferably 25% or less based on the total amount of the host materials.

The other known host that can be used is a compound having the ability to transport hole, the ability to transport electron, and a high glass transition temperature, and preferably has a higher T1 than the T1 of the light emitting dopant.

The host is a compound having the ability to transport hole, the ability to transport electron, and a high glass transition temperature, and preferably has a higher T1 than the T1 of the light emitting dopant. Specifically, the host has a higher T1 than the T1 of the light emitting dopant preferably by 0.010 eV or more, more preferably by 0.030 eV or more, and still more preferably by 0.10 eV or more. A TADF-active compound may also be used as the host material, and a compound with a ΔEST of 0.20 eV or less is preferred.

The other hosts are known in a large number of patent literatures and the like, and hence may be selected from them. Specific examples of the host include, but are not particularly limited to, various metal complexes typified by metal complexes of indole derivatives, carbazole derivatives, triazole derivatives, oxazole derivatives, oxadiazole derivatives, imidazole derivatives, phenylenediamine derivatives, arylamine derivatives, styrylanthracene derivatives, fluorenone derivatives, stilbene derivatives, triphenylene derivatives, carborane derivatives, porphyrin derivatives, phthalocyanine derivatives, and 8-quinolinol derivatives, and metal phthalocyanine, and metal complexes of benzoxazole and benzothiazole derivatives; and polymer compounds such as poly(N-vinyl carbazole) derivatives, aniline-based copolymers, thiophene oligomers, polythiophene derivatives, polyphenylene derivatives, polyphenylene vinylene derivatives, and polyfluorene derivatives.

When a plurality of hosts is used, each host is deposited from different deposition sources, or a plurality of hosts is premixed before vapor deposition to form a premix, whereby a plurality of hosts can be simultaneously deposited from one deposition source.

As the method of premixing, a method by which hosts can be mixed as uniformly as possible is desirable, and examples thereof include, but are not limited to, milling, a method of heating and melting hosts under reduced pressure or under an inert gas atmosphere such as nitrogen, and sublimation.

As the light emitting dopant in the light emitting layer, the aforementioned polycyclic aromatic compound material or an organic light emitting material with a ΔEST of 0.20 eV or less can be used. The light emitting dopant is preferably the aforementioned polycyclic aromatic compound material with a ΔEST of 0.20 eV or less.

The light emitting layer can include two or more light emitting dopants. For example, the aforementioned polycyclic aromatic compound material and another compound as another light emitting dopant may be included. In this case, the other compound as another light emitting dopant preferably has a ΔEST of 0.20 eV or less, but not limited to such a compound.

When two or more light emitting dopants are included in the light emitting layer, the first dopant is a compound represented by the general formulae (2), (3) or (4), or a substructured polycyclic aromatic compound having the structure represented by the general formula (2) as a substructure, and the second dopant to be combined may be a known compound as the light emitting dopant. The content of the first dopant is preferably 0.050 to 50% relative to the host materials, and the content of the second dopant is preferably 0.050 to 50% relative to the host materials. The total content of the first dopant and the second dopant do not exceed 50% relative to the host materials.

Such other light emitting dopants are known in a large number of patent literatures and the like, and may be selected therefrom. Specific examples of the dopants include, but not limited to, fused ring derivatives such as phenanthrene, anthracene, pyrene, tetracene, pentacene, perylene, naphthopyren, dibenzopyren, rubrene, and chrysene, benzoxazole derivatives, benzothiazole derivatives, benzoimidazole derivatives, benzotriazole derivatives, oxazole derivatives, oxadiazole derivatives, thiazole derivatives, imidazole derivatives, thiadiazole derivatives, triazole derivatives, pyrazoline derivatives, stilbene derivatives, thiophene derivatives, tetraphenylbutadiene derivatives, cyclopentadiene derivatives, bisstyryl derivatives such as bisstyrylanthracene derivatives and distyrylbenzene derivatives, bisstyrylarylene derivatives, diazaindacene derivatives, furan derivatives, benzofuran derivatives, isobenzofuran derivatives, dibenzofuran derivatives, coumarin derivatives, dicyanomethylenopyran derivatives, dicyanomethylenethiopyran derivatives, polymethine derivatives, cyanine derivatives, oxobenzoanthracene derivatives, xanthene derivatives, rhodamine derivatives, fluorescein derivatives, pyrylium derivatives, carbostyryl derivatives, acridine derivatives, oxazine derivatives, phenylene oxide derivatives, quinacridone derivatives, quinazoline derivatives, pyrrolopyridine derivatives, fluoropyridine derivatives, 1,2,5-thiadiazolopyrene derivatives, pyrromethene derivatives, perinone derivatives, pyrrolopyrrole derivatives, squarylium derivatives, violanthrone derivatives, phenazine derivatives, acridone derivatives, deazaflavin derivatives, fluorene derivatives, benzofluorene derivatives, etc.

The light emitting dopant and the first or second host can be vapor deposited from different vapor deposition sources, or the light emitting dopant and the first or second host can be premixed before vapor deposition to form a premix, whereby they can be simultaneously deposited from one deposition source.

—Injection Layer—

The injection layer refers to a layer provided between the electrode and the organic layer to reduce the driving voltage and improve the light emission brightness, and includes the hole injection layer and the electron injection layer. The injection layer may be present between the anode and the light emitting layer or the hole transport layer, as well as between the cathode and the light emitting layer or the electron transport layer. The injection layer may be provided as necessary.

—Hole Blocking Layer—

The hole blocking layer has the function of the electron transport layer in a broad sense, is made of a hole blocking material having a very small ability to transport holes while having the function of transporting electrons, and can improve the recombination probability between the electrons and the holes in the light emitting layer by blocking the holes while transporting the electrons. For the hole blocking layer, a known hole blocking material can be used. To exhibit the characteristics of the light emitting dopant, the material used as the second host can also be used as the material for the hole blocking layer. A plurality of hole blocking materials may be used in combination.

—Electron Blocking Layer—

The electron blocking layer has the function of the hole transport layer in a broad sense, and can improve the recombination probability between the electrons and the holes in the light emitting layer by blocking the electrons while transporting the holes. As the material for the electron blocking layer, a known material for the electron blocking layer can be used. To exhibit the characteristics of the light emitting dopant, the material used as the first host can also be used as the material for the electron blocking layer. The film thickness of the electron blocking layer is preferably 3 to 100 nm, and more preferably 5 to 30 nm.

—Exciton Blocking Layer—

The exciton blocking layer is a layer to block the diffusion of the excitons generated by recombination of the holes and the electrons in the light emitting layer into a charge transport layer, and insertion of this layer makes it possible to efficiently keep the excitons in the light emitting layer, so that the emission efficiency of the device can be improved. The exciton blocking layer can be inserted between two light emitting layers adjacent to each other in the device in which two or more light emitting layers are adjacent to each other.

As the material for the exciton blocking layer, a known material for the exciton blocking layer can be used.

The layer adjacent to the light emitting layer includes the hole blocking layer, the electron blocking layer, and the exciton blocking layer, and when these layers are not provided, the adjacent layer is the hole transport layer, the electron transport layer, and the like.

—Hole Transport Layer—

The hole transport layer is made of a hole transport material having the function of transporting holes, and the hole transport layer may be provided as a single layer or a plurality of layers.

The hole transport material has any of hole injection properties, hole transport properties, or electron barrier properties, and may be either an organic material or an inorganic material. As the hole transport layer, any of conventionally known compounds may be selected and used. Examples of such a hole transport material include porphyrin derivatives, arylamine derivatives, triazole derivatives, oxadiazole derivatives, imidazole derivatives, polyarylalkane derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline-based copolymers, and conductive polymer oligomers, particularly, thiophene oligomers. Porphyrin derivatives, arylamine derivatives, and styrylamine derivatives are preferably used, and arylamine compounds are more preferably used.

—Electron Transport Layer—

The electron transport layer is made of a material having the function of transporting electrons, and the electron transport layer may be provided as a single layer or a plurality of layers.

The electron transport material (may also serve as the hole blocking material) has the function of transmitting electrons injected from the cathode to the light emitting layer. As the electron transport layer, any of conventionally known compounds may be selected and used, and examples thereof include polycyclic aromatic derivatives such as naphthalene, anthracene, and phenanthroline, tris(8-quinolinolato)aluminum (III) derivatives, phosphine oxide derivatives, nitro-substituted fluorene derivatives, diphenylquinone derivatives, thiopyran dioxide derivatives, carbodiimides, fluorenylidene methane derivatives, anthraquinodimethane and anthrone derivatives, bipyridine derivatives, quinoline derivatives, oxadiazole derivatives, benzimidazole derivatives, benzothiazole derivatives, and indolocarbazole derivatives. Further, polymer materials in which these materials are introduced in the polymer chain or these materials constitute the main chain of the polymer can also be used.

When the organic EL device of the present invention is produced, the film formation method of each layer is not particularly limited, and the layers may be produced by either a dry process or a wet process.

EXAMPLES

Hereinafter, the present invention will be described in further detail with reference to Examples, but the present invention is not limited to these Examples.

The compounds used in Examples and Comparative Examples are shown below.

[C 55]

HAT-CN

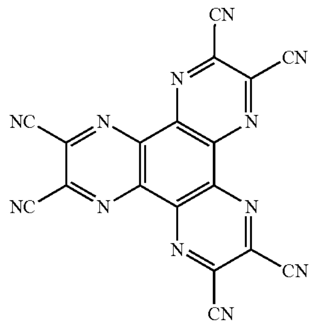

HT-1

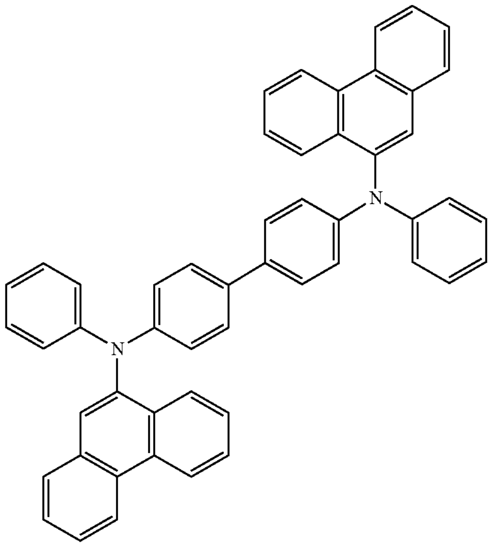

-continued

ET-1

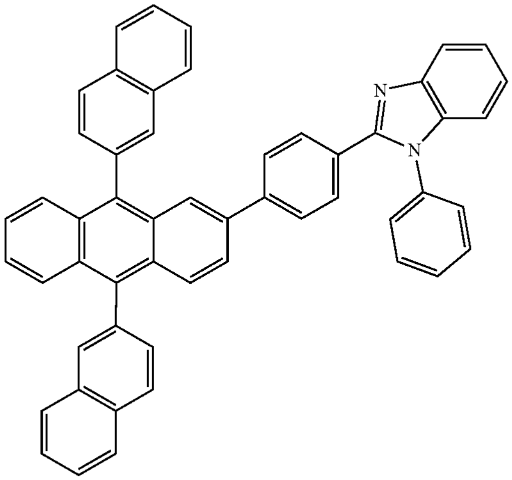

mCBP

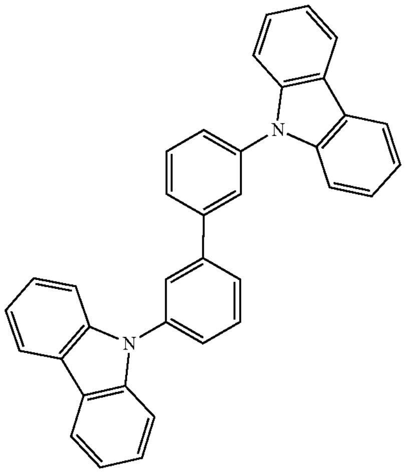

BH1

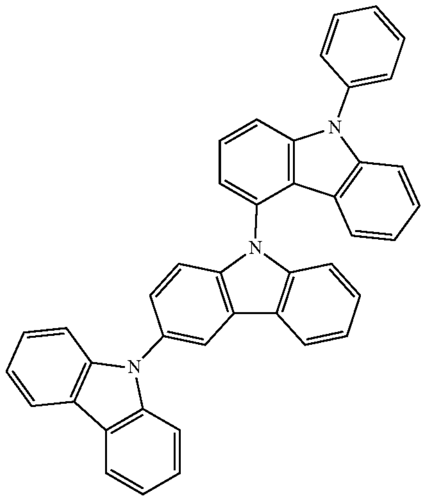

For the aforementioned compound (3-2) and the compound (5-2), S1 and T1 were measured. The results are shown in Table 1.

S1 and T1 were measured as follows:

BH1 as a host and compound (3-2) or (5-2) as the light emitting dopant were co-deposited on a quartz substrate from different vapor deposition sources by a vacuum deposition method under the condition of a degree of vacuum of $10^{-4}$ Pa or less to form a vapor deposited film with 100 nm thickness. At this time, they were co-deposited under deposition conditions such that the concentration of the compound (3-2) or (5-2) was 3%.

For S1, the emission spectrum of this deposition film was measured, a tangent was drawn to the rise of the emission spectrum on the short-wavelength side, and the wavelength value λedge [nm] of the point of intersection of the tangent and the horizontal axis was substituted into the following equation (i) to calculate S1.

$$S1\ [\mathrm{eV}]=1239.85/\lambda\mathrm{edge} \quad \text{(i)}$$

For T1, the phosphorescence spectrum of the above deposition film was measured, a tangent was drawn to the rise of the phosphorescence spectrum on the short-wavelength side, and the wavelength value λedge [nm] of the point of intersection of the tangent and the horizontal axis was substituted into the following equation (ii) to calculate T1.

$$T1\ [\mathrm{eV}]=1239.85/\lambda\mathrm{edge} \quad \text{(ii)}$$

The measurement results are shown in Table 1.

TABLE 1

| Compound | S1(eV) | T1(eV) | S1 - T1(eV) |
|---|---|---|---|
| 3-2 | 2.79 | 2.61 | 0.18 |
| 5-2 | 2.71 | 2.67 | 0.04 |

Example 1

Each thin film was laminated on the glass substrate on which an anode made of ITO having a film thickness of 70 nm was formed by a vacuum deposition method at a degree of vacuum of $4.0\times10^{-5}$ Pa. First, HAT-CN was formed on ITO to a thickness of 10 nm as a hole injection layer, and then HT-1 was formed to a thickness of 25 nm as a hole transport layer. Then, the compound (1-56) was formed to a thickness of 5 nm as an electron blocking layer. Then, the compound (1-56) as the first host, a compound (2-6) as the second host, and the compound (5-2) as the light emitting dopant were vapor co-deposited from different vapor deposition sources to form a light emitting layer to a thickness of 30 nm. At this time, they were vapor co-deposited under the vapor deposition conditions such that the concentration of the compound (5-2) was 2% and the mass ratio of the first host to the second host was 70:30. Then, compound (2-6) was formed to a thickness of 5 nm as a hole blocking layer. Then, ET-1 was formed to a thickness of 40 nm as an electron transport layer. Further, lithium fluoride (LiF) was formed on the electron transport layer to a thickness of 1 nm as an electron injection layer. Finally, aluminum (Al) was formed on the electron injection layer to a thickness of 70 nm as a cathode, whereby an organic EL device was produced.

Examples 2 to 11

Each organic EL device was produced in the same manner as in Example 1, except that the types of the light emitting dopant, the first host, and the second host, as well as the mass ratio of the first host to the second host were changed as shown in Table 2.

Comparative Example 1

Each thin film was laminated on the glass substrate on which an anode made of ITO having a film thickness of 70 nm was formed by a vacuum deposition method at a degree of vacuum of $4.0 \times 10^{-5}$ Pa. First, HAT-CN was formed on ITO to a thickness of 10 nm as a hole injection layer, and then HT-1 was formed to a thickness of 25 nm as a hole transport layer. Then, the compound (1-56) was formed to a thickness of 5 nm as an electron blocking layer. Then, the compound (1-56) as the first host and the compound (5-2) as the light emitting dopant were co-deposited from different deposition sources to form a light emitting layer having a thickness of 30 nm. At this time, they were co-deposited under deposition conditions such that the concentration of the compound (5-2) was 2%. Then, the compound (2-6) was formed to a thickness of 5 nm as a hole blocking layer. Then, ET-1 was formed to a thickness of 40 nm as an electron transport layer. Further, lithium fluoride (LiF) was formed on the electron transport layer to a thickness of 1 nm as an electron injection layer. Finally, aluminum (Al) was formed on the electron injection layer to a thickness of 70 nm as a cathode, whereby an organic EL device was produced.

Comparative Examples 2, 3, 5, 6, and 7

Each organic EL device was produced in the same manner as in Comparative Example 1, except that the light emitting dopant and the first host (no second host) were changed to the compounds shown in Table 2.

Comparative Examples 4 and 8

Each organic EL device was produced in the same manner as in Example 1, except that the light emitting dopant, the first host, and the second host were changed to the compounds shown in Table 2.

TABLE 2

| | Dopant | First host | Second host |
|---|---|---|---|
| Example 1 | 5-2 | 1-56(70%) | 2-6(30%) |
| Example 2 | 5-2 | 1-56(30%) | 2-6(70%) |
| Example 3 | 5-2 | 1-55(50%) | 2-6(50%) |
| Example 4 | 5-2 | 1-38(50%) | 2-6(50%) |
| Example 5 | 5-2 | 1-48(50%) | 2-6(50%) |
| Example 6 | 5-2 | 1-56(50%) | 2-3(50%) |
| Example 7 | 5-2 | 1-56(50%) | 2-15(50%) |
| Example 8 | 5-2 | 1-56(50%) | 2-38(50%) |
| Example 9 | 3-2 | 1-56(50%) | 2-6(50%) |
| Example 10 | 5-2 | 1-138(50%) | 2-6(50%) |
| Example 11 | 5-2 | 1-56(70%) | 2-87(30%) |
| Comparative Example 1 | 5-2 | 1-56 | — |
| Comparative Example 2 | 5-2 | 2-6 | — |
| Comparative Example 3 | 5-2 | mCBP | — |
| Comparative Example 4 | 5-2 | mCBP(50%) | 2-6(50%) |
| Comparative Example 5 | 3-2 | 1-48 | |
| Comparative Example 6 | 3-2 | 2-6 | |
| Comparative Example 7 | 3-2 | mCBP | |
| Comparative Example 8 | 3-2 | mCBP(50%) | 2-6(50%) |

Table 3 shows the voltage, the maximum emission wavelength of the light emission spectrum, the external quantum efficiency, and the lifetime of each organic EL device produced in the Examples and Comparative Examples. The voltage, the maximum emission wavelength, and the external quantum efficiency were values at a luminance of 500 cd/m$^2$ and were initial properties. The time taken for the luminance to reduce to 50% of the initial luminance when the initial luminance was 500 cd/m$^2$ was measured as the lifetime.

TABLE 3

| | Voltage (V) | Maximum emission wavelength (nm) | External quantum efficiency (%) | Lifetime (h) |
|---|---|---|---|---|
| Example 1 | 3.8 | 472 | 14.9 | 202 |
| Example 2 | 3.7 | 473 | 15.3 | 175 |
| Example 3 | 3.8 | 472 | 13.9 | 195 |
| Example 4 | 3.9 | 472 | 14.2 | 102 |
| Example 5 | 3.8 | 470 | 13.3 | 98 |
| Example 6 | 3.7 | 472 | 13.5 | 187 |
| Example 7 | 3.7 | 473 | 15.3 | 195 |
| Example 8 | 3.8 | 470 | 14.7 | 168 |
| Example 9 | 3.9 | 460 | 10.4 | 52 |
| Example 10 | 3.8 | 473 | 13.8 | 96 |
| Example 11 | 3.6 | 472 | 23.8 | 203 |
| Comparative Example 1 | 4.3 | 473 | 19.0 | 49 |
| Comparative Example 2 | 4.0 | 471 | 18.9 | 23 |
| Comparative Example 3 | 4.6 | 472 | 13.6 | 18 |
| Comparative Example 4 | 4.2 | 472 | 19.2 | 25 |
| Comparative Example 5 | 4.2 | 459 | 6.7 | 10 |
| Comparative Example 6 | 4.3 | 460 | 8.8 | 12 |
| Comparative Example 7 | 4.8 | 459 | 8.5 | 10 |
| Comparative Example 8 | 4.4 | 461 | 7.2 | 16 |

It is found from Table 3 that the organic EL devices in the Examples are characterized by the low voltage, high efficiency, and the long lifetime and exhibit blue luminescence in view of the maximum emission wavelength.

REFERENCE SIGNS LIST

1 substrate, 2 the anode, 3 hole injection layer, 4 hole transport layer, 5 light emitting layer, 6 electron transport layer, 7 cathode

The invention claimed is:

1. An organic electroluminescent device comprising one or more light emitting layers between an anode and a cathode opposite to each other, wherein at least one of the light emitting layers comprises a first host selected from compounds represented by the following general formula (1), a second host selected from compounds represented by the following general formula (2), and, as a light emitting dopant, a polycyclic aromatic compound represented by the following general formula (3) or a polycyclic aromatic compound having a structure represented by the general formula (3) as a substructure:

$$(Z)_a - L^1 - (Ar^1)_b \quad (1)$$

-continued (1a)

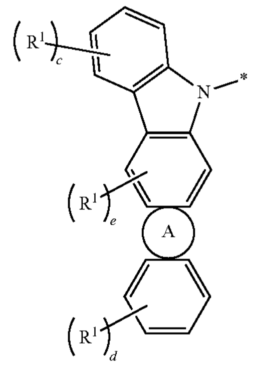

(1b)

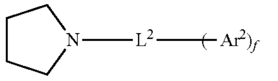

wherein Z is an indolocarbazole ring-containing group represented by the general formula (1a), * is a bonding site to $L^1$, the ring A is a heterocyclic ring represented by formula (1b), and the nitrogen-containing five-membered ring in formula (1b) is condensed with the two adjacent benzene rings in formula (1a), $L^1$ and $L^2$ are each independently a substituted or unsubstituted aromatic hydrocarbon group having 6 to 30 carbon atoms, or a substituted or unsubstituted aromatic heterocyclic group having 3 to 17 carbons, $Ar^1$ and $Ar^2$ are each independently a substituted or unsubstituted aromatic hydrocarbon group having 6 to 30 carbon atoms, a substituted or unsubstituted aromatic heterocyclic group having 3 to 17 carbon atoms, or a linked aromatic group formed by linking 2 to 8 of these groups, $R^1$ is each independently an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, a represents an integer of 1 to 3, b represents an integer of 0 to 3, and c and d each independently represent an integer of 0 to 4, e represents an integer of 0 to 2, and f represents an integer of 0 to 3, (2)

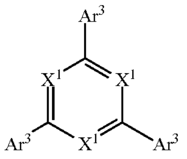

wherein $X^1$ each independently represents N or CH, and at least one $X^1$ represents N;

$Ar^3$ each independently represents a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 8 aromatic rings thereof, (3)

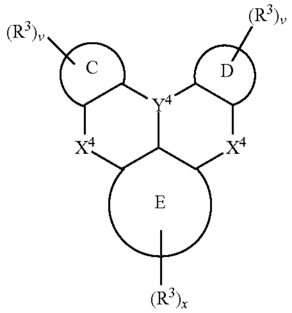

wherein the C ring, the D ring, and the E ring are each independently a substituted or unsubstituted aromatic hydrocarbon ring having 6 to 24 carbon atoms or a substituted or unsubstituted aromatic heterocyclic ring having 3 to 17 carbon atoms, $Y^4$ is B, P, P═O, P═S, Al, Ga, As, Si—$R^4$ or Ge—$R^5$, $R^4$ and $R^5$ are each independently an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, $X^4$ is each independently O, N—$Ar^4$, S or Se, $Ar^4$ is each independently a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 8 of these groups, N—$Ar^4$ is optionally bonded to any of the C ring, the D ring, or the E ring to form a heterocyclic ring containing N, $R^3$ each independently represents a cyano group, deuterium, a diarylamino group having 12 to 44 carbon atoms, an arylheteroarylamino group having 12 to 44 carbon atoms, a diheteroarylamino group having 12 to 44 carbon atoms, an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, at least one hydrogen atom in the C ring, the D ring, the E ring, $R^3$, $R^4$, $R^5$, and $Ar^4$ is optionally replaced with a halogen or deuterium atom, and v each independently represents an integer of 0 to 4, and x represents an integer of 0 to 3.

2. The organic electroluminescent device according to claim 1, wherein the polycyclic aromatic compound having the structure represented by the general formula (3) as a substructure is a polycyclic aromatic compound represented by the general formula (4) below:

(4)

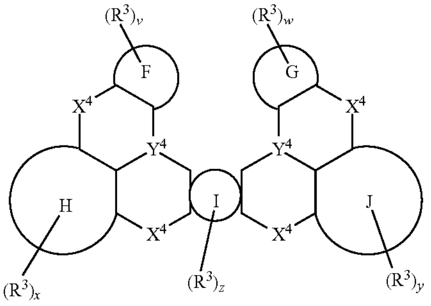

wherein the F ring, the G ring, the H ring, the I ring, and the J ring are each independently a substituted or unsubstituted aromatic hydrocarbon ring having 6 to 24 carbon atoms or a substituted or unsubstituted aromatic heterocyclic ring having 3 to 17 carbon atoms, and $X^4$, $Y^4$, $R^3$, x, and v are as defined in general formula (3), w represents an integer of 0 to 4, y represents an integer of 0 to 3, and z represents an integer of 0 to 2, and at least one hydrogen atom in the F ring, the G ring, the H ring, the I ring, and the J ring is optionally replaced with a halogen or deuterium atom.

3. The organic electroluminescent device according to claim 1, wherein the polycyclic aromatic compound having the structure represented by the general formula (3) as a substructure is a boron-containing polycyclic aromatic compound represented by the general formula (5) below:

(5)

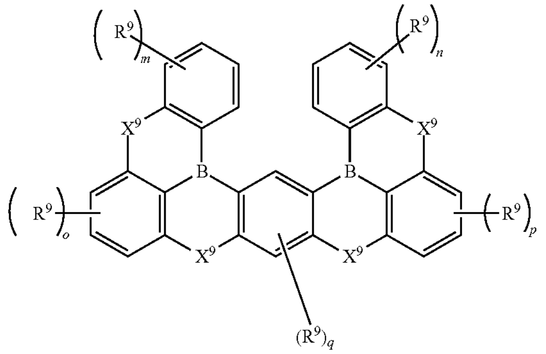

wherein $X^9$ each independently represents N—$Ar^6$, O, or S, and at least one $X^9$ represents N—$Ar^6$, $Ar^6$ each independently represents a substituted or unsubstituted aromatic hydrocarbon group having 6 to 18 carbon atoms, a substituted or unsubstituted aromatic heterocyclic ring group having 3 to 17 carbon atoms, or a linked aromatic group formed by linking 2 to 8 aromatic rings thereof, N—$Ar^6$ is optionally bonded with the aforementioned aromatic ring to form a heterocyclic ring containing N, $R^9$ each independently represents a cyano group, deuterium, a diarylamino group having 12 to 44 carbon atoms, an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, and m and n each independently represent an integer of 0 to 4, o and p each independently represent an integer of 0 to 3, and q represents an integer of 0 to 2.

4. The organic electroluminescent device according to claim 1, wherein the general formula (2) is formula (6) below:

(6)

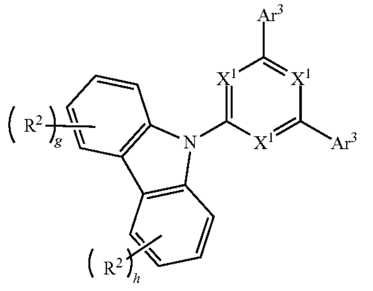

wherein $Ar^3$ and $X^1$ are as defined in the general formula (2), $R^2$ each independently represents deuterium, an aliphatic hydrocarbon group having 1 to 10 carbon atoms, a triarylsilyl group, a substituted or unsubstituted aromatic hydrocarbon group having 6 to 18 carbon atoms, or a substituted or unsubstituted aromatic heterocyclic group having 3 to 17 carbon atoms, and g and h each independently represent an integer of 0 to 4.

5. The organic electroluminescent device according to claim 1, wherein the general formula (2) is formula (7) below:

(7)

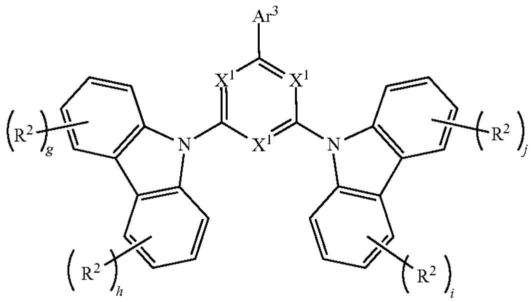

wherein $Ar^3$ and $X^1$ are as defined in the general formula (2) and $R^2$ is as defined in formula (6), g, h, i, and j each independently represent an integer of 0 to 4.

6. The organic electroluminescent device according to claim 1, wherein all three $X^1$ in the general formula (2) are N.

7. The organic electroluminescent device according to claim 1, wherein the general formula (1) is formula (8a) or formula (8b) below:

(8a)

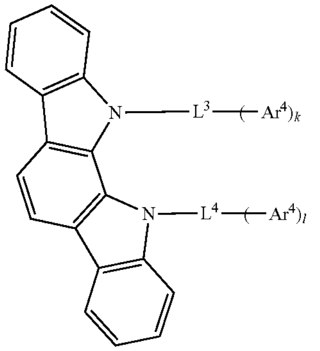

(8b)

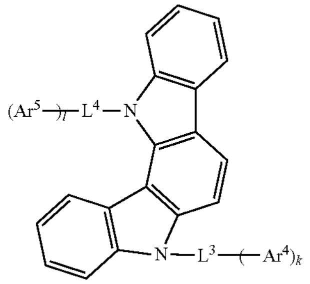

wherein $L^3$ and $L^4$ each independently represent a substituted or unsubstituted aromatic hydrocarbon group having 6 to 30 carbon atoms or a substituted or unsubstituted aromatic heterocyclic group having 6 to 17 carbon atoms, $Ar^4$ and $Ar^5$ each independently represent a substituted or unsubstituted aromatic hydrocarbon group having 6 to 30 carbon atoms, a substituted or unsubstituted aromatic heterocyclic ring group having 6 to 17 carbon atoms, or a linked aromatic group formed by linking 2 to 8 of these groups, and k and l each independently represent an integer of 0 to 3.

8. The organic electroluminescent device according to claim 1, wherein the light emitting dopant has a difference between excited singlet energy (S1) and excited triplet energy (T1) (Δ EST) of more than zero and 0.20 eV or less.

9. The organic electroluminescent device according to claim 8, wherein the Δ EST is more than zero and 0.10 eV or less.

10. The organic electroluminescent device according to claim 1, comprising 0.10 to 10% by mass of a light emitting dopant and 99.9 to 90% by mass of a host comprising 10 to 90% by mass of the first host and 90 to 10% by mass of the second host.

11. An organic electroluminescent device comprising one or more light emitting layers between an anode and a cathode opposite to each other, wherein at least one of the light emitting layers comprises a first host selected from compounds represented by the following general formula (1), a second host selected from compounds represented by the following general formula (2), and a light emitting dopant having a difference between excited singlet energy (S1) and excited triplet energy (T1) (ΔEST) of more than zero and 0.20 eV or less:

$$(Z)_a-L^1-(Ar^1)_b \qquad (1)$$

-continued (1a)

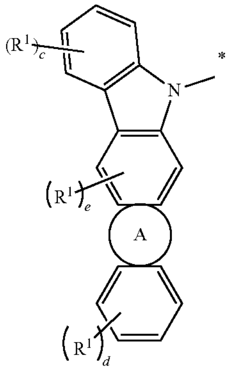

(1b)

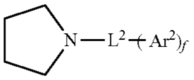

wherein Z is an indolocarbazole ring-containing group represented by the general formula (1a), * is a bonding site to with $L^1$, the ring A is a heterocyclic ring represented by formula (1b), and the nitrogen-containing five-membered ring in formula (1b) is condensed with the two adjacent benzene rings in formula (1a), $L^1$ and $L^2$ are each independently a substituted or unsubstituted aromatic hydrocarbon group having 6 to 30 carbon atoms, or a substituted or unsubstituted aromatic heterocyclic group having 3 to 17 carbons, $Ar^1$ and $Ar^2$ are each independently a substituted or unsubstituted aromatic hydrocarbon group having 6 to 30 carbon atoms, a substituted or unsubstituted aromatic heterocyclic groups having 3 to 17 carbon atoms, or a linked aromatic group formed by linking 2 to 8 of these groups, $R^1$ is each independently an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, a represents an integer of 1 to 3, b represents an integer of 0 to 3, and c and d each independently represent an integer of 0 to 4, e represents an integer of 0 to 2, and f represents an integer of 0 to 3, (2)

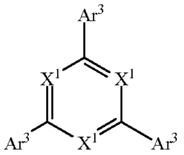

wherein $X^1$ each independently represents N or CH, and at least one $X^1$ represents N;

$Ar^3$ each independently represents a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 8 aromatic rings thereof.

* * * * *